United States Patent
Taniguchi et al.

(10) Patent No.: US 6,211,003 B1
(45) Date of Patent: Apr. 3, 2001

(54) SEMICONDUCTOR INTEGRATED CIRCUIT DEVICE AND PROCESS FOR MANUFACTURING THE SAME

(75) Inventors: Yasuhiro Taniguchi, Kodaira; Shoji Shukuri, Koganei; Kenichi Kuroda, Tachikawa; Shuji Ikeda, Koganei; Takashi Hashimoto, Iruma, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/270,685

(22) Filed: Mar. 16, 1999

(30) Foreign Application Priority Data

Mar. 16, 1998 (JP) .................................................. 10-065115

(51) Int. Cl.[7] .............................................. H01L 21/8238
(52) U.S. Cl. .......................... 438/228; 438/247; 438/252; 438/224
(58) Field of Search .................................. 438/527, 247, 438/252, 224, 228

(56) References Cited

U.S. PATENT DOCUMENTS

| 5,401,671 | * | 3/1995 | Komori et al. | 438/228 |
| 5,693,505 | * | 12/1997 | Kobayashi | 438/228 |
| 5,698,457 | | 12/1997 | Noguchi . | |
| 5,780,907 | | 7/1998 | Ema et al. . | |
| 5,950,079 | * | 9/1999 | Honeycutt et al. | 438/527 |

FOREIGN PATENT DOCUMENTS

| 8-204025 | 8/1996 | (JP) . |
| 8-236639 | 9/1996 | (JP) . |
| 9-293788 | 11/1997 | (JP) . |
| 9-312348 | 12/1997 | (JP) . |

* cited by examiner

*Primary Examiner*—Trung Dang
(74) *Attorney, Agent, or Firm*—Antonelli, Terry, Stout & Kraus, LLP

(57) ABSTRACT

A photoresist pattern through which a first well forming region and a second well forming region are exposed is formed over a semiconductor substrate, used as the mask to dope the semiconductor substrate with an impurity thereby to form buried n-wells, and further used as the mask to dope the same with an impurity thereby to form shallow p-wells in a self-alignment manner over the buried n-wells. Subsequently, the photoresist pattern is removed. After this, a photoresist pattern through which the outer peripheral region of the first well forming region and a third well forming region are exposed is formed over the major surface of the semiconductor substrate, and used as the mask to dope the semiconductor substrate with an impurity thereby to form shallow p-wells.

39 Claims, 55 Drawing Sheets

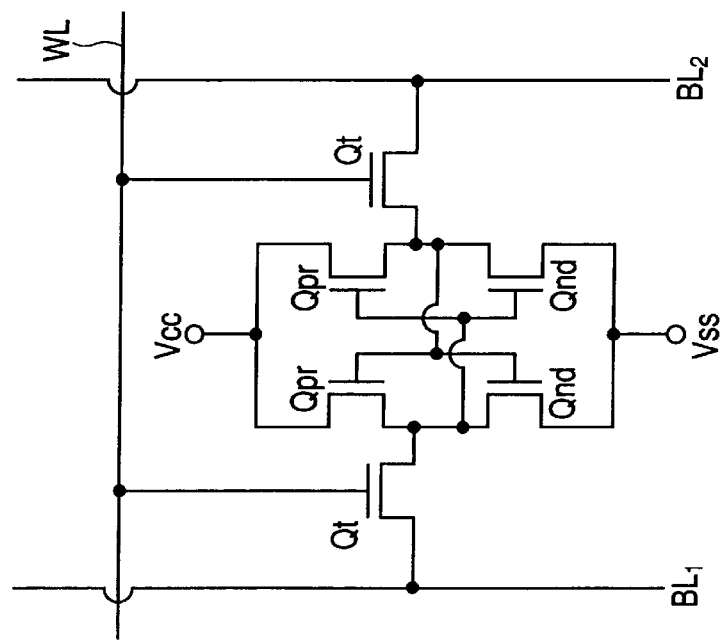

SEMICONDUCTOR INTEGRATED CIRCUIT DEVICE AND PROCESS FOR MANUFACTURING THE SAME

FIELD OF THE INVENTION

The present invention relates to a technique for manufacturing a semiconductor integrated circuit device and, more particularly, to a technique which is effective when applied to a well separation technique, by which in order to electrically separate a well (semiconductor region) formed in a semiconductor substrate and the semiconductor substrate, another well is so formed in the bottom and side portions of the former well as to encompass the same.

BACKGROUND OF THE INVENTION

This well separation technique enables a first well formed in a semiconductor substrate to be supplied with a desired voltage different from that applied to the semiconductor substrate, by electrically separating the first well from a second well formed therearound.

This technique is applied to a variety of semiconductor integrated circuit devices such as a DRAM (Dynamic Random Access Memory) in which a memory cell is formed in a first well, for example, to apply a back bias voltage to the MIS·FET (Metal Insulator Semiconductor Field Effect Transistor) of the memory cell, or a flash memory (EEPROM: Electrically Erasable Programmable ROM), in which a negative voltage is applied to the first well.

Here will be described a semiconductor integrated circuit device having a well separation structure examined by us.

At the well separation region in the semiconductor substrate of a second conductivity type, more specifically, there are formed a deep well of a first conductivity type and a shallow well of the second conductivity type which is formed in the region of the deep well. This deep well is formed by diffusing an impurity from the major surface to a deep position of the semiconductor substrate to encompass the outer periphery of the shallow well and to separate the shallow well and semiconductor substrate electrically. As a result, the shallow well can be fed with a voltage different from that to be applied to the semiconductor substrate.

In another region of the semiconductor substrate, there are formed an ordinary well of the first conductivity type and an ordinary well of the second conductivity type. These wells of the first conductivity type and the second conductivity type are formed by diffusing an impurity from the major surface to a predetermined position of the semiconductor substrate.

SUMMARY OF THE INVENTION

In the technique for forming the aforementioned well structure with two masks, the aforementioned well structure is realized with two masks: a common mask for an impurity introducing step to form the deep well of the first conductivity type and the ordinary well of the first conductivity type, and a common mask for an impurity introducing step to form the shallow well of the second conductivity type and the ordinary well of the second conductivity type.

In the technique thus far described for forming the two wells with one mask, however, the following problems have been found out by us.

Specifically, the first problem comes from the fact that the shallow well of the second conductivity type is formed by compensating the impurity of the second conductivity type and the impurity of the first conductivity type. That is, the effective impurity concentration of the second conductivity type increases to about two times as high as that of the second conductivity type in the ordinary well of the second conductivity type having no well separation, so that the transistor to be formed over the major surface of the semiconductor substrate has greatly different characteristics, especially the threshold voltage. A new mask is required to adjust the threshold voltage.

The second problem is that the total impurity concentration of the shallow well of the second conductivity type increases to about three times the impurity concentration of the ordinary well of the second conductivity type which is subjected to no well separation. As a result, the mobility of the carriers in the major surface region of the semiconductor substrate lowers to deteriorate the characteristics of the transistor to be formed over the major surface, especially to reduce the drain current.

The aforementioned two problems become serious as the factors obstructing the higher performance of the transistor as the well density has a tendency to rise more with the further miniaturization of the transistor.

An object of the invention is to provide a technique capable of optimizing the impurity concentrations of a well and an ordinary well in a well separation region without inviting any increase in the number of steps for manufacturing the semiconductor integrated circuit device.

Another object of the invention is to provide a technique capable of improving the characteristics of the elements to be formed in the well and the ordinary well in the well separation region without inviting any increase in the number of steps for manufacturing the semiconductor integrated circuit device.

The aforementioned and other objects and novel features of the invention will become apparent from the following description to be made with reference to the accompanying drawings.

Representatives of the aspects of the invention to be disclosed herein will be briefly summarized in the following.

According to the invention, there is provided a process for manufacturing a semiconductor integrated circuit device, comprising the steps of:

(a) forming, by patterning, over a major surface of a semiconductor substrate a first mask through which a first well forming region and a second well forming region formed at a distance from the first well forming region are exposed;

(b) doping the semiconductor substrate with an impurity by using the first mask as an impurity introduction mask so as to form a buried well region of a first conductivity type at a deep position of the semiconductor substrate in the first well forming region;

(c) doping the semiconductor substrate with an impurity by using the first mask as an impurity introduction mask so as to form a shallow well region of a second conductivity type over the buried well region of the first conductivity type in the first well forming region and the well forming region;

(d) forming, by patterning, over the major surface of the semiconductor substrate a second mask through which a third well forming region encompassing the buried well region of the first conductivity type of the first well forming region, and the shallow well region of the second conductivity type and a fourth well forming region formed at a distance from the first well forming region; and (e) doping the semiconductor substrate with an impurity by using the second mask as an impurity introduction mask so as to form a shallow well region of the first conductivity type encompassing the outer periphery of the shallow well region of the second conductivity type of the first well forming region and electrically connected with the buried well region of the first conductivity type of the first well forming region in the third well forming region and to form a shallow well region of the first conductivity type in the fourth well forming region, wherein in the first well forming region, the shallow well region of the second conductivity type in the first well forming region is encompassed by the shallow well region of the first conductivity type formed in the third well forming region and the buried well region of the first conductivity type in the first well forming region and is electrically separated from the semiconductor substrate, wherein in the second well forming region, the shallow well region of the second conductivity type is electrically connected with the semiconductor substrate.

In the invention, moreover, the impurity introduction of the step (e) is so performed that the impurity concentration of at least a portion of the shallow well region of the first conductivity type in the third well forming region is higher than that of the shallow well region of the second conductivity type in the first well forming region.

Moreover, the invention further comprises the steps of:

forming, by patterning, over a major surface of a semiconductor substrate a third mask through which a fifth well forming region formed at a distance from the first well forming region is exposed;

doping the semiconductor substrate with an impurity by using the third mask as an impurity introduction mask so as to form a shallow well region of the first conductivity type in the fifth well forming region;

forming, by patterning, over the major surface of the semiconductor substrate a fourth mask through which a sixth well forming region planarly encompassed by the fifth well forming region is exposed;

doping the semiconductor substrate with an impurity by using the fourth mask as an impurity introduction mask so as to form a shallow well region of the second conductivity type in the sixth well forming region;

forming, by patterning, over the major surface of the semiconductor substrate a fifth mask through which exposed are fifth well forming region, the sixth well forming region and a portion of the element separation region encompassing the fifth well forming region and which has its opening end provided over the element separation region; and doping the semiconductor substrate with an impurity by using the fifth mask as an impurity introduction mask so as to form a buried well region of the first conductivity type under the shallow well region of the first conductivity type of the fifth well forming region and the shallow well region of the second conductivity type of the sixth well forming region such that the buried well region is electrically connected with the shallow well regions of the first conductivity type of the fifth well forming region and the sixth well forming region and extends below a portion of the element separation region encompassing the fifth well forming region, wherein in the sixth well forming region, the shallow well region of the second conductivity type in the sixth well forming region is encompassed by the shallow well region of the first conductivity type of the fifth well forming region and the buried well regions of the first conductivity type of the fifth well forming region and the sixth well forming region and electrically separated from the semiconductor substrate.

Moreover, the invention further comprises the steps of:

in the first well forming region, forming over the major surface of the semiconductor substrate a sixth mask through which the shallow well region of the first conductivity type is exposed; and doping the first well forming region with an impurity by using the sixth mask as an impurity introduction mask so as to override the conductivity type of the shallow well region of the second conductivity type in the first well forming region and to form a shallow well region of the first conductivity type in the first well forming region, wherein a shallow well region of the first conductivity type and a shallow well region of the second conductivity type are formed in the first well forming region, and the shallow well region of the second conductivity type is encompassed by the well region of the first conductivity type, the shallow well region of the first conductivity type formed in the third well forming region, and the buried well region of the first conductivity type in the first well forming region and electrically separated from the semiconductor substrate.

According to the invention, moreover, there is provided a process for manufacturing a semiconductor integrated circuit device, comprising the steps of:

(a) forming, by patterning, over a major surface of a semiconductor substrate a first mask through which a first well forming region and a second well forming region formed at a distance from the first well forming region are exposed;

(b) doping the semiconductor substrate with an impurity by using the first mask as an impurity introduction mask so as to form a buried well region of a first conductivity type at a deep position of the semiconductor substrate in the first well forming region;

(c) doping the semiconductor substrate with an impurity by using the first mask as an impurity introduction mask so as to form a well region of a second conductivity type over the buried well region of the first conductivity type in the first well forming region and the second well forming region;

(d) forming, by patterning, over the major surface of the semiconductor substrate a second mask through which a third well forming region encompassing the buried well region of the first conductivity type of the first well forming region, the shallow well region of the second conductivity type, and a fourth well forming region formed at a distance from the first well forming region are exposed;

(e) doping the semiconductor substrate with an impurity by using the second mask as an impurity introduction mask so as to form a shallow well region of the first conductivity type encompassing the outer periphery of the shallow well region of the second conductivity type of the first well forming region and electrically connected with the buried well region of the first conductivity type of the first well forming region in the third well forming region and to form a shallow well region of the first conductivity type in the fourth well forming region, wherein when a MIS transistor of a high breakdown voltage is formed in the semiconductor substrate, the shallow well regions other than the shallow well region of high breakdown voltage where the MIS transistor of high breakdown voltage is formed is additionally doped with an impurity of the same conductivity type as that of the other shallow well regions, wherein in the first well forming region, the shallow well region of the second conductivity type in the first well forming region is encompassed by the shallow well region of the first conductivity type formed in the third well forming region and the buried well region of the first conductivity type in the first well forming region and electrically separated from the semiconductor substrate; and wherein in the second well forming region, the shallow well region of the second conductivity type is electrically connected with the semiconductor substrate.

According to the invention, moreover, there is provided a process for manufacturing a semiconductor integrated circuit device, comprising the steps of:

(a) forming, by patterning, over a major surface of a semiconductor substrate a first mask through which a first well forming region and a second well forming region formed at a distance from the first well forming region are exposed;

(b) doping the semiconductor substrate with an impurity by using the first mask as an impurity introduction mask so as to form a buried well region of a first conductivity type at a deep position of the semiconductor substrate in the first well forming region and the second well forming region;

(c) doping the semiconductor substrate with an impurity by using the first mask as an impurity introduction mask so as to form a well region of a second conductivity type over the buried well region of the first conductivity type in the first well forming region and the well forming region;

(d) forming, by patterning, over the major surface of the semiconductor substrate a second mask through which a third well forming region encompassing the buried well region of the first conductivity type of the first well forming region and the well region of the first well forming region is exposed; and (e) doping the semiconductor substrate with an impurity by using the second mask as an impurity introduction mask by using the second mask as an impurity introduction mask so as to form a well region of the first conductivity type encompassing the outer periphery of the well region of the second conductivity type of the first well forming region and electrically connected with the buried well region of the first conductivity type of the first well forming region in the third well forming region, wherein in the first well forming region, the well region of the second conductivity type in the first well forming region is encompassed by the well region of the first conductivity type formed in the third well forming region and the buried well region of the first conductivity type in the first well forming region and electrically separated from the semiconductor substrate, wherein in the second well forming region, the shallow well region of the second conductivity type is electrically connected with the semiconductor substrate.

Representative summaries of other means will be briefly described in the following.

Specifically, one means comprises:

a buried well region of a first conductivity type formed at a deep position distant from a major surface of a semiconductor substrate in a first well forming region of the semiconductor substrate and in a second well forming region which is formed at a position distance from the first well forming region;

a shallow well region of a second conductivity type formed in self-alignment with the buried well region of the first conductivity type over the buried well region of the first conductivity type in the first well forming region and the second well forming region in such a way that the impurity concentration is set independently of the buried well region of the first conductivity type;

a shallow well region of the first conductivity type encompassing the shallow well region of the second conductivity type of the first well forming region in a third well forming region around the first well forming region and electrically connected with the buried well region of the first conductivity type of the first well forming region; and a shallow well region of the first conductivity type formed in a fourth well forming region formed at a position distant from any of the first well forming region, the second well forming region, and the third well forming region, wherein the shallow well region of the second conductivity type of the first well forming region is encompassed by the buried well region of the first conductivity type of the first well forming region and the shallow well region of the first conductivity type of the third well forming region and electrically separated from the semiconductor substrate, and the shallow well region of the second conductivity type of the second well forming region is electrically connected with the semiconductor substrate.

Moreover, another means comprises a buried well region of a first conductivity type formed at a deep position distant from a major surface of a semiconductor substrate in a first well forming region of the semiconductor substrate and in a second well forming region which is formed at a position distance from the first well forming region;

a shallow well region of a second conductivity type formed in self-alignment with the buried well region of the first conductivity type over the buried well region of the first conductivity type in the first well forming region and the second well forming region in such a way that the impurity concentration is set independently of the buried well region of the first conductivity type; and a shallow well region of the first conductivity type encompassing the shallow well region of the second conductivity type of the first well forming region in a third well forming region formed around the first well forming region and electrically connected with the buried well region of the first conductivity type of the first well forming region, wherein the shallow well region of the second conductivity type of the first well forming region is encompassed by the buried well region of the first conductivity type of the first well forming region and the shallow well region of the first conductivity type of the third well forming region and electrically separated from the semiconductor substrate, and the shallow well region of the second conductivity type of the second well forming region is electrically connected with the semiconductor substrate.

In still another means, moreover, the impurity introduction is performed such that the impurity concentration of at least a portion of the shallow well region of the first conductivity type in the third well forming region is higher than that of the shallow well region of the second conductivity type.

In the first well forming region and the second well forming region, moreover, the shallow well regions of the second conductivity type have identical impurity distributions, and the buried well regions of the first conductivity type have identical impurity distributions.

BRIEF DESCRIPTION OF THE DRAWINGS

FIG. 46 is a top plan view of an element layout in a cache memory of a semiconductor integrated circuit device of Embodiment 5;

FIG. 47 is a circuit diagram of a memory cell in a cache memory of the Embodiment 5;

DESCRIPTION OF THE PREFERRED EMBODIMENTS

The invention will be described in detail in connection with its embodiments with reference to the accompanying drawings (Throughout all the drawings illustrating the embodiments, portions having the same functions will be designated by the same reference symbols, and their repeated description will be omitted).

EMBODIMENT 1

Figure 1:
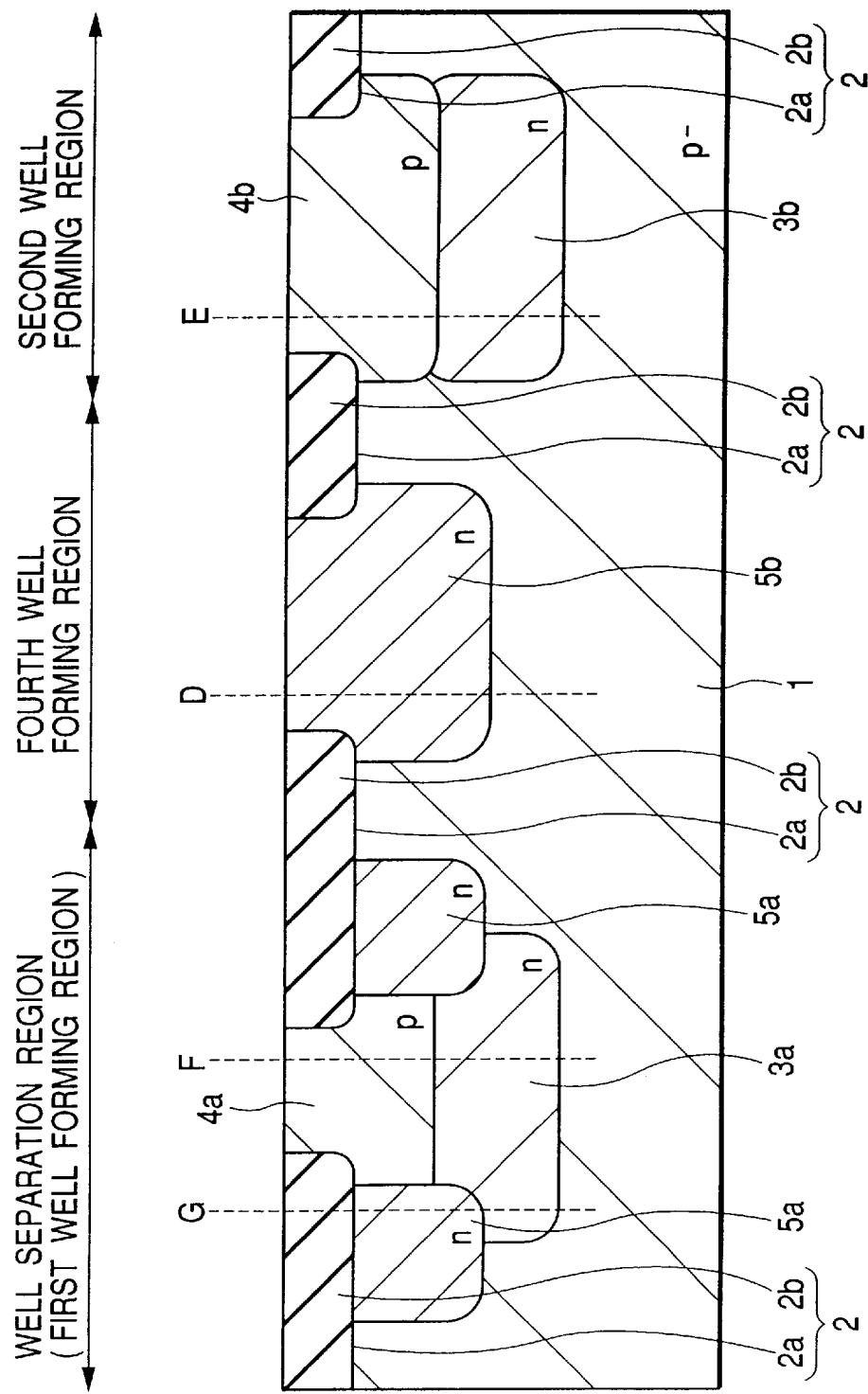
FIG. 1 is a section of essential portions of a semiconductor integrated circuit device, illustrating the technical concept of the invention.
Figure 2A:
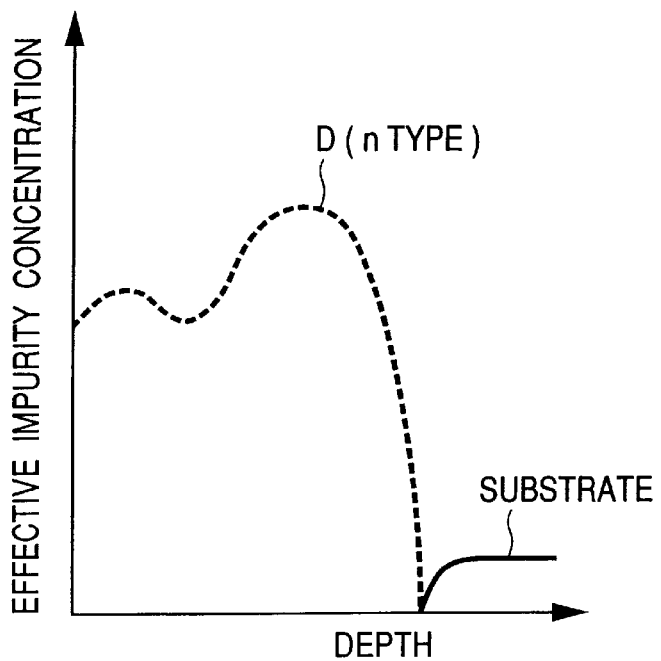
FIG. 2(a) and FIG. 2(b) are explanatory diagrams of the impurity concentration distributions of the individual portions of FIG. 1.
Figure 2B:
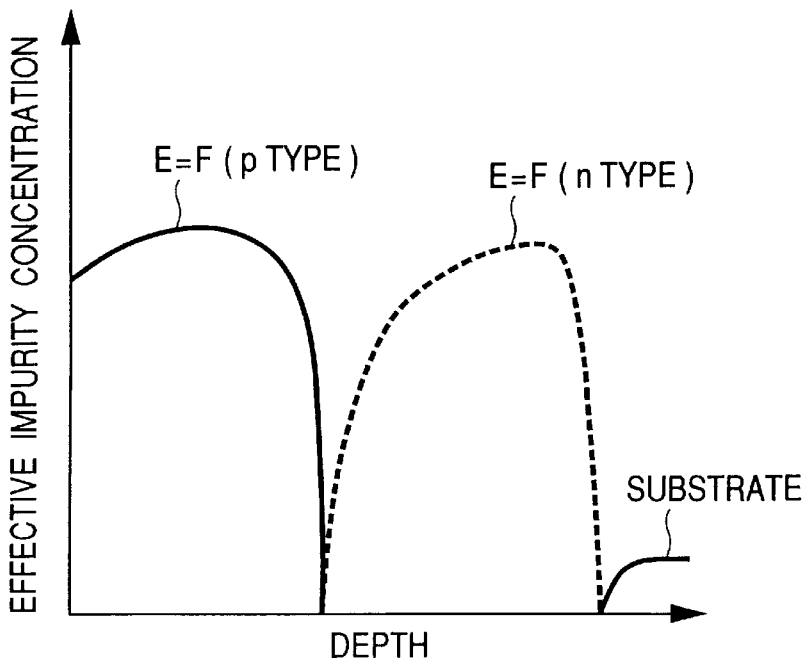
Figure 3:
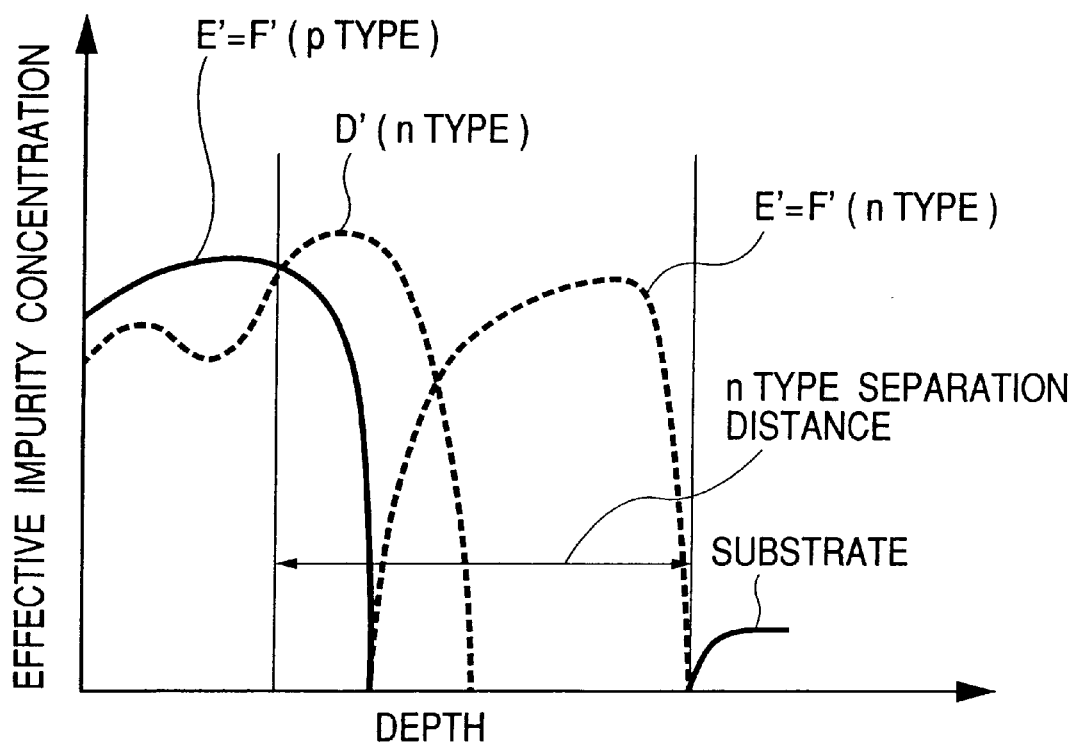
FIG. 3 is an explanatory diagram of the impurity concentration distributions of the individual portions of FIG. 1.
Figure 4:
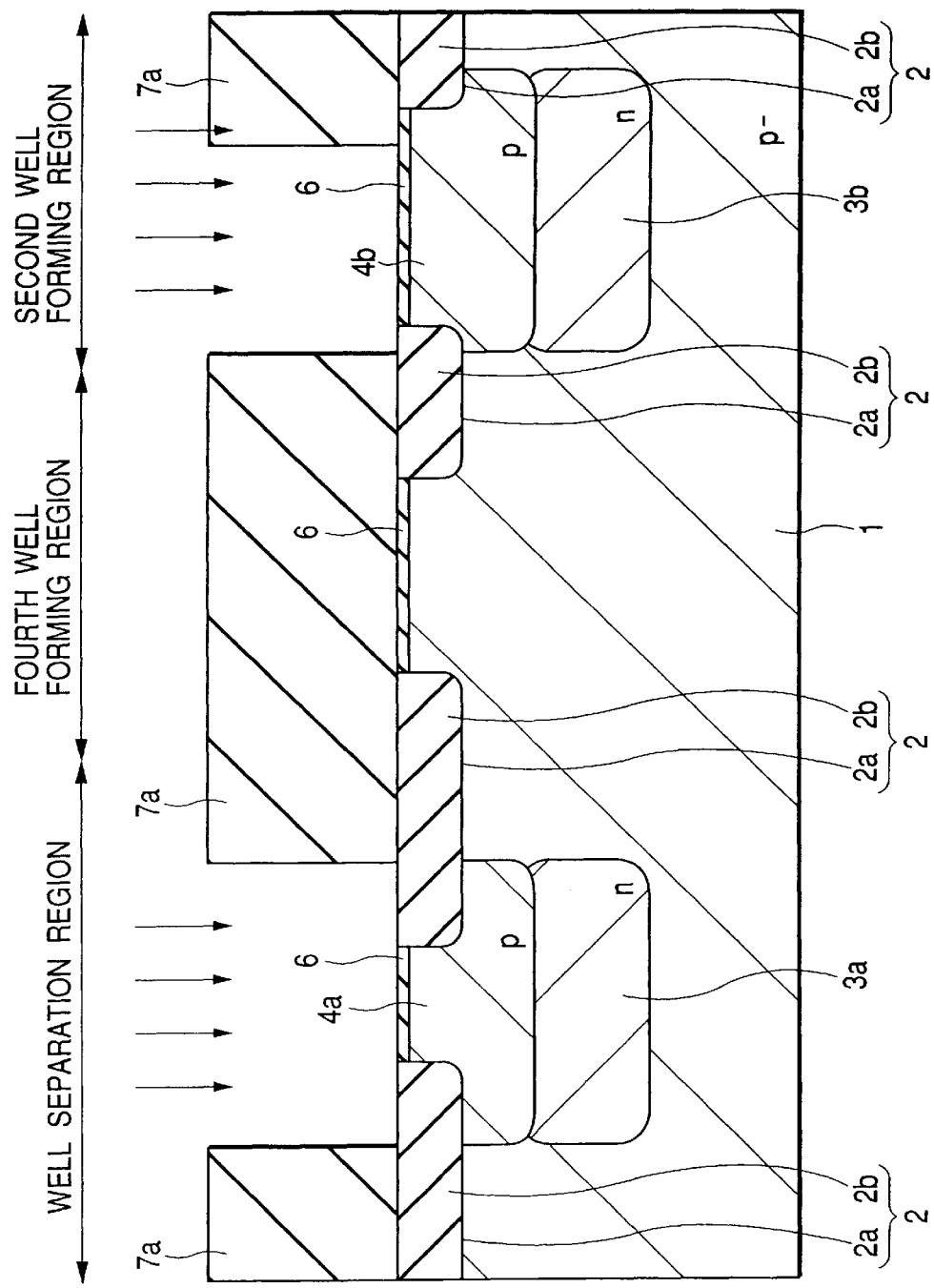
FIG. 4 is a section of essential portions in a process for manufacturing the semiconductor integrated circuit device of FIG. 1.
Figure 5:
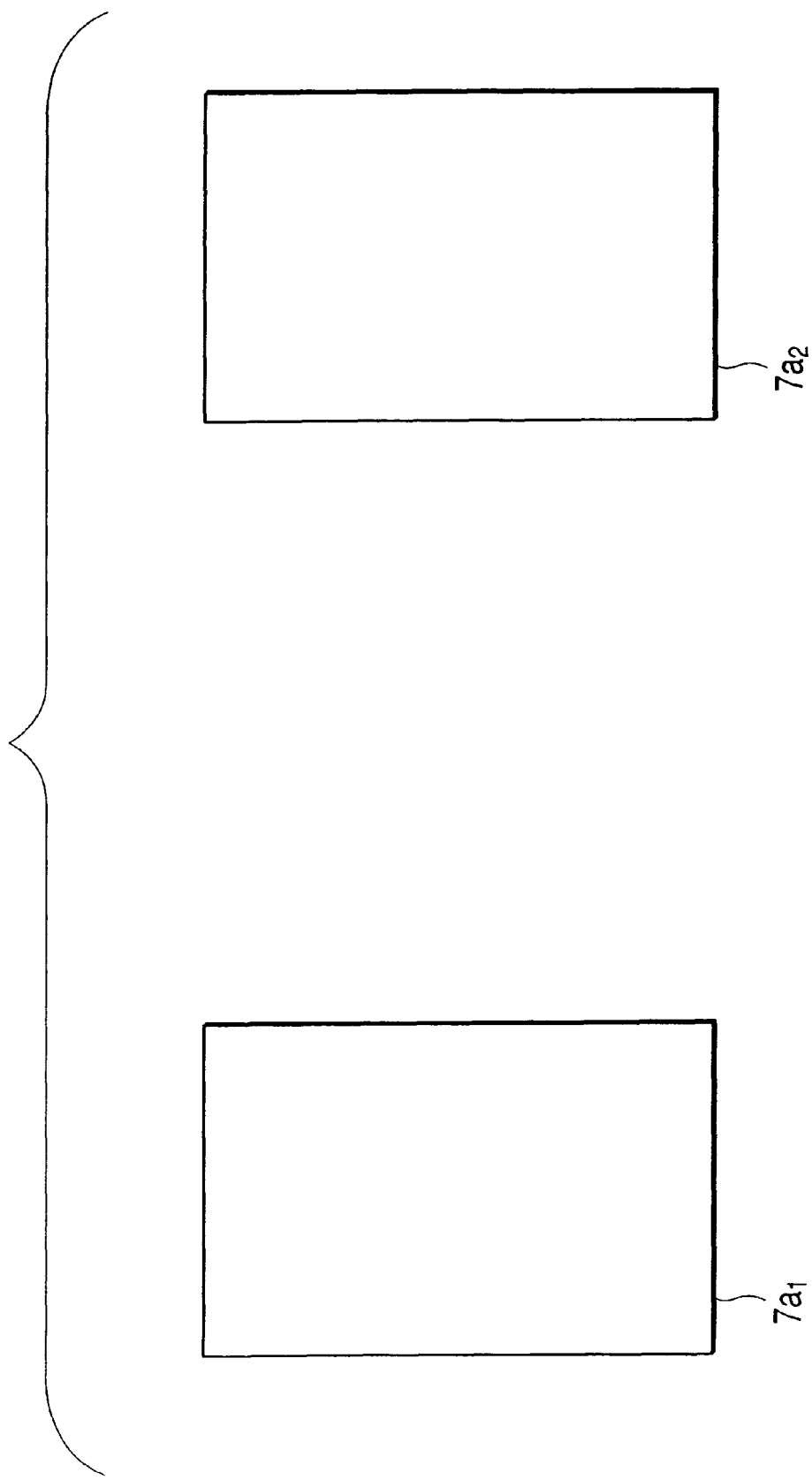
FIG. 5 is a layout top plan view of a mask used in the semiconductor integrated circuit device manufacturing process of FIG. 1.
Figure 6:
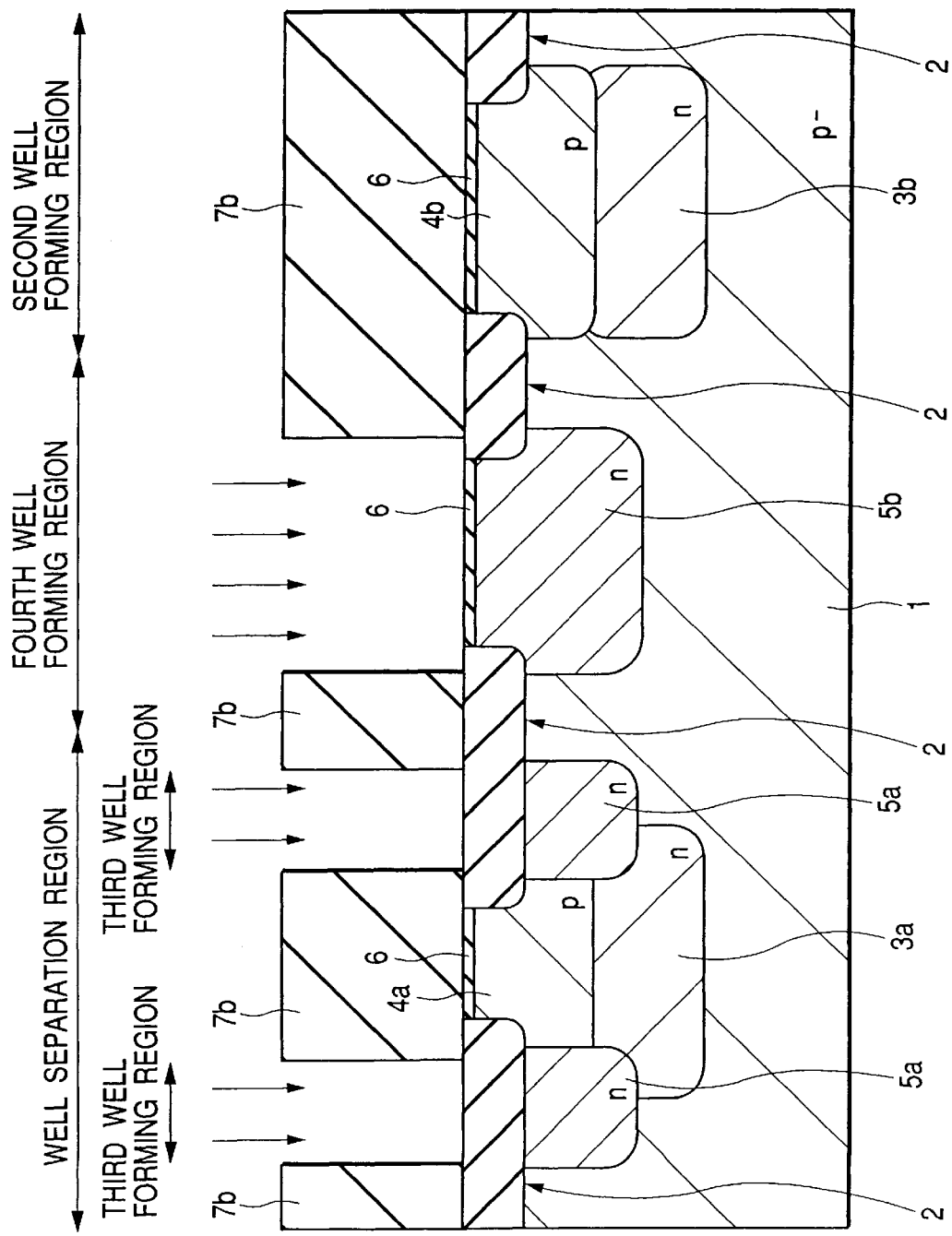
FIG. 6 is a section of essential portions in a process for manufacturing the semiconductor integrated circuit device of FIG. 1.
Figure 7:
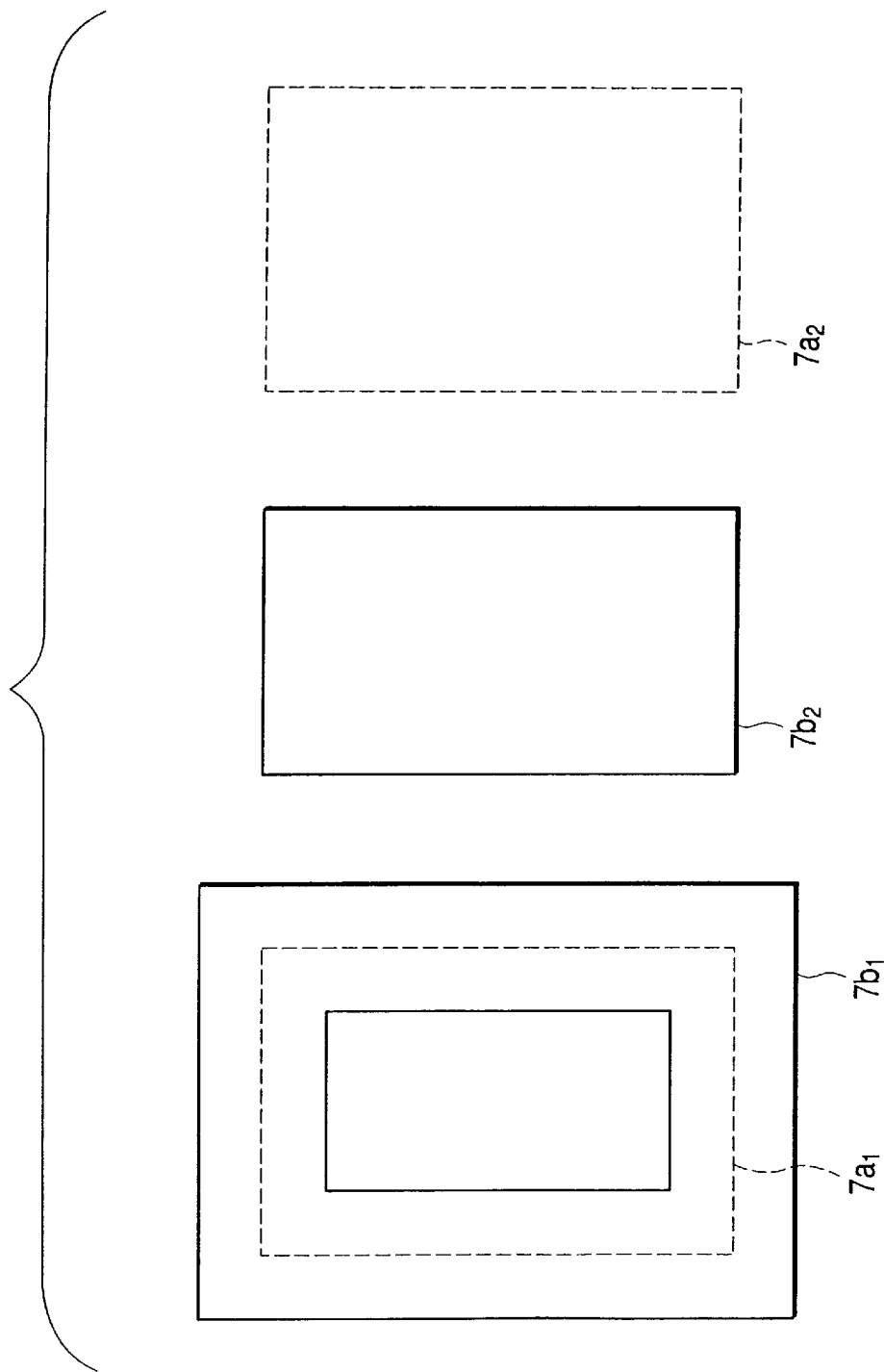
FIG. 7 is a layout top plan view of a mask used in the semiconductor integrated circuit device manufacturing process of FIG. 1.
Figure 54:
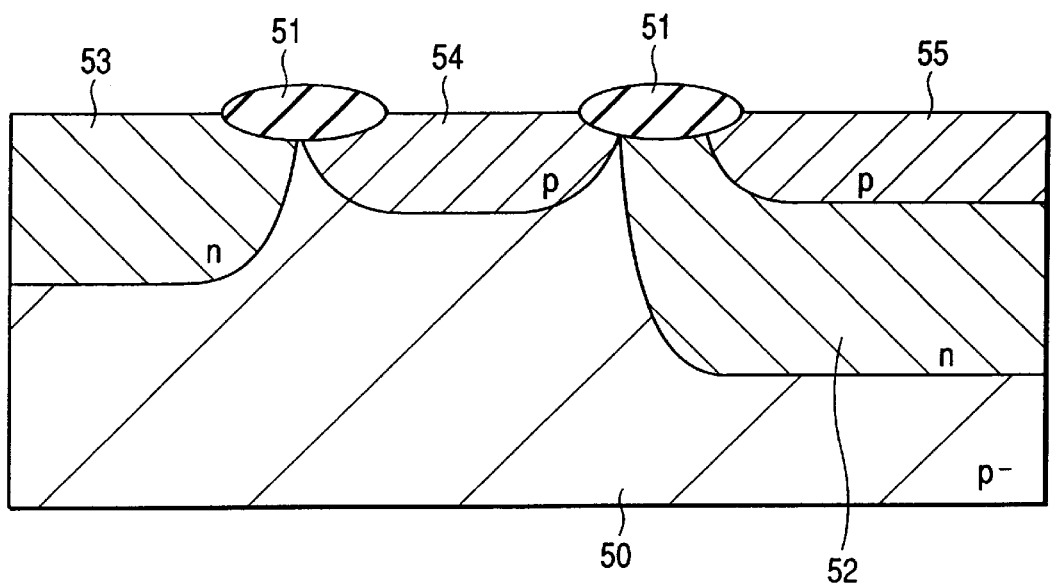
FIG. 54 is a partially sectional view of a semiconductor integrated circuit device having a well separating structure examined by us.
Figure 55:
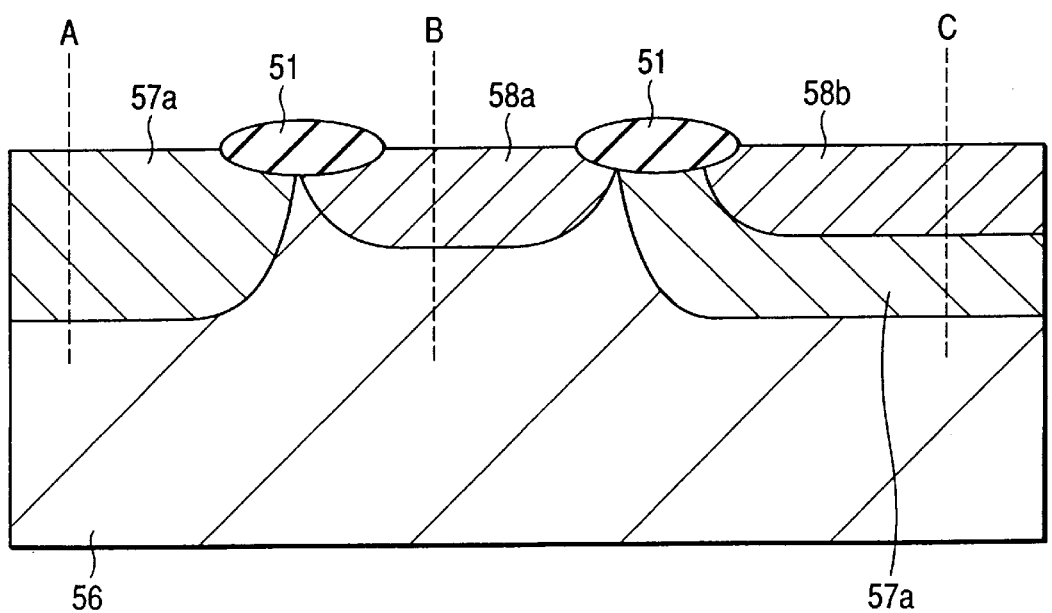
FIG. 55 is a partially sectional view of the semiconductor integrated circuit device having the well separating structure examined by us.

FIG. 1 is a section of an essential portion of a semiconductor integrated circuit device illustrating the technical concept of the invention; FIG. 2(a), FIG. 2(b) and FIG. 3 are explanatory diagrams of impurity concentration distributions of the individual portions of FIG. 1; FIGS. 4 and 6 are sections of essential portions in a process for manufacturing the semiconductor integrated circuit device of FIG. 1; FIGS. 5 and 7 are top plan views of the layouts of masks to be used in the process for manufacturing the semiconductor integrated circuit device of FIG. 1; FIGS. 8 to 14 are sections of essential portions in the process. for manufacturing a semiconductor integrated circuit device of one embodiment of the invention; FIG. 15 is a circuit diagram of a memory cell in the semiconductor integrated circuit device of FIG. 14; FIGS. 54 and 55 are sections of portions of a semiconductor integrated circuit device having a well separating structure examined by us; and FIG. 56 is an explanatory diagram illustrating the impurity concentration distributions of the individual portions of FIG. 55.

First, here will be described the well separating technique examined by us, prior to the description of Embodiment 1.

FIG. 54 shows a well separating structure having dual wells examined by us. A semiconductor substrate 50 is made of a p-type single crystal, and a field insulating film 51 is formed in an element separation region of the major surface of the semiconductor substrate 50.

A deep n-well 52 is so formed that an n-type impurity distribution extends from the major surface of the semiconductor substrate 50 to a deep position. A shallow n-well 53 is so formed that an n-type impurity distribution extends from the major surface of the semiconductor substrate 50 to a position shallower than that of the deep n-well 52.

An ordinary p-well 54 is formed in the region encompassed by the field insulating film 51 and a p-type impurity distribution extends from the major surface of the semiconductor substrate 50. Moreover, a p-well 55 is formed such that its circumference (its bottom portion and side portion) is encompassed by the deep n-well 52.

Here in the ordinary operation, the semiconductor substrate 50 is at the earth potential so that no potential other than 0 V can be applied to the ordinary p-well 54, but the p-well 55 is encompassed by the deep n-well 52 and electrically separated from the semiconductor substrate 50, so that it can be fed with a desired voltage such as a negative voltage different from that applied to the semiconductor substrate 50.

Here will be described problems of a technique for forming the aforementioned well structure by using two masks. FIG. 55 shows a sectional structure of the well, in which there are formed in a p-type semiconductor substrate 56 n-wells 57a and 57b and p-wells 58a and 58b shallower than the n-wells 57a and 57b.

The circumstance (the bottom and side portions) of the shallow p-well 58b is encompassed by the n-well 57a, so that it is electrically separated from the semiconductor substrate 56. As a result, the p-well 58b can be fed with a desired voltage such as a negative voltage different from that applied to the semiconductor substrate 56.

In this technique, the aforementioned well structure is realized with two masks by using the same mask for an impurity introducing step to form the n-wells 57a and 57b and the same mask for an impurity introducing step to form the p-wells 58a and 58b.

Figure 56A:
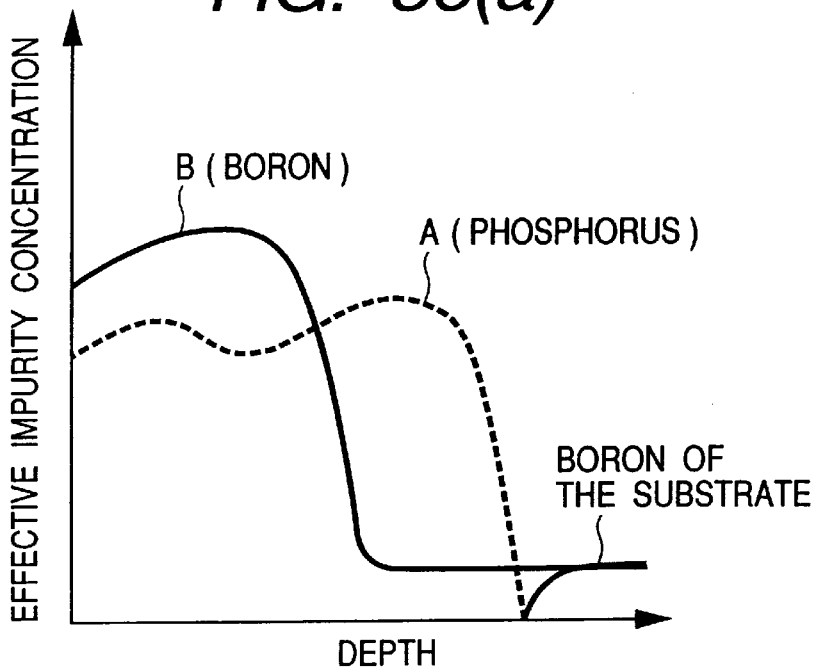
FIGS. 56(a)–56(b) are explanatory diagrams illustrating the impurity concentration distributions of individual portions of FIG. 55.
Figure 56B:
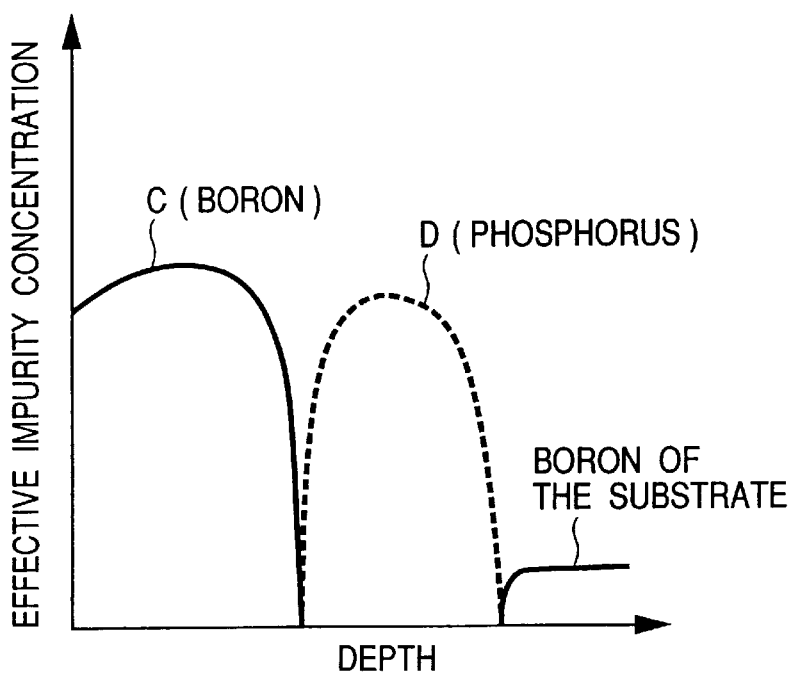

Here, the impurity concentration distributions in the depth direction at positions A, B and C in FIG. 55 are illustrated in FIG. 56(a) and FIG. 56(b). The concentration distribution of phosphorus (P) at the position A in the n-well 57a has to be low in the vicinity of the surface and high in a portion deep from the surface, as illustrated in FIG. 56(a), compared with the concentration distribution of boron (B) at the position B in the p-well 58a.

This is because the p-wells 58a and 58b are formed with the common mask at the impurity introduction steps so that the impurity distributions have to be optimized at both the positions B and C. In the region of the p-well at the position C, more specifically, the effective p-well 58b having a difference of the boron concentration from the phosphorus concentration has to be formed in the vicinity of the surface, as illustrated in FIG. 56(b), and it has to be also considered that the effective n-well 57b is formed in a portion deep from the surface.

However, we have found out that this technique involves the following problems. A first problem is that the p-well 58b is formed by the compensation between boron and phosphorus, and hence the effective p-type impurity concentration is usually reduced to one half of the bottom concentration of the p-well 58a. As a result, the characteristics, especially, the threshold voltage of the transistor to be formed in the major surface of the semiconductor substrate become greatly different. Another mask is required to adjust the threshold voltage.

The second problem is that the total impurity concentration of the p-well 58b rises to about three times as high as that of the ordinary p-well 58a. As a result, the mobility of the carries in the major surface region of the semiconductor substrate becomes low, so that the characteristics, especially, the drain current of the transistor to be formed over the major surface become accordingly low.

The two problems thus far described become more and more serious as the factors deteriorating the high performance of a transistor as the transistor becomes smaller and as the well concentration becomes higher.

Therefore, the invention proposes a well structure capable of setting the impurity concentrations of the individual wells without increasing the number of masks. FIG. 1 is a section of essential portions of a semiconductor substrate 1 showing the technical concept of the invention.

The semiconductor substrate 1 is made of a single crystal of p-type silicon (Si) containing boron, for example, and a trench type element separation region 2 is formed in the major surface of the semiconductor substrate 1. The separation region 2 is formed by burying a separation film 2b in trenches 2a made in the major surface of the semiconductor substrate 1. This separation film 2b is a silicon oxide film, for example, and the top face is so planarized as to be substantially flush with the major surface of the semiconductor substrate 1.

In the regions interposed between these adjoining separation regions 2, there are formed a well separation region (a first well forming region), a second well forming region and a fourth well forming region.

In the well separation region, there are provided a buried n-well (a buried well region of a first conductivity type) 3a, a shallow p-well (a shallow well region of a second conductivity type) 4a formed in a self-alignment manner over the n-well 3a, and a shallow n-well (a shallow well region of the first conductivity type) 5a so formed as to encompass the peripheral portion of the shallow p-well 4a.

These buried n-well 3a and shallow p-well 4a are formed by doping the semiconductor substrate 1 with individual impurities by ion implantation using a common mask as an ion implantation mask. As a result, the buried n-well 3a and the shallow p-well 4a are formed at the same planar positions and in the same planar region.

Here, the buried n-well 3a contains phosphorus, for example, although not especially limited thereto. Moreover, the shallow p-well 4a contains boron, for example.

The shallow n-well 5a is so formed as to cross the boundary region between the side portion of the shallow p-well 4a and the semiconductor substrate 1 and to extend from the bottom portion of the separation region 2 and to overlap with the buried n-well 3a. As a result, the shallow p-well 4a is so completely encompassed along its outer periphery by the shallow n-well 5a and the buried n-well 3a, so that it is electrically separated from the semiconductor substrate 1. This shallow n-well 5a contains phosphorus, for example.

In the second well forming region, there are provided a buried n-well (a buried well region of the first conductivity type) 3b formed at a position deep from the major surface of the semiconductor substrate 1, and a shallow p-well (a shallow well region of the second conductivity type) 4b formed in a self-alignment manner over the buried n-well 3b.

These buried n-well 3b and shallow p-well 4b are formed by doping the semiconductor substrate 1 with individual impurities by ion implantation using a common mask as the ion implantation mask. As a result, the buried n-well 3b and the shallow p-well 4b are formed at the same planar positions and in the same planar region.

The impurity of the buried n-well 3b and the impurity of the buried n-well 3a of the aforementioned well separation region are simultaneously introduced into the semiconductor substrate 1 by ion implantation using the same mask as the ion implantation mask. As a result, the impurity of the buried n-well 3b and the impurity distribution (e.g., the depth and region) in the depth direction are identical to the impurity of the buried n-well 3b and the impurity distribution (e.g., the depth and region) in the depth direction.

The impurity of the shallow p-well 4b and the impurity of the shallow p-well 4a of the aforementioned well separation region are simultaneously introduced into the semiconductor substrate 1 by ion implantation using the same mask as the ion implantation mask. As a result, the impurity of the shallow p-well 4b and the impurity distribution (e.g., the depth and region) in the depth direction are identical to the impurity of the shallow p-well 4a and the impurity distribution (e.g., the depth and region) in the depth direction.

In the fourth well forming region, there is formed a shallow n-well (a shallow well region of the first conductivity type) 5b. The impurity of this shallow n-well 5b and the impurity of the shallow n-well 5a of the aforementioned well separation region are simultaneously introduced into the semiconductor substrate 1 by ion implantation using the same mask as the ion implantation mask. As a result, the impurity of the shallow n-well 5b and the impurity distribution (e.g., the depth and region) in the depth direction are identical to the impurity of the shallow n-well 5a and the impurity distribution (e.g., the depth and region) in the depth direction.

The impurity concentration distributions, at positions D, E, F and G of FIG. 1 are illustrated in FIG. 2(a) and FIG. 2(b).

The impurity concentration distribution of the shallow n-well 5b in the fourth well forming region (at the position D) is so extended from the major surface of the semiconductor substrate 1 to a predetermined depth as to optimize the performance of a p-transistor to be formed over the major surface.

The impurity concentration distribution of the second well forming region (at the position E) has the distribution of the shallow p-well 4b in the vicinity of the major surface and the distribution of the buried n-well 3b in the semiconductor substrate apart from the major surface. The distribution in the vicinity of the major surface of the semiconductor substrate is set to a concentration to optimize the performance of an n-transistor to be formed over the major surface. The distribution in the semiconductor substrate is set optimal to electrically separate the semiconductor substrate and the shallow p-well in the vicinity of the major surface.

The impurity concentration distribution in the well separation region (at the position F) is absolutely identical to the aforementioned one of the second well forming region (at the position E), so that its description will be omitted. In the outer peripheral portion of the shallow p-well in the well separation region, however, there is formed the shallow n-well 5a, as shown in FIG. 1, so that the impurity concentration distribution in the region (at the position G) is different from that of the second well forming region. The impurity concentration distribution at the position G of FIG. 1 is illustrated in FIG. 3.

In this region, the shallow p-well 4a and the n-well 5a are so formed as to overlap each other, but the impurity concentration distribution of the n-well 5a is set deeper than that of the p-well region 4a (as shown in FIGS. 1 and 3), so that the shallow p-well 4a and the semiconductor substrate 1 can be sufficiently electrically separated from each other, as illustrated in the n-type separation distance of FIG. 3.

Throughout the embodiment, the structure is such that a predetermined voltage can be applied to each well or a predetermined well, for example, through the wiring formed over the major surface of the semiconductor substrate.

Next, a process for manufacturing the semiconductor integrated circuit device of FIG. 1 will be described with reference to FIGS. 4 to 7.

FIG. 4 is a section of an essential portion in the process for manufacturing the semiconductor integrated circuit device of FIG. 1. First, the trenches 2a are made in the major surface of the semiconductor substrate 1, and an insulating film of a silicon oxide film is then deposited over the major surface of the semiconductor substrate 1 by a CVD (Chemical Vapor Deposition) method or the like. The insulating film is polished and planarized by a CMP (Chemical Mechanical Polishing) method or the like and buried only in the trenches 2a to form the separation film 2b and thereby to form the element separation region 2.

Subsequently, the semiconductor substrate 1 is oxidized to form an insulating film of a silicon oxide film or the like on the exposed regions of the major surface of the semiconductor substrate 1. After this, a photoresist pattern (a first mask) 7a through which the well separation region (a first well forming region) and the second well forming region are exposed and which covers the other regions is formed over the major surface of the semiconductor substrate 1. Here, the opening end portions of the photoresist pattern 7a are arranged over the separation region 2.

An example of a planar layout of this photoresist pattern 7a is shown in FIG. 5. In FIG. 5, there are shown two rectangular patterns 7a1 and 7a2. The rectangular pattern 7a1 is a mask pattern for forming the well on the well separation region side, and its inside is the exposed region of the semiconductor substrate 1. The rectangular pattern 7a2 is a mask pattern for forming the well on the second well forming region side, and its inside is the exposed region of the semiconductor substrate 1.

After this, the semiconductor substrate 1 is doped with ions of phosphorus by using the photoresist pattern 7a as the mask so that the buried n-wells 3a and 3b may be formed at deep positions of the semiconductor substrate 1, as shown in FIG. 4. At this time, the impurity concentration of the buried n-wells 3a and 3b can be set to optimum.

After this, ion implantation of boron, for example, is performed by using the same photoresist pattern 7a as the mask so that the shallow p-wells 4a and 4b may be formed in a self-alignment manner over the buried n-wells 3a and 3b. The acceleration energy for the ion implantation to form the p-wells 4a and 4b is conditioned to be lower than that for the ion implantation to form the n-wells 3a and 3b. Specifically, the peak region of the impurity concentration of the buried n-well regions 3a and 3b is formed deeper than that of the impurity concentration of the shallow p-well regions 4a and 4b.

At this time, according to the technical concept of the invention, the impurity concentrations of the shallow p-wells 4a and 4b are not set by the difference from the impurity concentrations of the buried n-wells 3a and 3b but can be set to optimum impurity concentrations independently of the buried n-wells 3a and 3b. This makes it possible to improve the characteristics of the element to be formed in the shallow p-wells 4a and 4b, such as the threshold voltage or the drain current if the element is a MOS·FET (Metal-Oxide-Semiconductor) or a MIS·FET (Metal-Insulator Semiconductor FET), as will be described hereinafter.

Since the buried n-wells 3a and 3b and the shallow p-wells 4a and 4b are formed by using not the separate photoresist patterns but by the single photoresist pattern 7a, moreover, the manufacturing cost can be made far lower than that of the case in which the individual wells are formed by using separate photoresist patterns. The rate of occurrence of defects due to foreign matters can be reduced to improve the yield and reliability of the semiconductor integrated circuit device.

Here, the sequence of introduction of the impurity for the buried n-wells 3a and 3b and introduction of the impurity for the shallow p-wells 4a and 4b may be reversed.

Next, the photoresist pattern 7a shown in FIG. 4 is removed, and a photoresist pattern (a second mask) 7b through which the outer peripheral region (the third well forming region) and the fourth well forming region of the well separation region are exposed and which covers the other regions is formed over the major surface of the semiconductor substrate 1, as shown in FIG. 6. Here, the opening end portions of the photoresist pattern 7b are also arranged over the separation region 2.

An example of a planar layout of this photoresist pattern 7b is shown in FIG. 7. FIG. 7 shows a picture-frame pattern 7b1 and a rectangular pattern 7b2. Here, the rectangular patterns 7a1 and 7a2 of the photoresist pattern 7a are shown by broken lines in FIG. 7 so as to clearly show the positional relation with the photoresist pattern 7a (see FIGS. 4 and 5).

The picture-frame pattern 7b1 is a pattern for forming the n-well on the well separation region, and its inside indicates the exposed region of the semiconductor substrate 1. The rectangular pattern 7b2 is a pattern for forming the n-well of the fourth well forming region, and its inside is the exposed region of the semiconductor substrate 1.

After this, the semiconductor substrate 1 is doped with ions of phosphorus to form the shallow n-wells 5a and 5b, as shown in FIG. 6, by using the photoresist pattern 7b as the mask. At this time, the impurity concentration of the n-wells 5a and 5b can be set optimum. This makes it possible to improve the characteristics of the element to be formed in the shallow n-well 5b, such as the threshold voltage or the drain current if the element is a MIS·FET, for example.

Thus, according to the technical concept of the invention, the impurity concentrations of the shallow p-wells 4a and 4b and the shallow n-well 5b can be set optimum independently of each other thereby to optimize at all times the characteristics of the element to be formed in the regions of the shallow p-wells 4a and 4b and the shallow n-well 5b, such as the threshold voltage or the drain current of the element when this element are MIS·FET.

Since the buried n-wells 3a and 3b, the shallow p-wells 4a and 4b and the shallow n-wells 5a and 5b can be formed only with the two photoresist patterns 7a and 7b, moreover, the number of steps of forming the photoresist patterns can be reduced compared with the technique of forming the photoresist pattern for each well. Specifically, it is possible to eliminate a series of steps of applying, exposing, developing, cleaning and drying the photoresist film which is necessary to form one photoresist pattern. This makes it possible to reduce the cost for manufacturing the semiconductor integrated circuit device. Since the rate of occurrence of defects due to foreign matters can be reduced, moreover, it is possible to improve the yield of the semiconductor integrated circuit device.

The impurity introduction is so performed that the impurity concentration of at least a portion of the shallow n-well 5a and in the vicinity (i.e., in the lower part of FIG. 6) of the buried n-well 3a is higher than the impurity concentration of a portion of the shallow p-well 4a and in the vicinity of the buried n-well 3a and in the vicinity (i.e., in the lower corner parts of FIG. 6) of the shallow n-well 5a.

As a result, at the step of introducing the impurity for forming the shallow well 5a, the pn junction of the shallow well 5a can be kept, even if its position is planarly offset, away from the shallow p-well 4a. This makes it possible to ensure the breakdown voltage of the shallow well 5a and accordingly the electric separation ability between the shallow well 4a in the well separation region and the semiconductor substrate 1.

As a result, a highly reliable semiconductor integrated circuit device can be provided at a low cost giving a drastic influence on the semiconductor industry.

Next, here will be described the case in which the technical concept of the invention is applied to a DRAM (Dynamic Random Access Memory), with reference to FIGS. 8 to 14.

Figure 8:
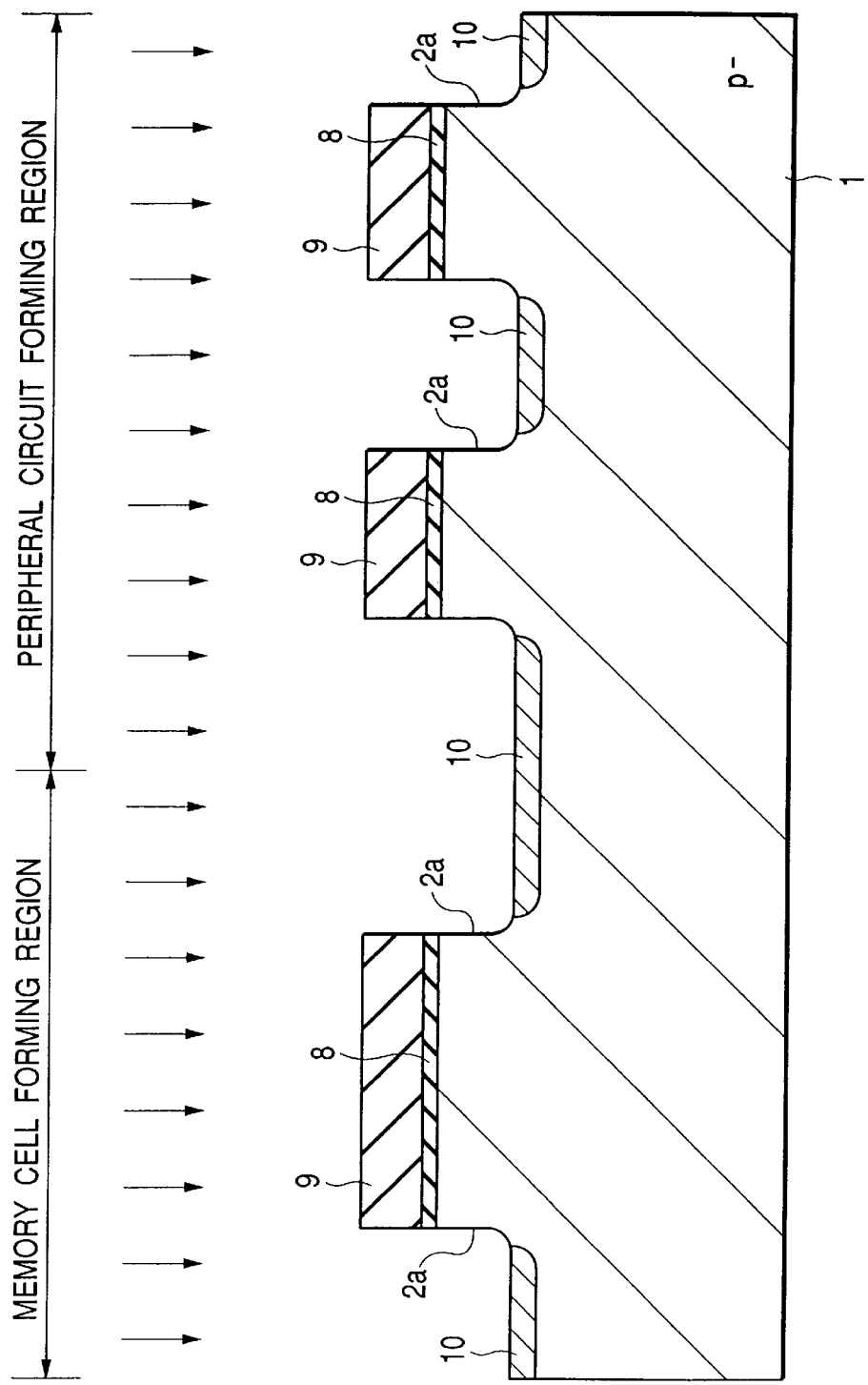
FIG. 8. is a section of essential portions in a process for manufacturing a semiconductor integrated circuit device of one embodiment of the invention.

FIG. 8 is a section showing a memory cell forming region (a first well forming region and a third well forming region) and a peripheral circuit forming region (a second well forming region and a fourth well forming region) in a process for manufacturing the DRAM.

First, a pad film 8 of a silicon oxide film or the like having a thickness of 20 nm is grown by a thermal oxidation method or the like over the major surface of the semiconductor substrate 1 made of a single crystal of p-type silicon having a resistivity of 10 Ωcm, for example. After this, an insulating film 9 of a silicon nitride film or the like having a thickness of 200 nm is deposited over the pad film 8 by the chemical vapor deposition method (CVD method).

Subsequently, a photoresist pattern through which an element separation region is exposed and which cover an element region is formed over the insulating film 9. After this, the photoresist pattern is used as the etching mask to pattern the underlying insulating film 9 by a dry etching method.

After this, the pattern of the insulating film 9 is used as the etching mask to form trenches 2a to serve as the separation region in the semiconductor substrate 1 by a dry etching method. After this, the surfaces of the trenches 2a of the semiconductor substrate 1 are doped with ions of boron or the like under the conditions of an acceleration energy of 50 KeV and a dosage of $5 \times 10^{12}/cm^2$, for example, so as to form a channel stopper layer 10 in the element separation region of the semiconductor substrate 1.

Figure 9:
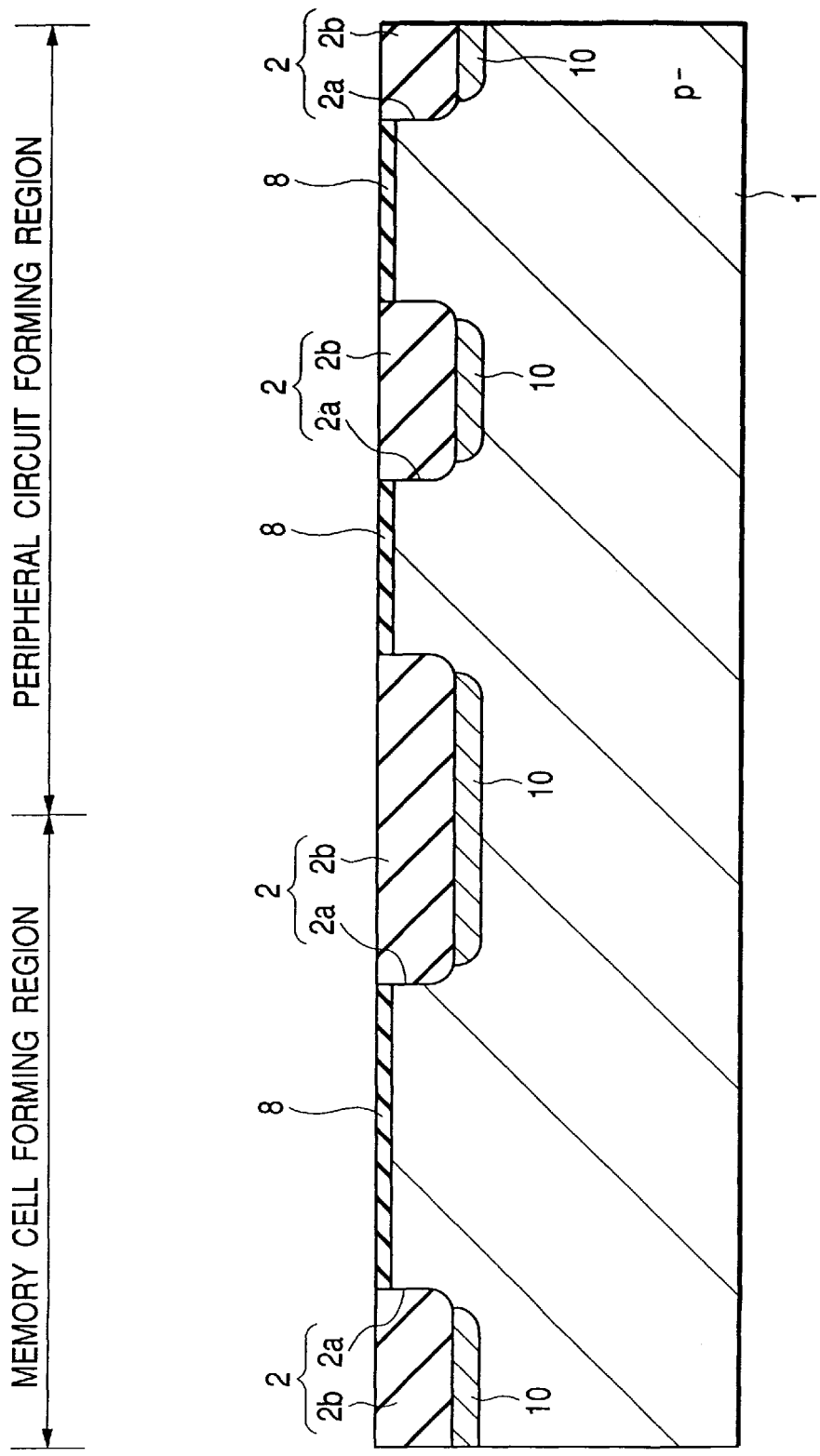
FIG. 9 is a section of essential portions in the semiconductor integrated circuit device manufacturing process subsequent to FIG. 8.

Next, a silicon oxide film or the like having a thickness of 400 nm, for example, is deposited over the major surface of the semiconductor substrate 1 including the surfaces of the trenches 2a, as shown in FIG. 9. After this, the silicon oxide film is so planarized by a CMP method or the like as to be left only in the trenches 2a, so that the separation film 2b may be formed in the trenches 2a to form the element separation region 2. This element separation region 2 defines an active region.

Figure 10:
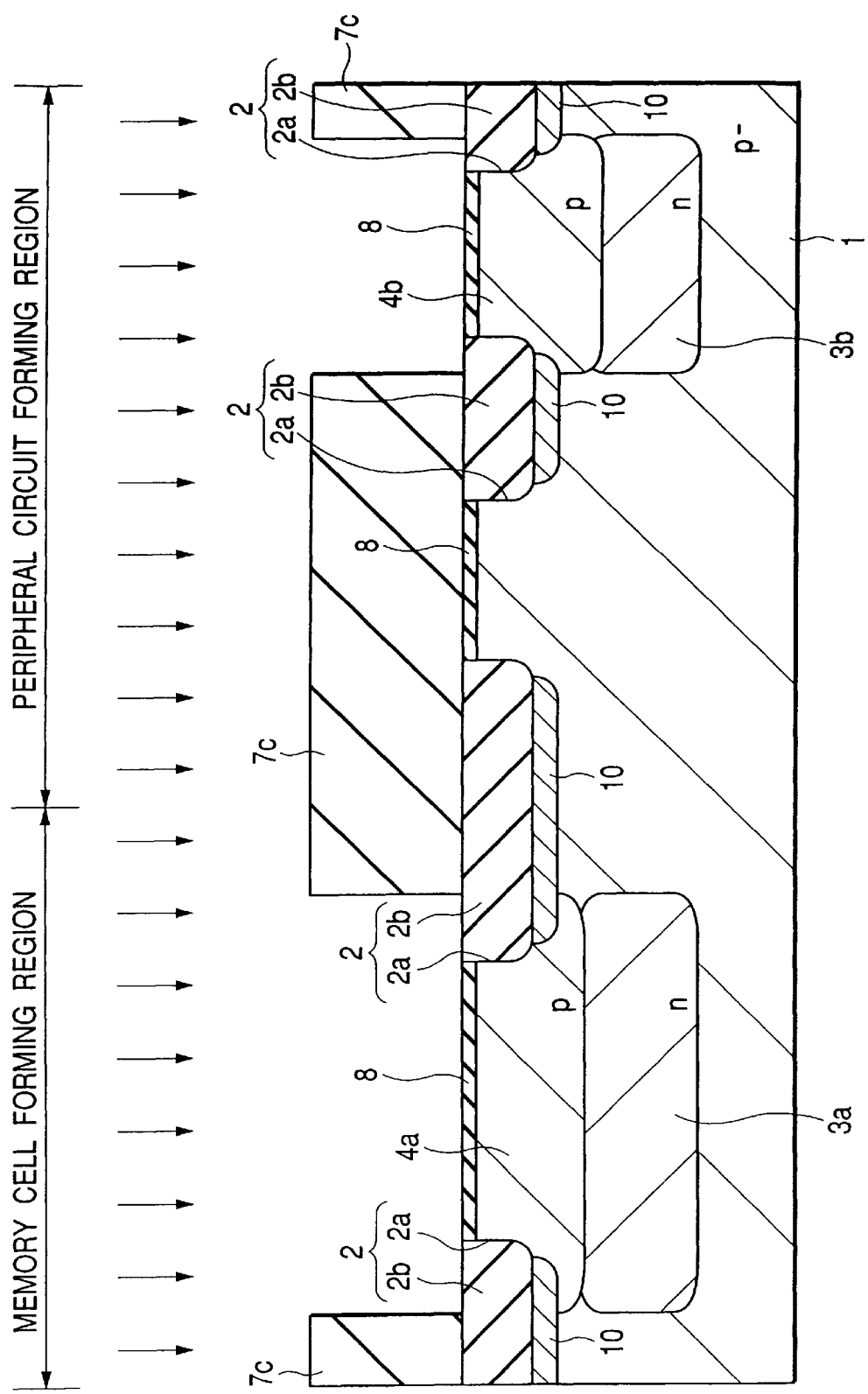
FIG. 10 a section of essential portions in the semiconductor integrated circuit device manufacturing process subsequent to FIG. 9.

Subsequently, a photoresist pattern (a first mask) 7c having a thickness of about 5 μm through which the region where the n-channel MIS·FETs such as a memory cell forming region and a peripheral circuit forming region are exposed which covers the other regions is formed over the major surface of the semiconductor substrate 1, as shown in FIG. 10.

Figure 11:
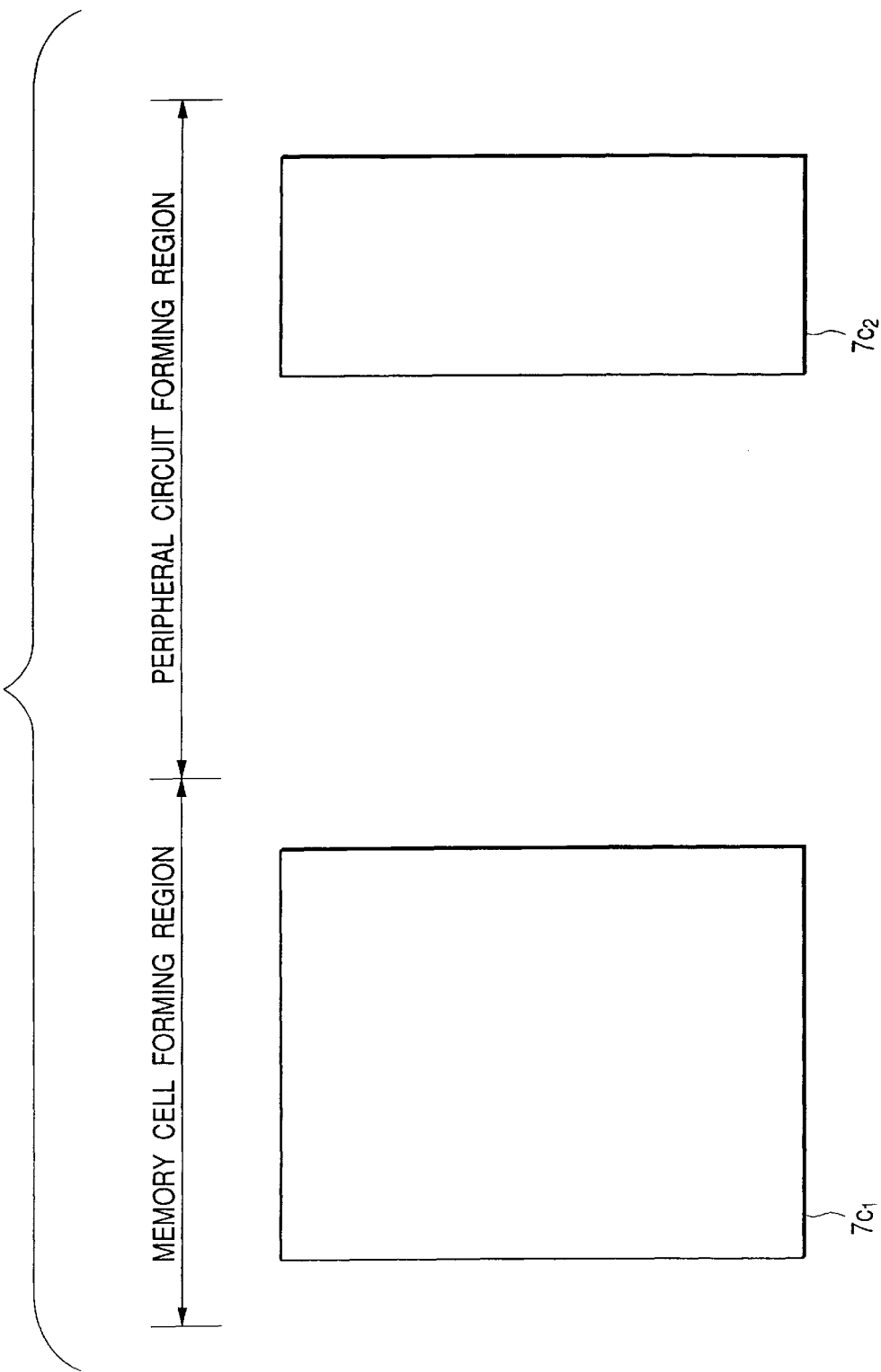
FIG. 11 is a section of essential portions in the semiconductor integrated circuit device manufacturing process subsequent to FIG. 10.

An example of a planar layout of this photoresist pattern 7c is shown in FIG. 11. FIG. 11 shows two rectangular patterns 7c1 and 7c2. The rectangular pattern 7c1 is a mask pattern for forming a well on the memory cell forming region side, and its inside indicates the exposed region of the semiconductor substrate 1. On the other hand, the rectangular pattern 7c2 is a mask pattern for forming a well on the side of a peripheral circuit forming region side, and its inside is the exposed region of the semiconductor substrate 1.

After this, the semiconductor substrate 1 is doped to a deep position with ions of phosphorus or the like under the conditions of an acceleration energy of 2,500 KeV and a dosage of $1 \times 10^{13}/cm^2$ by using the photoresist pattern 7c as the mask, as shown in FIG. 10, so as to form buried n-wells 3a and 3b. At this time, the impurity concentrations of the buried n-wells 3a and 3b can be set optimum.

After this, ion implantation of boron is performed under the three conditions: for example, a condition of an acceleration energy of 500 KeV and a dosage of $7 \times 10^{12}/cm^2$, a condition of an acceleration energy of 150 KeV and a dosage of $5 \times 10^{12}/cm^2$, and a condition of an acceleration energy of 50 KeV and a dosage of $1 \times 10^{12}/cm^2$, by using the same photoresist pattern 7c as the mask so as to form the shallow p-wells 4a and 4b in a self-alignment manner over the buried n-wells 3a and 3b. Thus, the acceleration energy for the ion implantation to form the shallow p-wells 4a and 4b is lower than that for the ion implantation to form the buried n-wells 3a and 3b. Specifically, the peak regions of the impurity concentration of the buried n-wells 3a and 3b are deeper than those of the impurity concentrations of the shallow p-wells 4a and 4b.

At this time, in this embodiment, the impurity concentration of the shallow p-wells 4a and 4b can be set optimum not by the difference from the impurity concentrations of the buried n-wells 3a and 3b but independently of the buried n-wells 3a and 3b. This makes it possible to improve the characteristics of the elements to be formed in the shallow p-wells 4a and 4b, such as the threshold voltage or the drain current if the element are MIS·FETs.

Since the buried n-wells 3a and 3b and the shallow p-wells 4a and 4b are formed by using not the separate photoresist patterns but by using the single photoresist pattern 7c, moreover, the manufacturing cost can be made far lower than that of the case in which the wells are formed by using separate photoresist patterns. The rate of occurrence of defects due to foreign matters can be reduced to improve the yield and reliability of the DRAM.

Here, the sequence of introduction of the impurity into the buried n-wells 3a and 3b and introduction of the impurity into the shallow p-wells 4a and 4b may be reversed.

Figure 12:
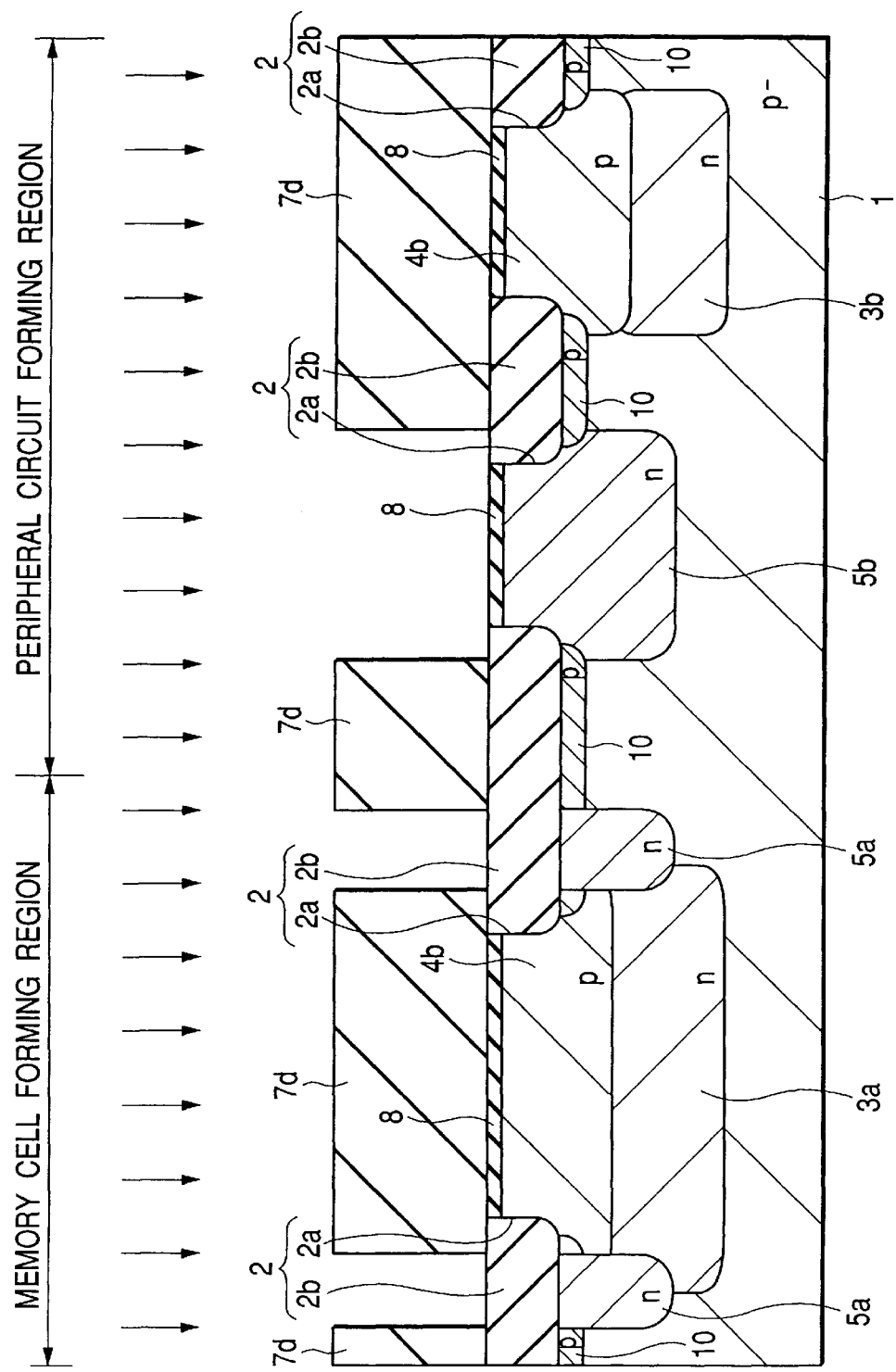
FIG. 12 is a section of essential portions in the semiconductor integrated circuit device manufacturing process subsequent to FIG. 11.

Next, the photoresist pattern 7c shown in FIG. 10 is removed, and a photoresist pattern (a second mask) 7d having a thickness of about 3 $\mu$m through which exposed are the peripheral region of the memory cell forming region and the p-channel MIS·FET forming region of the peripheral circuit forming region and which covers the other regions is formed over the major surface of the semiconductor substrate 1, as shown in FIG. 12.

Figure 13:
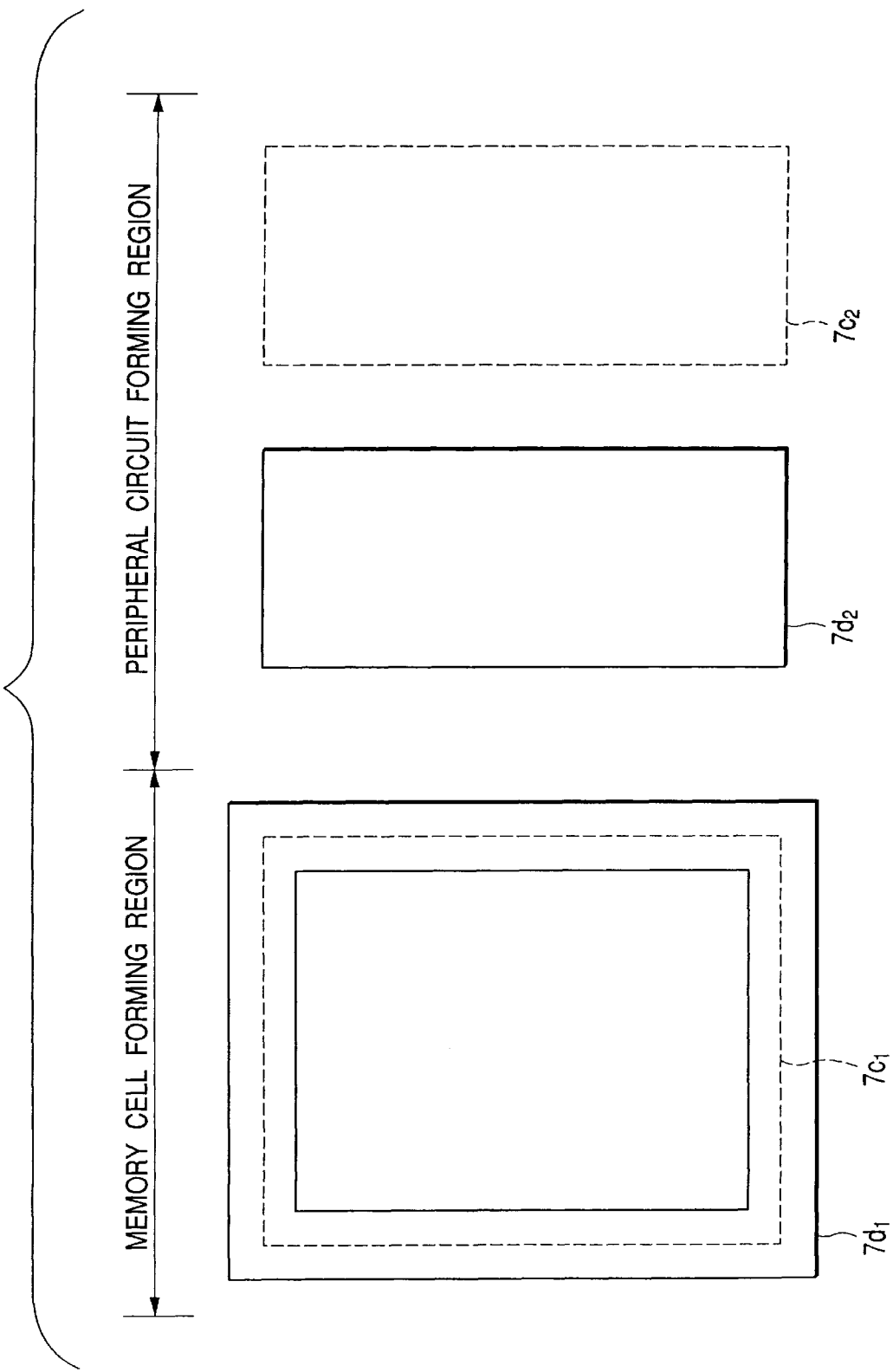
FIG. 13 is a section of essential portions in the semiconductor integrated circuit device manufacturing process subsequent to FIG. 12.

A planar layout of this photoresist pattern 7d is shown in FIG. 10. FIG. 13 shows a picture-framed pattern 7d1 and a rectangular pattern 7d2. Here, the rectangular patterns 7c1 and 7c2 of the photoresist pattern 7c are shown by broken lines in FIG. 13 so as to clearly show the positional relation to the photoresist pattern 7c (as should be referred to FIGS. 10 and 11).

The picture-framed pattern 7d1 is a pattern for forming the n-well on the memory cell forming region side, and its inside indicates the exposed region of the semiconductor substrate 1. The rectangular pattern 7d2 is a pattern for forming the n-well of the peripheral circuit forming region, and its inside is the exposed region of the semiconductor substrate 1.

After this, the semiconductor substrate 1 is doped with ions of phosphorus or the like under the three conditions: a condition of an acceleration energy of 1,100 KeV and a dosage of $1.5 \times 10^{13}/cm^2$, a condition of an acceleration energy of 500 KeV and a dosage of $3 \times 10^{12}/cm^2$ and a condition of an acceleration energy of 180 KeV and a dosage of $5 \times 10^{11}/cm^2$ to form the shallow n-wells 5a and 5b, as shown in FIG. 12, by using the photoresist pattern 7d as the mask. After this, the semiconductor substrate 1 is doped with ions of boron difluoride ($BF_2$) under a condition of an acceleration energy of 70 KeV and a dosage of $2 \times 10^{12}/cm^2$. Here, the ion implantation of $BF_2$ is performed to set the threshold voltage of the p-MIS·FET to be formed in the peripheral circuit forming region.

At this time, in this embodiment, the n-wells 5a and 5b can be set to the optimum impurity concentration. This makes it possible to improve the characteristics of the element to be formed in the shallow n-well 5b, such as the threshold voltage or the drain current if the element is exemplified by the MIS·FET, for example.

Thus, in this embodiment, the impurity concentrations of the shallow p-wells 4a and 4b and the shallow n-well 5b can be set optimum. Independently of each other thereby to optimize at all times the characteristics of the elements to be formed in the regions of the shallow p-wells 4a and 4b and the shallow n-well 5b, such as the threshold voltages and the drain currents of the element when this elements are the MOS·FETs. Since the buried n-wells 3a and 3b, the shallow p-wells 4a and 4b and the shallow n-wells 5a and 5b can be formed only with the two photoresist patterns 7a and 7b, moreover, the number of steps of forming the photoresist patterns can be reduced compared with the technique of forming the photoresist pattern for each well. Specifically, it is possible to reduce a series of steps of applying, exposing, developing, cleaning and drying the photoresist film which is necessary to form one photoresist pattern. This makes it possible to reduce the cost for manufacturing the DRAM. Since the rate of occurrence of defects due to the foreign matters can be reduced, moreover, it is possible to improve the yield of the DRAM.

As a result, a highly reliable DRAM can be provided at a low cost, giving drastic influence on the semiconductor industry.

Figure 14:
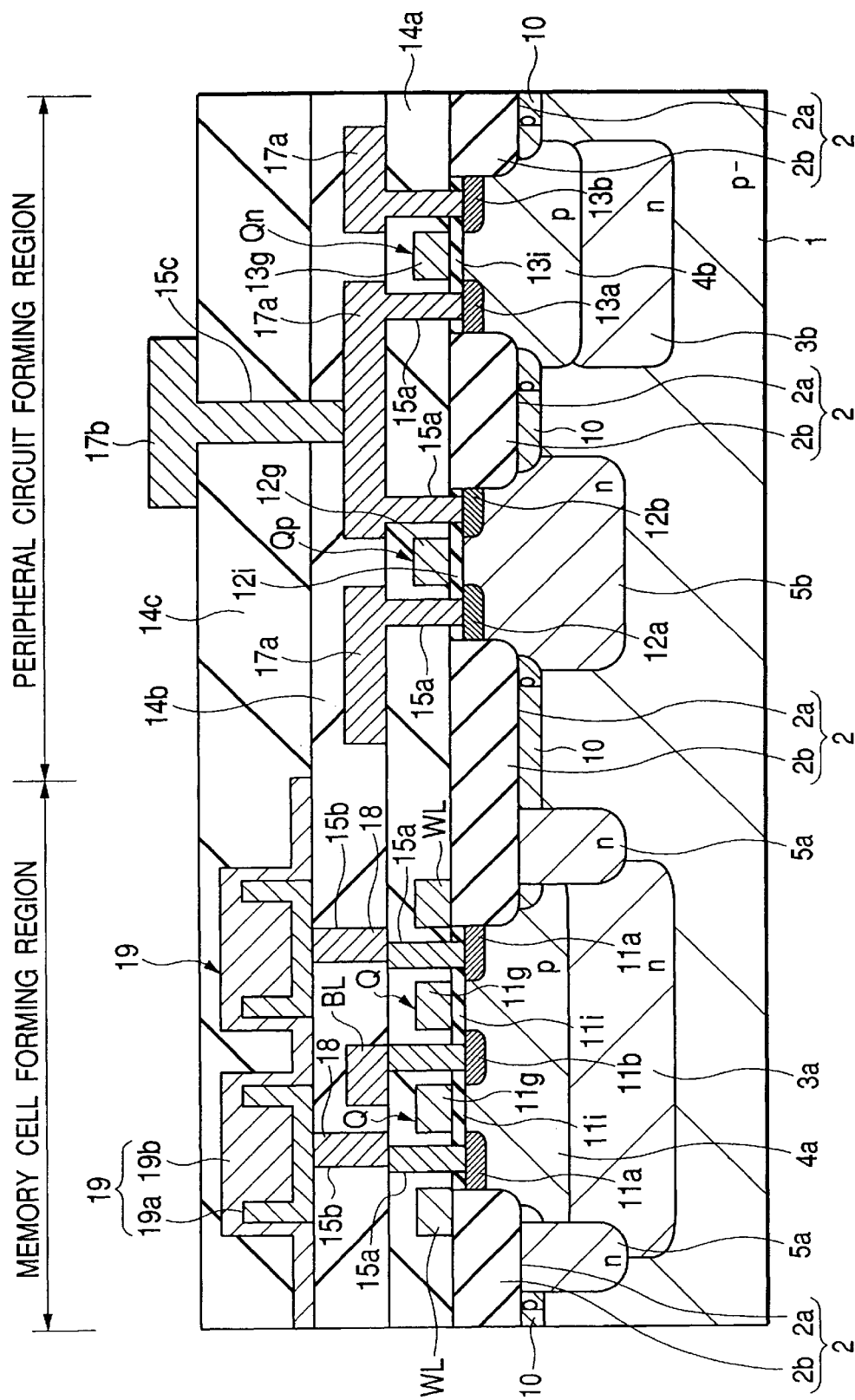
FIG. 14 is a section of essential portions in the semiconductor integrated circuit device manufacturing process subsequent to FIG. 13.
Figure 15:
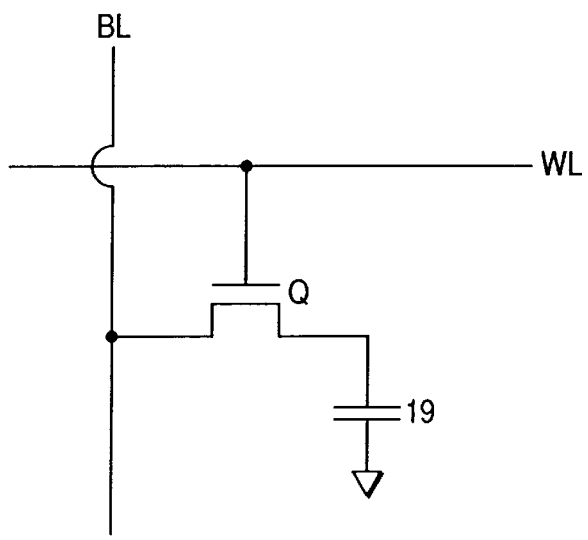
FIG. 15 is a circuit diagram of a memory cell in the semiconductor integrated circuit device of FIG. 14.

Next, as shown in FIG. 14, a memory cell selecting MIS·FET Q is formed in the memory cell forming region, and a p-MIS·FET Qp and an n-MIS·FET Qn are formed in the peripheral circuit forming region.

The memory cell selecting MIS·FET Q mainly include a pair of n-type semiconductor regions 11a and 11b formed separately from each other over the p-well 4a; a gate insulating film 11i formed over the active region of the semiconductor substrate 1; and a gate electrode 11g formed over the gate insulating film 11i. Here, the memory cell selecting MIS·FET Q has a threshold voltage of 1 V or the like.

The shallow p-well 4a for forming the memory cell selecting MIS·FET Q is completely encompassed by the buried n-well 3a and the shallow n-well 5a so that it is electrically separated from the semiconductor substrate 1. As a result, the shallow p-well 4a can be fed with a voltage different from that applied to the semiconductor substrate 1. Here, the voltage applied to the shallow p-well 4a is fed through the wiring connected with the upper face of the shallow p-well 4a. The shallow n-well 5a or the like is given a similar structure in connection with the well electricity feed.

The semiconductor regions 11a and 11b are regions where the source/drain of the memory cell selecting MIS·FET Q are formed and doped with arsenic (As). Between these semiconductor regions 11a and 11b and just under the gate electrode 11g, there is formed the channel region of the memory cell selecting MIS·FET Q.

The gate electrode 11g is formed of a part of word lines WL by depositing an n-type low resistance polysilicon film, a titanium nitride (TiN) film and a tungsten (W) film in the order of mention from below, for example.

The titanium nitride film in the gate electrode 11g is a barrier metal film for preventing a silicide from being formed at a contact portion by a heat treatment of the manufacture process when the tungsten film is deposited directly on the low resistance polysilicon film.

The barrier metal film should not be limited to titanium nitride but can be changed in various manners. For example, tungsten nitride (WN) is also an excellent material used for the barrier metal film.

The tungsten film in the gate electrode llg of the memory cell selecting MIS·FET Q has a function to lower the wiring resistance, so that the sheet resistance of the gate electrode 11g (i.e., the word line WL) can be reduced to about 2 to 2.5 $\Omega/\square$. This value is about $\frac{1}{10}$ of the specific resistance of 15 to 10 $\mu\Omega$cm of tungsten silicide.

As a result, it is possible to improve the access speed of the DRAM. Since the number of memory cells arranged along one word line WL, moreover, the area occupied by the entire memory region can be reduced, thereby reducing the size of the semiconductor chip.

In the present embodiment, for example, 512 memory cells can be arranged along the word line WL. This arrangement can reduces the size of the semiconductor chip by about 6%, compared with the case in which 256 memory cells can be arranged along the word line WL. In a semiconductor chip of a further miniaturized class, it is possible to achieve an effect to reduce the size of the semiconductor chip by 10% or less. As a result, the number of semiconductor chips to be manufactured by a single process can be increased to promote the cost reduction of the DRAM. If the size of the semiconductor chip is not changed, it is possible to improve the degree of element integration.

The gate insulating film 11i is a silicon oxide film, for example, and its thickness is set to about 7 nm, for example. The gate insulating film 11i may also be an oxynitride film (SiON film). As a result, the interface state in the gate insulating film can be suppressed, and the electron trap in the gate insulating film can also be reduced, so that the hot carrier resistance in the gate insulating film 11i can be improved. This makes it possible to improve the reliability of the extremely thin gate insulating film 11i.

Methods of oxynitriding the gate insulating film 11i include the method of subjecting the gate insulating film 11i formed by oxidization to a high temperature heat treatment in a gas atmosphere of $NH_3$ or $NO_2$ to introduce nitrogen into the gate insulating film 11i; the method of forming an nitride film on the face of the gate insulating film 11i of silicon oxide or the like; the method of doping the major surface of the semiconductor substrate with ions of nitrogen and then oxidizing the doped semiconductor substrate to form the gate insulating film 11i; or the method of doping a polysilicon film to form gate electrodes with ions of nitrogen and then thermally treating the doped polysilicon film to deposit the nitrogen in the gate insulating film.

The p-MIS·FET Qp in the peripheral circuit forming region mainly includes a pair of p-type semiconductor regions 12a and 12b formed separately from each other over the n-well 5b; a gate insulating film 12i formed over the semiconductor substrate 1; and a gate electrode 12g formed over the gate insulating film 12i. Here, this MIS·FET Qp has a threshold voltage of 0.3 V or the like.

The semiconductor regions 12a and 12b are regions where the source/drain of the p-MIS·FET Qp is formed. Between these semiconductor regions 12a and 12b and just under the gate electrode 12g, there is formed the channel region of the p-MIS·FET Qp.

These semiconductor regions 12a and 12b are given an LDD (Lightly Doped Drain) structure. In the semiconductor regions 12a and 12b, more specifically, there may be formed a low concentration region ($P^-$) having a relatively low impurity concentration and a high concentration region ($P^+$) having a relatively high impurity concentration. Of these, the low concentration region is formed on the channel region side whereas the high concentration region is provided on the outer side of the former. In other words, the low concentration region is formed between the channel region and the high concentration region.

The gate electrode 12g is patterned simultaneously with the gate electrode 11g (the word line WL) of the memory cell forming region and is formed by depositing an n-type low resistance polysilicon film, a titanium nitride film and a tungsten film in the order of mention from below, for example.

The gate insulating film 12i is formed simultaneously with the gate insulating film 11i of the memory cell forming region and is made of silicon oxide, for example, to have a thickness of about 7 nm, for example. The gate insulating film 12i may also be an oxynitride film (i.e., an SiON film). This makes it possible to improve the hot carrier resistance of the extremely thin gate insulating film 12i.

In the shallow p-well 4b of the peripheral circuit forming region (on the righthand side of FIG. 14), on the other hand, there is formed the n-MIS·FET Qn. Here, the buried n-well 3b is formed just under the shallow p-well 4b in which the n-MIS·FET Qn is formed, but the lower side portion of the shallow p-well 4b is electrically connected with the semiconductor substrate 1 without being encompassed by the n-type semiconductor region, thereby to cause no obstruction to the feed of the potential from the semiconductor substrate 1 to the shallow p-well 4b.

The n-MIS·FET Qn mainly includes a pair of n-type semiconductor regions 13a and 13b formed separately from each other over the p-well 4b; a gate insulating film 13i formed over the semiconductor substrate 1; and a gate electrode 13g formed over the gate insulating film 12i. Here, this MIS·FET Qn has a threshold voltage of 0.3 V or the like.

The semiconductor regions 13a and 13b are regions where the source/drain of the n-MIS·FET Qn is formed. Between these semiconductor regions 13a and 13b and just under the gate electrode 13g, there is formed the channel region of the n-MIS·FET Qn.

These semiconductor regions 13a and 13b are given the LDD (Lightly Doped Drain) structure. In the semiconductor regions 13a and 13b, more specifically, there may be formed a low concentration region having a relatively low impurity concentration and a high concentration region having a relatively high impurity concentration. Of these, the low concentration region is formed on the channel region side whereas the high concentration region is formed on the outer side of the former. In other words, the low concentration region is formed between the channel region and the high concentration region.

The gate electrode 13g is formed simultaneously with the formation of the gate electrode 11g (the word line WL) of the memory cell forming region and the gate electrode 12g of the peripheral circuit forming region and is formed by depositing an n-type low resistance poly-silicon film, a titanium nitride film and a tungsten film in order of mention from below, for example.

The gate insulating film 13i is formed simultaneously with the formation of the gate insulating film 11i of the memory cell forming region and the gate insulating film 12i of the peripheral circuit forming region and is a silicon oxide film, for example, to have a thickness of about 7 nm, for example. The gate insulating film 13i may also be an oxide/nitride film (an SiON film). This makes it possible to improve the hot carrier resistance of the extremely thin gate insulating film 13i, as described hereinbefore.

On the major surface of this semiconductor substrate 1, there is so deposited an interlayer insulating film 14a which is a silicon oxide film or the like, for example, as to cover the memory cell selecting MIS·FET Q, the p-MIS·FET Qp and the n-MIS·FET. Connection holes 15a from which the major surface of the semiconductor substrate 1 is exposed are formed in predetermined portions of the interlayer insulating film 14a by a photolithography technique and a dry etching technique.

Subsequently, a conductor film is buried in the connection holes 15a of the memory cell region to form plugs 16. After this, a first-layer wiring 17a and a bit line BL are formed by depositing a conductor film of an alloy of aluminum, silicon, and copper, for example, on the interlayer insulating film 14a and then by patterning the conductor film by a photolithography technique and a dry etching technique.

After this, an interlayer insulating film 14b of a silicon oxide film, for example, is so deposited on the interlayer insulating film 14a as to cover the first-layer wiring 17a and the bit line BL. After this, connection holes 15b from which the upper faces of the plugs 16 are exposed are formed in predetermined portions by a photolithography technique and a dry etching technique.

Next, a conductor film is buried in the connection holes 15b of the memory cell forming region to form plugs 18. After this, capacitors 19 having a crown shape for data storage, for example, are formed over the interlayer insulating film 14b. This capacitor 19 each include a storage electrode 19a, a capacitor insulating film formed over the surface of the storage electrode 19a, and a plate electrode 19b formed on the surface of the capacitor insulating film, and constitutes a memory cell together with the memory cell selecting MIS·FET Q, as shown in FIG. 15.

Subsequently, an interlayer insulating film 14c of a silicon oxide film, for example, is so deposited on the interlayer insulating film 14b as to cover the capacitor 19. After this, connection holes 15c from which the first-layer wiring 17a is exposed are formed in the interlayer insulating films 14c and 14b.

After this, a conductor film of an alloy of aluminum, silicon, and copper, for example, is deposited on the interlayer insulating film 14c and is then patterned to form a second-layer wiring 17b by a photolithography technique and a dry etching technique.

After the step, the DRAM is manufactured through the subsequent ordinary steps of forming the wiring and forming the surface protective film. In the semiconductor integrated circuit device thus manufactured, the semiconductor substrate 1 is fed with 0 V, for example, and the shallow p-well 4a of the memory cell forming region is fed with about −1 to −3.3 V, for example, while the semiconductor integrated circuit device is in operation.

The following effects can be achieved by Embodiment 1 thus far described.
(1) The impurity concentrations of the shallow p-wells 4a and 4b and the shallow n-well 5b can be separately set to the optimum values independently of each other, so that the electric characteristics such as the threshold voltages and the drain currents of the MIS·FETs Q, Qn and Qp formed in the regions of the wells 4a and 4b and the shallow n-well 5b can be optimized at all times.
(2) The buried n-wells 3a and 3b, the shallow p-wells 4a and 4b and the shallow n-wells 5a and 5b can be formed only of the two photoresist patterns 7a and 7b, so that the number of steps of forming the photoresist patterns can be reduced compared with the technique of forming a photoresist pattern for each well.
(3) Thanks to the effect (2), it is possible to lower the cost for manufacturing the semiconductor integrated circuit device.
(4) Thanks to the effect (2), the rate of occurrence of defects due to foreign matters can be reduced because of the reducing of the number of photoresist pattern forming steps, so that the yield of the semiconductor integrated circuit device can be improved.
(5) By heightening the impurity concentration of at least a portion (the lower portion) of the shallow n-well 5b more than that of at least a portion (the lower corner) of the shallow p-well 4a, the breakdown voltage of the shallow well 5b can be ensured even if the position at which the shallow well 5b is formed is planarily deviated at the step of introducing the impurity for forming the shallow well 5b. As a result, it is possible to ensure the electrically separating ability between the shallow well 4a and the semiconductor substrate 1 in the well separation region.
(6) Thanks to the effects (3), (4) and (5), it is possible to provide a semiconductor integrated circuit device having a high operation reliability at a low cost.

EMBODIMENT 2

Figure 16:
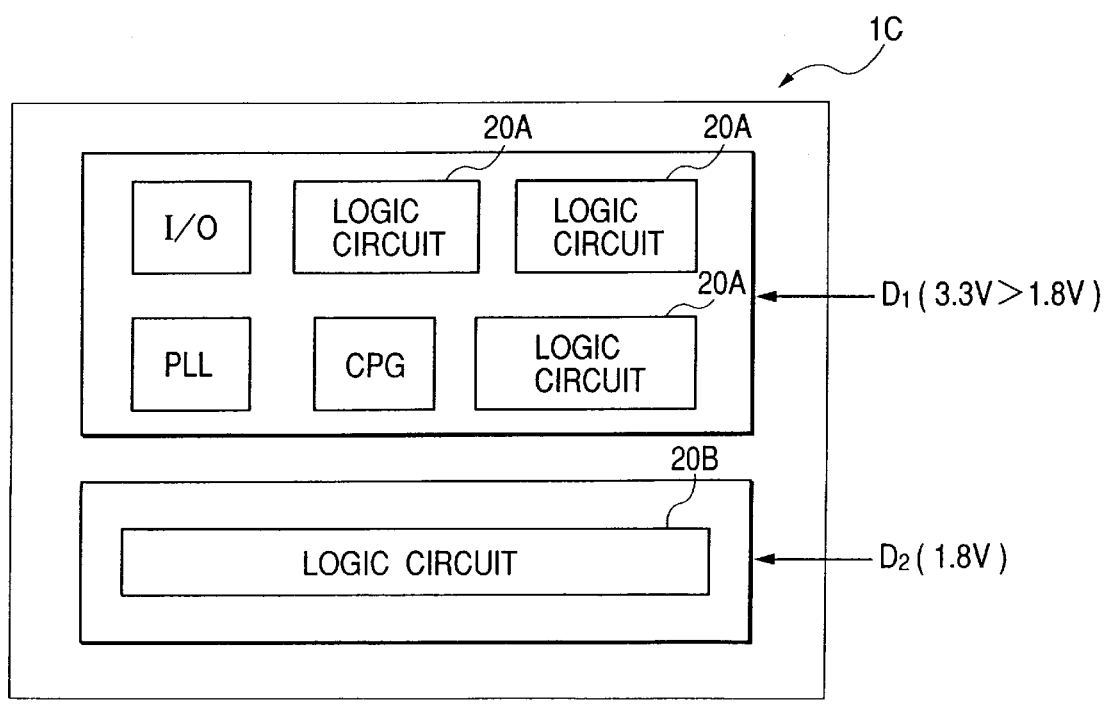
FIG. 16 is a top plan view of a semiconductor chip constituting a semiconductor integrated circuit device of another embodiment of the invention.

FIG. 16 is a top plan view showing a semiconductor chip constituting a semiconductor integrated circuit device of another embodiment of the invention, and FIGS. 17 to 23 are sections showing essential portions in a process for manufacturing the semiconductor integrated circuit device of FIG. 16.

Embodiment 2 will be described taking the case in which the invention is applied to a CMIS (Complimentary MIS) logic circuit having a gate length of 0.25 μm, for example.

FIG. 16 is a top plan view showing a semiconductor chip 1C of the semiconductor integrated circuit device of Embodiment 2. This semiconductor chip 1C is a small chip of p-type single crystal of silicon and has a rectangular shape. In the major surface of the semiconductor chip 1C, there are arranged a region D1 having elements driven at a voltage such as a power supply voltage of 3.3 V which is higher than 1.8 V, and a region D2 having elements driven by the power supply voltage of 1.8 V.

In the arrangement region D1, there are arranged an input/output circuit I/O, a plurality of blocks of logic circuits 20A, a phase-locked-loop circuit PLL, and a clock pulse generator CPG. In the arrangement region D2, there is provided a logic circuit 20E.

Here will be described a process for manufacturing the semiconductor integrated circuit device of Embodiment 2 with reference to FIGS. 17 to 23.

Figure 17:
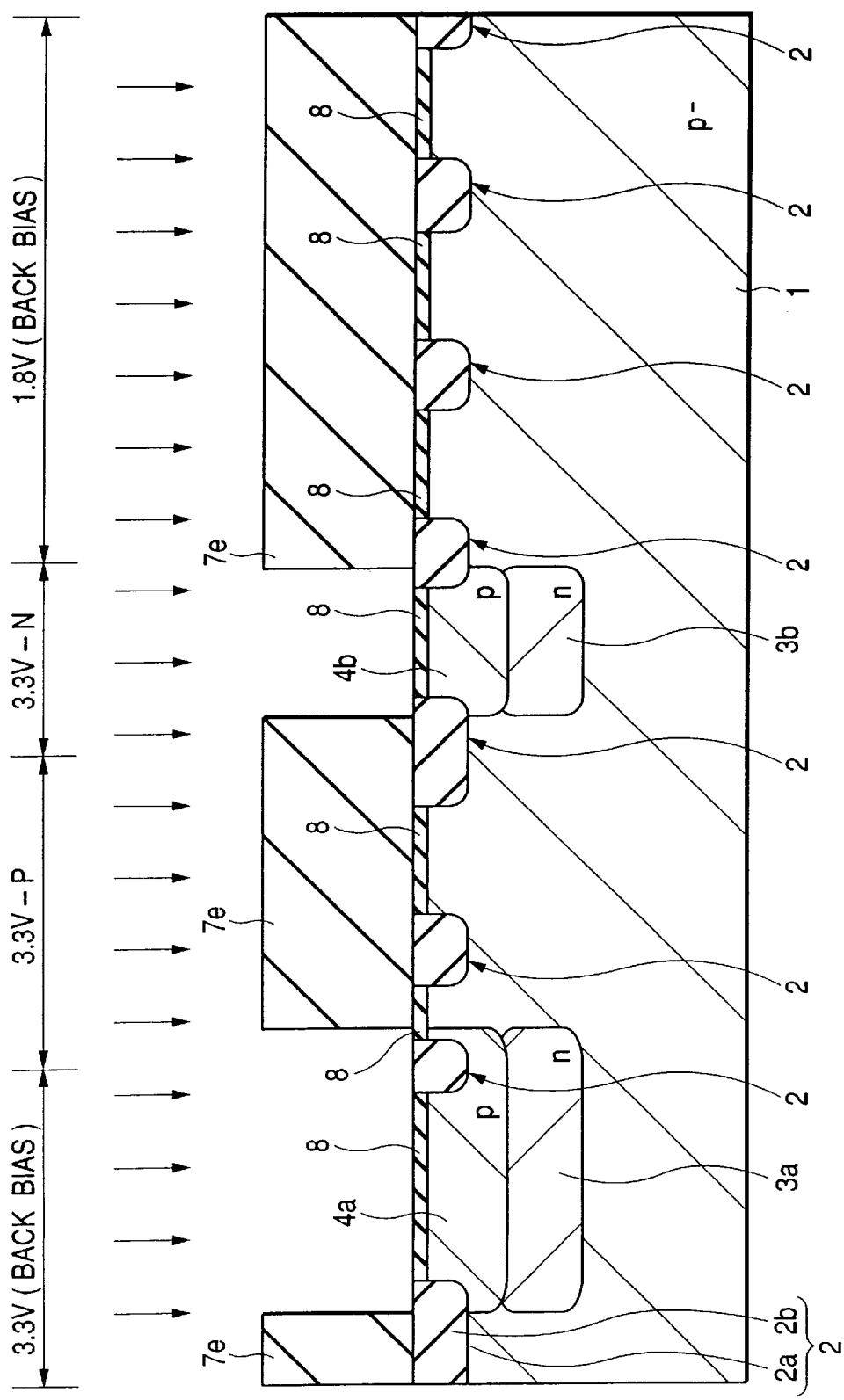
FIG. 17 is a section of essential portions in a process for manufacturing the semiconductor integrated circuit device of FIG. 16.

First, like the foregoing Embodiment 1, a pad film 8 is grown in the major surface of a semiconductor substrate 1 by a thermal oxidation method or the like, as shown in FIG. 17, and a separation region 2 is then formed. Subsequently, there is formed over the major surface of the semiconductor substrate 1 a photoresist pattern (a first mask) 7e which has a thickness of about 5 μm through which the region (a first well forming region and a second well forming region) of 3.3 V-N where an n-MIS·FET driven by a power supply voltage of 3.3 V, for example, is formed is exposed and which cover the other regions.

Subsequently, in order to form buried n-wells 3a and 3b, the photoresist pattern 7e is used as the mask to dope the semiconductor substrate 1 at its deep position with ions of phosphorus or the like under a condition of an acceleration energy of 2,300 KeV and a dosage of $1 \times 10^{13}/cm^2$. At this time, the impurity concentration of the buried n-wells 3a and 3b can be set optimum.

After this, in order to form shallow p-wells 4a and 4b in a self-alignment manner over the buried n-wells 3a and 3b, the same photoresist pattern 7e is used as the mask to introduce ions of boron under the three conditions: a condition of an acceleration energy of 450 KeV and a dosage of $1 \times 10^{13}/cm^2$, a condition of an acceleration energy of 200 KeV and a dosage of $3 \times 10^{12}/cm^2$, and a condition of an acceleration energy of 50 KeV and a dosage of $1.2 \times 10^{12}/cm^2$.

At this time, in this Embodiment 2, the impurity concentration of the shallow p-wells 4a and 4b can be set optimum not by the difference from the impurity concentrations of the buried n-wells 3a and 3b but independently of the buried n-wells 3a and 3b. This makes it possible to improve the characteristics of the MIS·FET formed in the shallow p-wells 4a and 4b, such as the threshold voltage and the drain current.

Since the buried n-wells 3a and 3b and the shallow p-wells 4a and 4b are formed by using not separate photoresist patterns but by the single photoresist pattern 7e, moreover, the manufacturing cost can be made far lower than that of the case in which the individual wells are formed by using separate photoresist patterns. The rate of occurrence of defects due to foreign matters can be reduced to improve the yield and reliability of the semiconductor integrated circuit device.

Here, the sequence of the introduction of the impurity into the buried n-wells 3a and 3b and the introduction of the impurity into the shallow p-wells 4a and 4b may be reversed.

Figure 18:
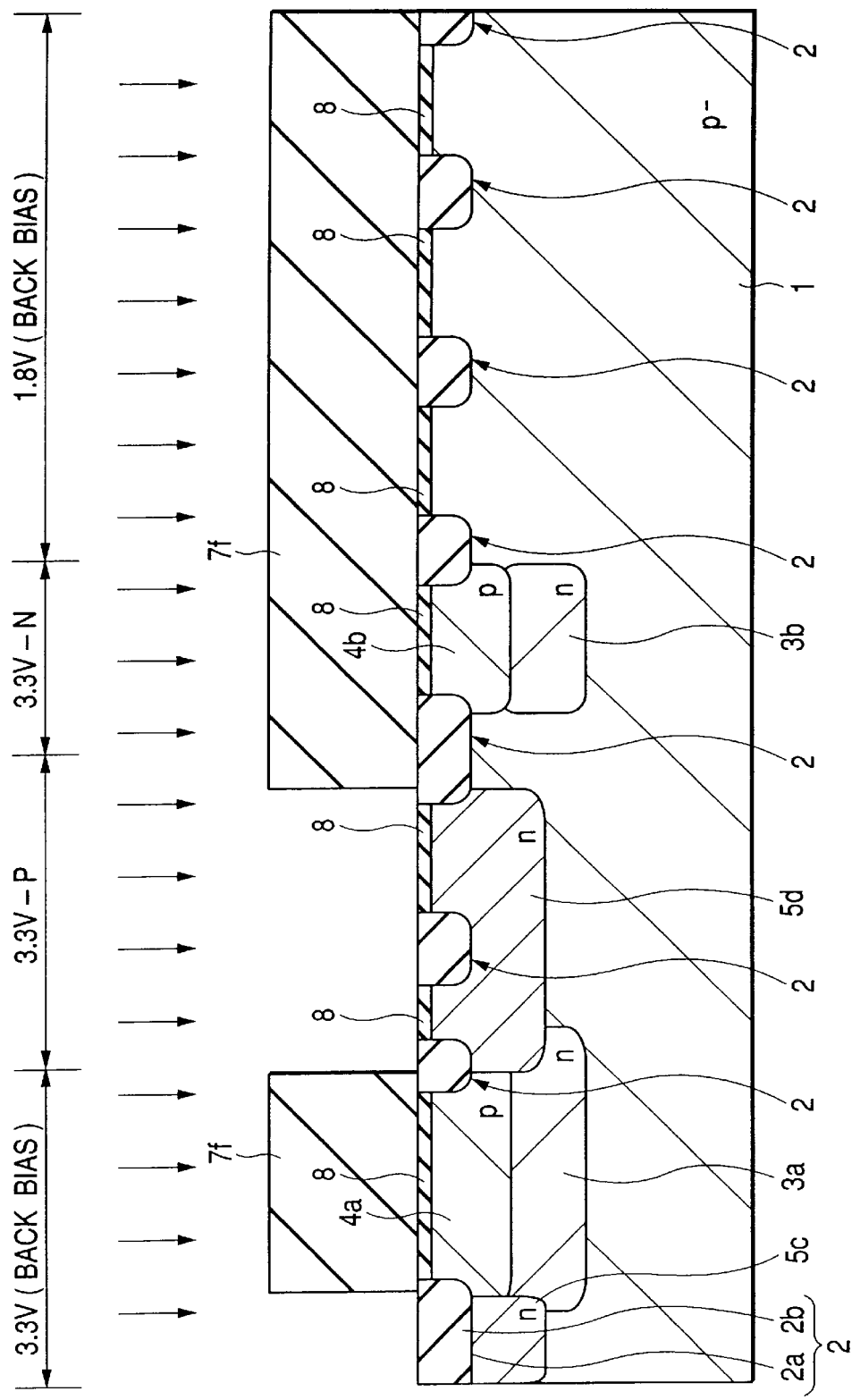
FIG. 18 is a section of essential portions in the semiconductor integrated circuit device manufacturing process subsequent to FIG. 17.

Next, the photoresist pattern 7e shown in FIG. 17 is removed, and a photoresist pattern (a second mask) 7f having a thickness of about 3 μm through which exposed is the region (a third well forming region and a fourth well forming region) of 3.3 V-N positioned in the outer periphery of the region where an n-MIS·FET driven by the power supply voltage of 3.3 V is formed and which covers the other regions is then formed over the major surface of the semiconductor substrate 1, as shown in FIG. 18.

Subsequently, the semiconductor substrate 1 is doped with ions of phosphorus or the like under the three condition: a condition of an acceleration energy of 1,300 KeV and a dosage of $1\times10^{13}/cm^2$, a condition of an acceleration energy of 600 KeV and a dosage of $5\times10^{12}/cm^2$ and a condition of an acceleration energy of 200 KeV and a dosage of $5\times10^{11}/cm^2$ to form shallow n-wells 5c and 5d, by using the photoresist pattern 7f as the mask. After this, the semiconductor substrate 1 is doped with ions of boron difluoride ($BF_2$) under a condition of an acceleration energy of 70 KeV and a dosage of $2\times10^{12}/cm^2$. Here, the ion implantation of $BF_2$ is performed to set the threshold voltage of the p-MIS·FET driven by the power supply voltage of 3.3 V.

These shallow n-wells 5c and 5d are so formed as to encompass the side face of the shallow p-well 4a and the lower parts thereof overlap with the upper portions of the buried n-well 3a and electrically connected with the buried n-well 3a. Specifically, the shallow p-well 4a is encompassed by the shallow n-wells 5c and 5d and the buried n-well 3a and is electrically separated from the semiconductor substrate 1. This makes it possible to feed the shallow p-well 4a with a voltage different from that applied to the semiconductor substrate 1. The shallow n-wells 5c and 5d are fed with 3.3 V, and the voltage of the semiconductor substrate 1 is set to 0 V (GND).

Thus, in this Embodiment 2, the impurity concentrations of the shallow p-wells 4a and 4b and the shallow n-well 5d can be set optimum independently of each other thereby to optimize at all times the characteristics such as the threshold voltage and the drain current of the MIS·FETs Q formed in the regions of the shallow p-wells 4a and 4b and the shallow n-well 5d.

The buried n-wells 3a and 3b, the shallow p-wells 4a and 4b and the shallow n-wells 5c and 5d can be formed only by the two photoresist patterns 7e and 7f, so that the number of steps of forming the photoresist patterns can be reduced compared with the technique of forming a photoresist pattern for each well. As a result, as in Embodiment 1, it is possible to lower the cost for manufacturing the semiconductor integrated circuit device and to improve the yield of the semiconductor integrated circuit device.

The impurity introductions is so performed that the impurity concentration of at least a portion of the shallow n-wells 5c and 5d and the vicinity (i.e., the lower adjacent corner of FIG. 18) of the buried n-well 3a is higher than that of a portion of the shallow p-well 4a and the vicinities (i.e., the lower corner of FIG. 18) of the buried n-well 3a and the shallow n-wells 5c and 5d. As a result, it is possible, as described in connection with Embodiment 1, to ensure the electric separating ability between the shallow well 4a in the well separation region and the semiconductor substrate 1.

As a result, a highly reliable semiconductor integrated circuit device having a CMIS (Complimentary MIS) logic circuit can be provided at a low cost to give a drastic influence on the semiconductor industry.

Figure 19:
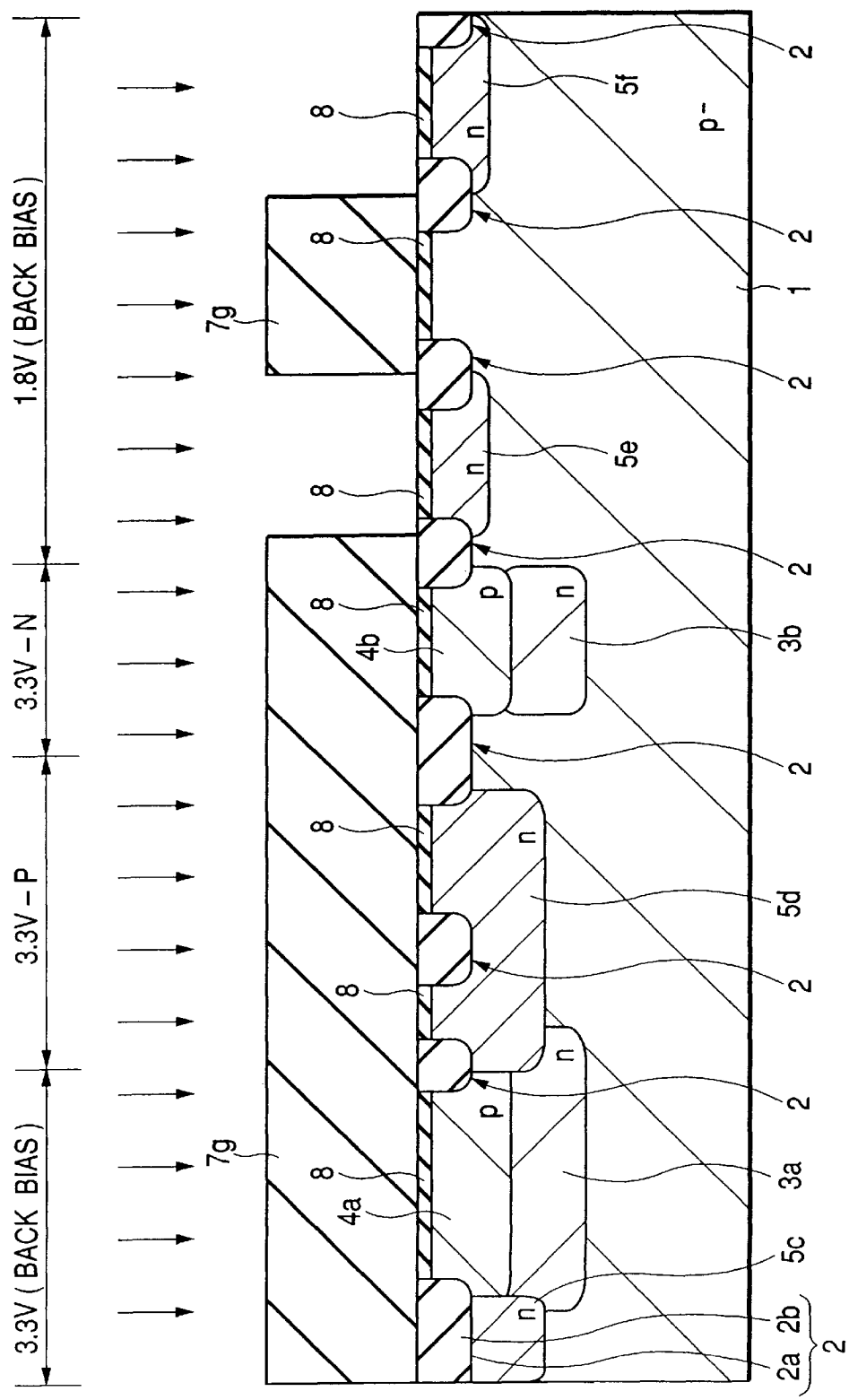
FIG. 19 is a section of essential portions in the semiconductor integrated circuit device manufacturing process subsequent to FIG. 18.

Next, the photoresist pattern 7f shown in FIG. 18 is removed, and a photoresist pattern (a third mask) 7g having a thickness of about 1.5 μm through which exposed are the outer peripheral region where the p-MIS·FET driven by the power supply voltage of 1.8 V and n-well power feeding region is exposed and which covers the other regions is then formed over the major surface of the semiconductor substrate 1, as shown in FIG. 19.

Subsequently, the semiconductor substrate 1 is doped with ions of phosphorus or the like under a condition of an acceleration energy of 400 KeV and a dosage of $1.5\times10^{13}/cm^2$ and a condition of an acceleration energy of 200 KeV and a dosage of $1\times10^{12}/cm^2$ to form 1.8 V system shallow n-wells 5e and 5f to be fed with 1.8 V by using the photoresist pattern 7g as the mask. After this, the semiconductor substrate 1 is doped with ions of boron fluoride ($BF_2$) or the like under a condition of an acceleration energy of 70 KeV and a dosage of $2\times10^{12}/cm^2$.

At this time, in this Embodiment 2, the impurity concentrations of the n-wells 5e and 5f can be set optimum independently of each other. This makes it possible to improve the electric characteristics of the MIS·FET formed in the shallow n-wells 5e and 5f, such as the threshold voltage and the drain current at all times.

Figure 20:
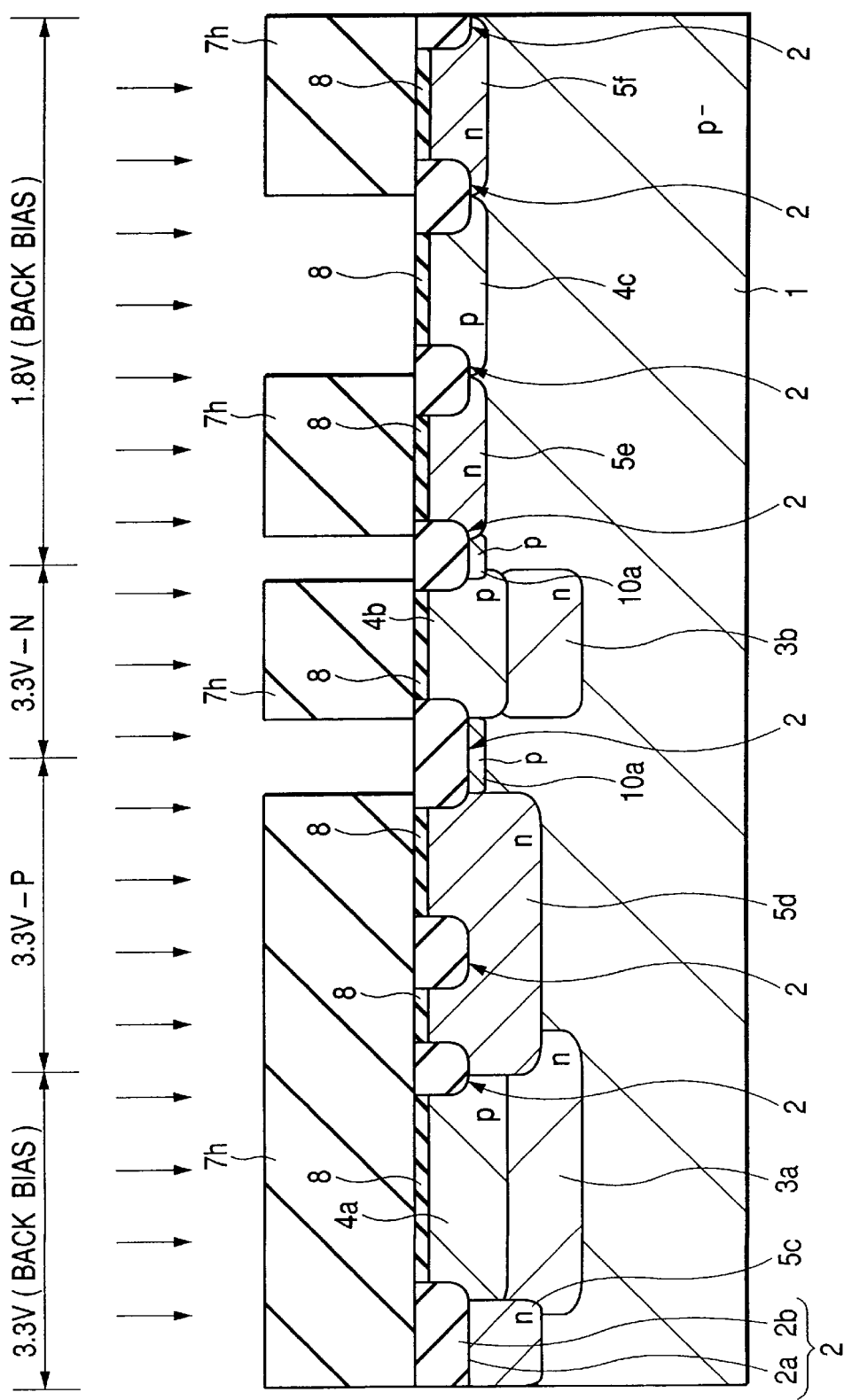
FIG. 20 is a section of essential portions in the semiconductor integrated circuit device manufacturing process subsequent to FIG. 19.

After this, the photoresist pattern 7g shown in FIG. 19 is removed, and a photoresist pattern 7h having a thickness of about 1.5 μm through which exposed are the region where the n-MIS·FET driven by the power supply voltage of 1.8 V, for example is formed, and a predetermined separation region and which covers the other regions is then formed over the major surface of the semiconductor substrate 1, as shown in FIG. 20.

Next, the semiconductor substrate 1 is doped with ions of boron or the like under a condition of an acceleration energy of 200 KeV and a dosage of $1.5\times10^{13}/cm^2$ and a condition of an acceleration energy of 60 KeV and a dosage of $1\times10^{12}/cm^2$ to form the 1.8 V system shallow p-well 4c and a channel stopper 10a by using the photoresist pattern 7h (a fourth mask) as the mask. After this, the semiconductor substrate 1 is doped with ions of boron difluoride ($BF_2$) or the like under a condition of an acceleration energy of 40 KeV and a dosage of $3\times10^{12}/cm^2$.

At this time, in this Embodiment 2, the impurity concentration of the p-well 4c can be set optimum independently. This makes it possible to improve the electric characteristics of the MIS·FET formed in the shallow p-well 4c, such as the threshold voltage and the drain current at all times.

In this Embodiment 2, moreover, the single photoresist pattern 7h is used to form an p-well 4c and a channel stopper layer 10 simultaneously. As a result, the manufacturing cost can be made far lower than that of the case in which they are formed by using separate photoresist patterns. The rate of occurrence of defects due to foreign matters can be reduced to improve the yield and reliability of the CMOS logic circuit.

Figure 21:
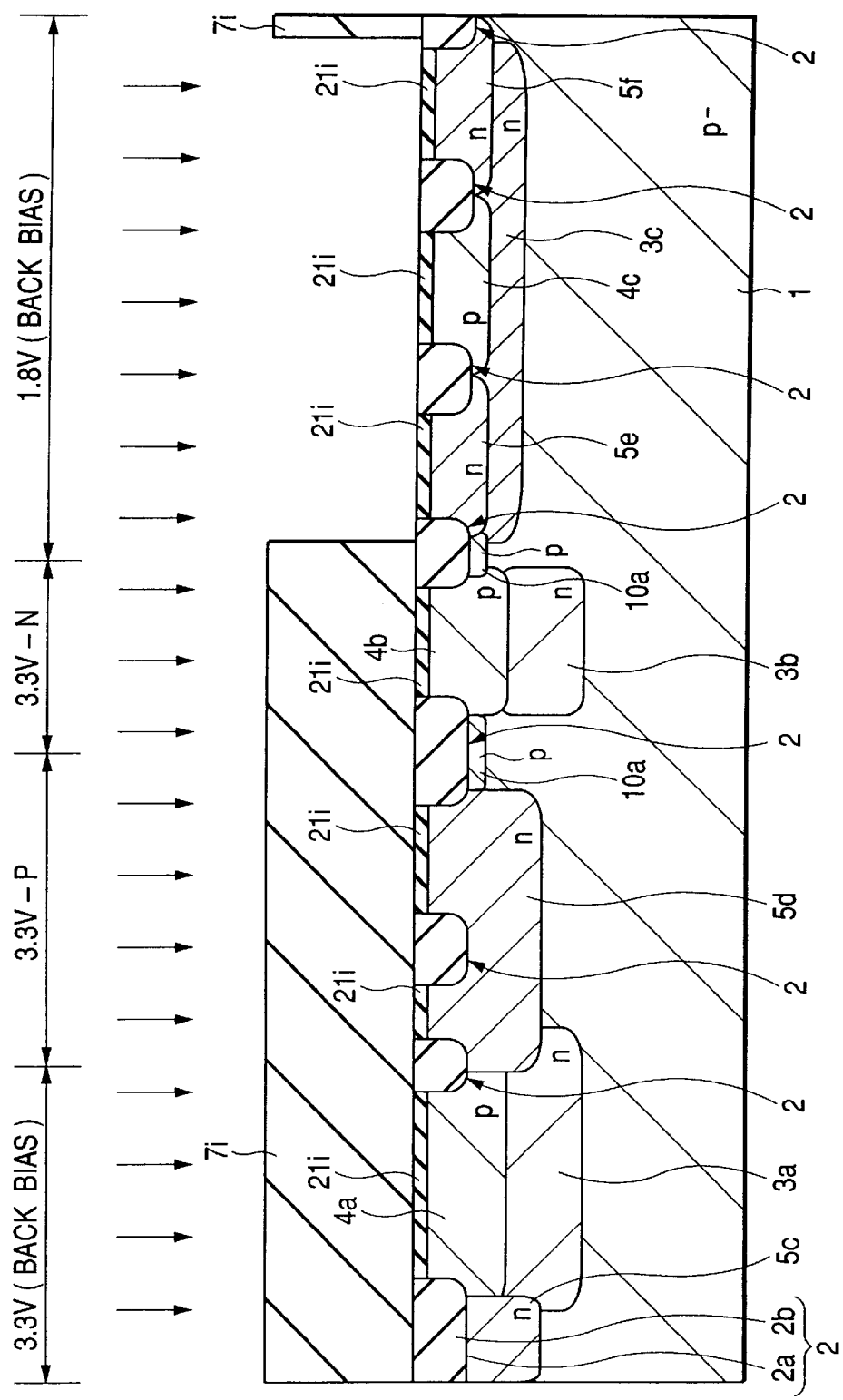
FIG. 21 is a section of essential portions in the semiconductor integrated circuit device manufacturing process subsequent to FIG. 20.

This shallow p-well 4c is encompassed at its side face by the shallow n-wells 5e and 5f formed on the side face. Here, this channel stopper layer 10a is provided to ensure the electric separation between the two shallow n-wells 5d and 5e because of the shallow n-well 5d and the shallow n-well 5e are close to each other in some cases. Subsequently, the photoresist pattern 7h, as shown in FIG. 20, is removed, and the pad film 8 is then removed from the major surface of the semiconductor substrate 1. After this, the semiconductor substrate is thermally oxidized to form a gate insulating film 21i having a thickness of about 8 nm, for example, over the major surface of the semiconductor substrate 1, as shown in FIG. 21. Here, this gate insulating film 21i acts as a gate insulating film of the MIS·FET driven by a power supply voltage of 3.3 V.

After this, there is formed over the major surface of the semiconductor substrate 1 a photoresist pattern (a fifth mask) 7i which has a thickness of about 2.5 $\mu$m through which exposed are the region where the MIS·FET driven by the power supply voltage of 1.8 V is formed and the region for feeding the power to the wells and which covers the other regions. Here, the photoresist pattern 7i is so formed that its open end portion is provided over the separation region 2.

Next, in order to form a 1.8 V system buried n-well 3c, the semiconductor substrate 1 is doped with ions of phosphorus or the like under a condition of an acceleration energy of 1,000 KeV and a dosage of $1 \times 10^{13}/cm^2$ by using the photoresist pattern 7i as the mask.

This buried n-well 3c is so formed just under the shallow n-wells 5e and 5f and the shallow p-well 4c as to extend all over the region where the 1.8 V system MIS·FET is formed. The upper portion of the buried n-well 3c overlaps with the lower portions of the n-wells 5e and 5f and is electrically connected with the shallow n-wells 5e and 5f. As a result, the shallow p-well 4c is encompassed by the shallow n-wells 5e and 5f and the buried n-well 3c, so that it is electrically separated from the semiconductor substrate 1. This makes it possible to feed the shallow p-well 4c with a voltage different from that applied to the semiconductor substrate 1.

Figure 22:
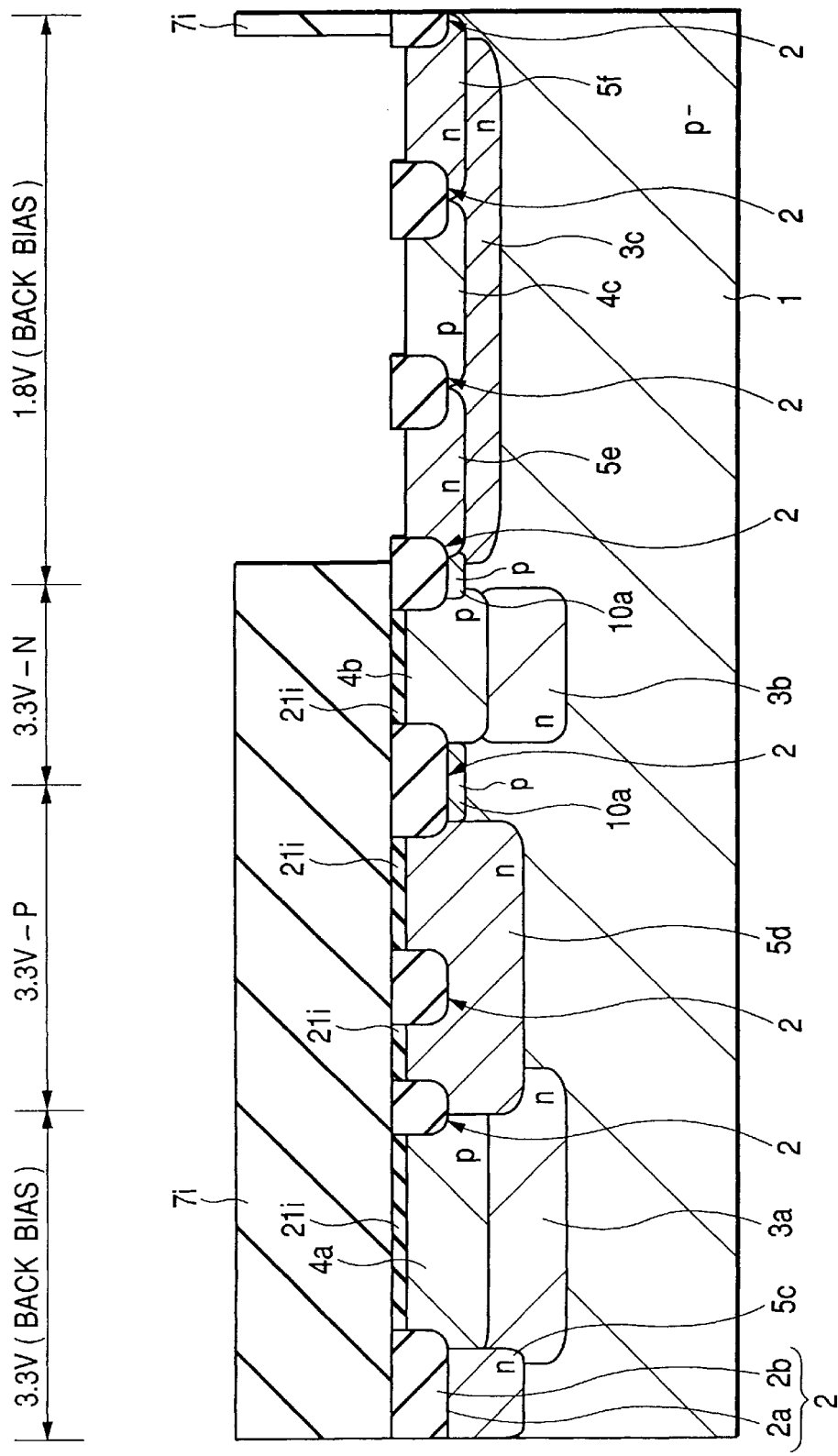
FIG. 22 is a section of essential portions in the semiconductor integrated circuit device manufacturing process subsequent to FIG. 21.

Subsequently, the photoresist pattern 7i used as the mask at the well forming time is used as an etching mask to wet-etch the semiconductor substrate 1 thereby to remove the gate insulating film 21i from the region where the MIS·FET driven by the power supply voltage of 1.8 V is formed, as shown in FIG. 22.

Here, in this Embodiment 2, the gate insulating film 21i is removed by using the photoresist pattern 7i, which has been used for forming the wells, as the etching mask. As a result, the manufacturing cost can be made far lower than that of the case in which separate photoresist patterns are used for those processings. The rate of occurrence of defects due to foreign matters can be reduced to improve the yield and reliability of the semiconductor integrated circuit device.

Figure 23:
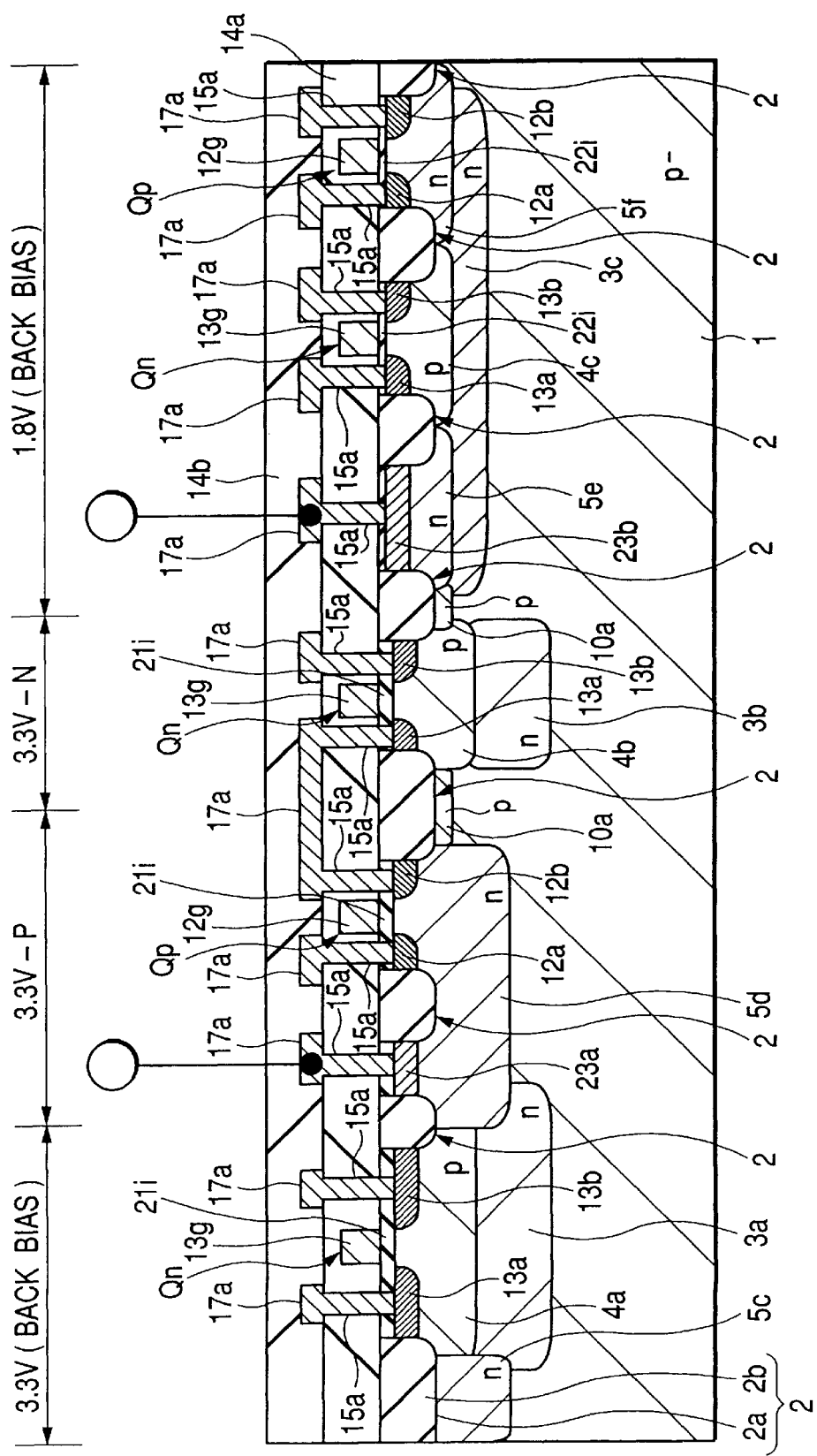
FIG. 23 is a section of essential portions in the semiconductor integrated circuit device manufacturing process subsequent to FIG. 22.

After this, the photoresist pattern 7i is removed, and a gate insulating film 22i of a silicon oxide film or the like is formed in the region where the MIS·FET driven by the power supply voltage of 1.8 V is formed, as shown in FIG. 23. Since the drive voltage is low in this region, however, the gate insulating film 22i has a thickness of about 5 nm, for example, and is thinner than the aforementioned gate insulating film 21i.

Next, a predetermined conductor film is deposited on the semiconductor substrate 1 and is then patterned by a photolithographic technique and a dry etching technique to form gate electrodes 12g and 13g over the gate insulating films 21i and 22i.

Subsequently, semiconductor regions 12a, 12b, 13a and 13b for the sources/drains of the p-MIS·FET Qp and the n-MIS·FET Qn and semiconductor regions 23a and 23b for well power feed are formed by using an ordinary ion implantation method or the like. Here, the well power feeding semiconductor regions 23a and 23b contain phosphorus, for example, at a higher impurity concentrations than those of the shallow n-wells 5d and 5e.

Thus, the p-MIS·FET Qp and the n-MIS·FET Qn are formed. Here, the buried n-well 3b is formed just under the shallow p-well 4b, in which the n-MIS·FET Qn driven by the power supply voltage of 3.3 V is formed, but is electrically connected at its side portion with the semiconductor substrate 1 without being encompassed by the n-type semiconductor region, so that it does not obstruct the potential feed from the semiconductor substrate 1 to the shallow p-well 4b.

Of those MIS·FETS, the p-MIS·FET Qp and the n-MIS·FET Qn driven by the power supply voltage of 3.3 V constitute the circuit in the arrangement region D1 of FIG. 16, and the p-MIS·FET Qp and the n-MIS·FET Qn driven by the power supply voltage of 1.8 V constitute the circuit in the arrangement region D2 of FIG. 16.

After this, an interlayer insulating film 14a of silicon oxide or the like is so formed over the major surface of the semiconductor substrate 1 as to cover the p-MIS·FET Qp and the n-MIS·FET Qn. After this, connection holes 15a from which the major surface of the semiconductor substrate 1 is exposed are formed at predetermined portions of the interlayer insulating film 14a by a photolithography technique and a dry etching technique.

Then, a conductor film of an alloy of aluminum, silicon, and copper, for example, is deposited on the interlayer insulating film 14a and is then patterned to form a first-layer wiring 17a by a photolithography technique and a dry etching technique.

After this, an interlayer insulating film 14b of silicon oxide, for example, is so deposited on the interlayer insulating film 14a as to cover the first-layer wiring 17a, and thus a semiconductor integrated circuit device having a CMOS logic circuit is manufactured through an ordinary wiring step, a surface protective film forming step and so on.

The following effects can be achieved by this Embodiment 2 in addition to the effects of the foregoing Embodiment 1.

(1) A back bias of −1 to −3.3 V is applied exclusively to the 3.3 V system shallow p-well 4a encompassed by the 3.3 V system shallow n-wells 5c and 5d fed with 3.3 V, and a back bias of −0.5 to −1.8 V is applied exclusively to the 1.8 V system shallow p-well 4c encompassed by the 1.8 V system shallow n-wells 5e and 5f fed with 1.8 V, so that the threshold voltage and the off-leak current of the MIS·FET of respective power supply voltages can be satisfactorily controlled. Here, the back bias can be applied in a standby mode to reduce the leakage current. The MIS·FET can operate at a high speed in operation by applying 0 V to the p-wells 4a and 4c, for example.

(2) The gate insulating film 21i is removed by using the photoresist pattern 7i, which has been used for forming the wells, as the etching mask. As a result, the manufacturing cost can be made lower than that of the case in which separate photoresist patterns are used for those treatments.

(3) The gate insulating film 21i is removed by using the photoresist pattern 7i, which has been used for forming the wells, as the etching mask. As a result, the rate of occurrence of defects due to foreign matters can be reduced to improve the yield and reliability of the semiconductor integrated circuit device.

EMBODIMENT 3

Figure 24:
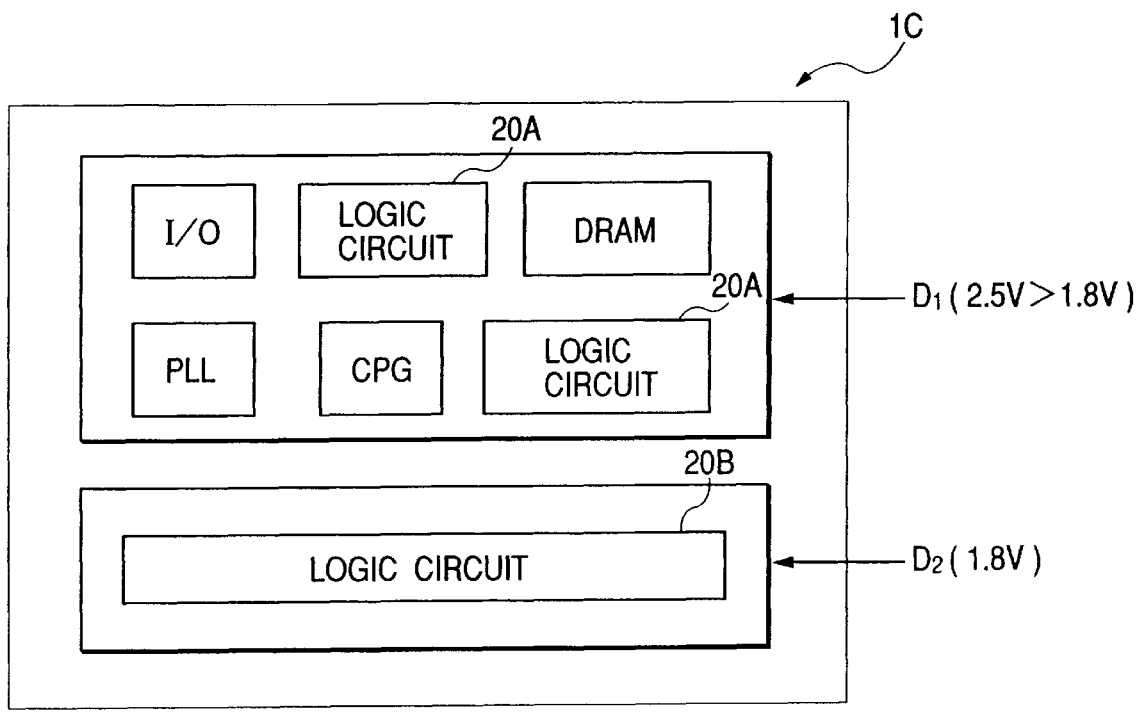
FIG. 24 is a top plan view of a semiconductor chip constituting a semiconductor integrated circuit device of another embodiment of the invention.

FIG. 24 is a top plan view showing a semiconductor chip constituting a semiconductor integrated circuit device of another embodiment of the invention, and FIGS. 25 to 31 are sections showing essential portions in a process for manufacturing the semiconductor integrated circuit device of FIG. 24.

Embodiment 3 will be described taking the case in which the invention is applied to a semiconductor integrated circuit device equipped in a common semiconductor chip with a DRAM of 64 Mbits and a high-speed logic circuit having a gate length of 0.25 μm, for example.

FIG. 24 is a top plan view showing a semiconductor chip 1C of the semiconductor integrated circuit device of Embodiment 3. This semiconductor chip 1C is formed of a small chip of p-type single crystal of silicon formed into a rectangular shape. In a major surface of the semiconductor chip 1C, there are arranged a region D1 having elements arranged driven by a voltage such as a power supply voltage of 2.5 V higher than the power supply voltage of 1.8 V, and a region D2 having elements arranged driven by the power supply voltage of 1.8 V.

In the arrangement region D1, there are arranged an input/output circuit I/O, a plurality of blocks of logic circuits 20A, a DRAM, a phase locked loop circuit PLL, and a clock pulse generator CPG. In the arrangement region D2, there is provided a logic circuit 20E.

Here will be described a process for manufacturing the semiconductor integrated circuit device according to Embodiment 3 with reference to FIGS. 25 to 31.

Figure 25:
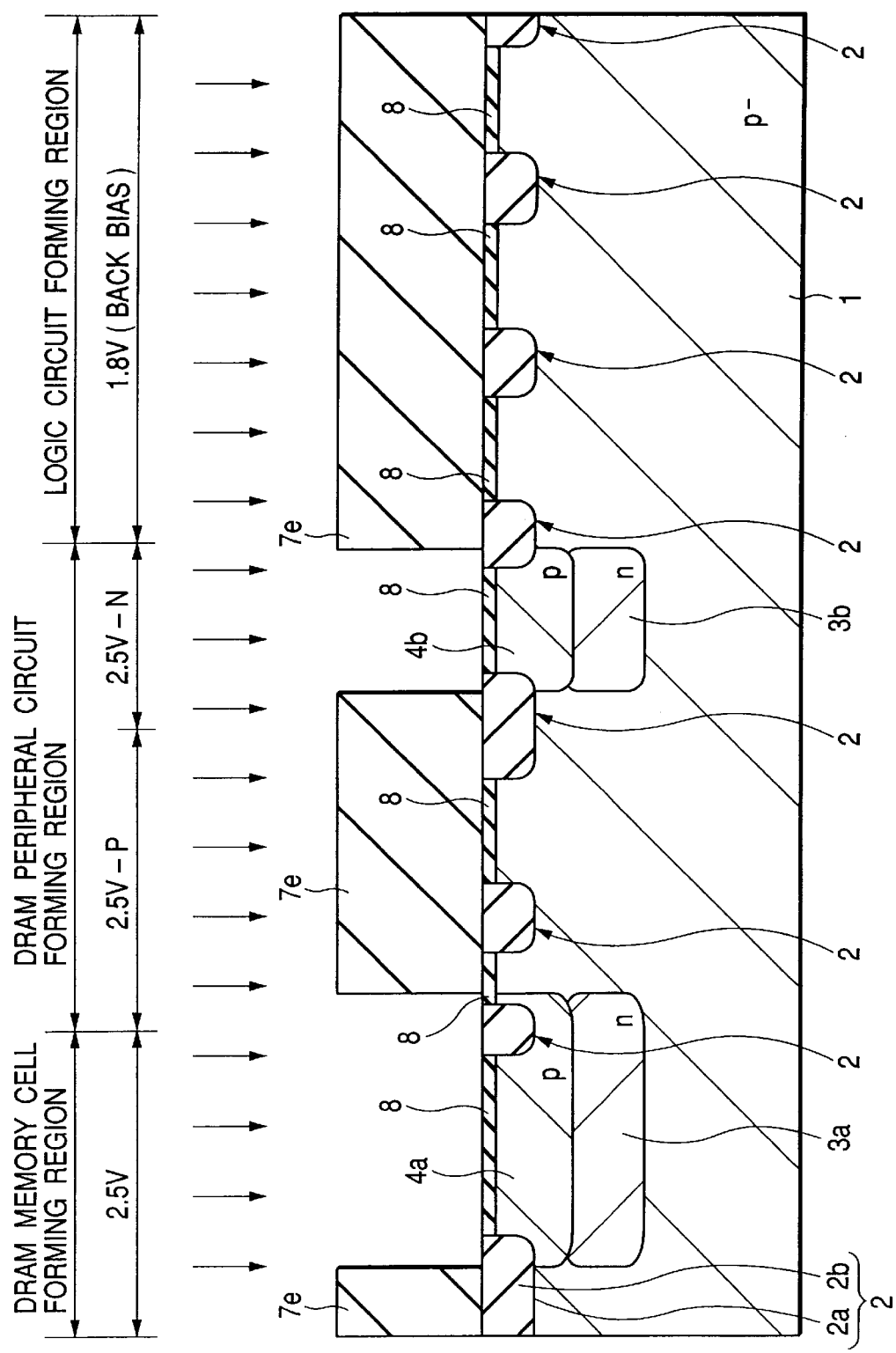
FIG. 25 is a section of essential portions in a process for,manufacturing the semiconductor integrated circuit device of FIG. 24.

First, like the foregoing Embodiments 1 and 2, a pad film 8 is grown on the major surface of a semiconductor substrate 1 by a thermal oxidation method or the like, as shown in FIG. 25, and a separation region 2 is then formed. Subsequently, there is formed over the major surface of the semiconductor substrate 1 a photoresist pattern 7e which has a thickness of about 5 μm through which the region where an n-MIS·FET driven by a power supply voltage of 2.5 V, for example, is formed is exposed and which cover the other regions.

After this, in order to form buried n-wells 3a and 3b, the photoresist pattern 7e is used as the mask to dope the semiconductor substrate 1 at its deep position with ions of phosphorus or the like at the same dosage and implantation energy as those of the foregoing Embodiment 2. At this time, the impurity concentrations of the buried n-wells 3a and 3b can be set optimum.

Next, in order to form shallow p-wells 4a and 4b in a self-alignment manner over the buried n-wells 3a and 3b, the same photoresist pattern 7e is used as the mask to introduce ions of boron at the same dosage and implantation energy as those of the foregoing Embodiment 1.

At this time, in this Embodiment 3, the electric characteristics such as the threshold voltage of the drain current of the MIS·FET formed in the shallow p-wells 4a and 4b can be improved for a reason similar to those of the foregoing Embodiments 1 and 2. Since a plurality of wells are formed like in the Embodiments 1 and 2 by using the photoresist pattern 7e, moreover, it is possible to lower the manufacturing cost drastically and to improve the yield and reliability of the semiconductor integrated circuit device.

Figure 26:
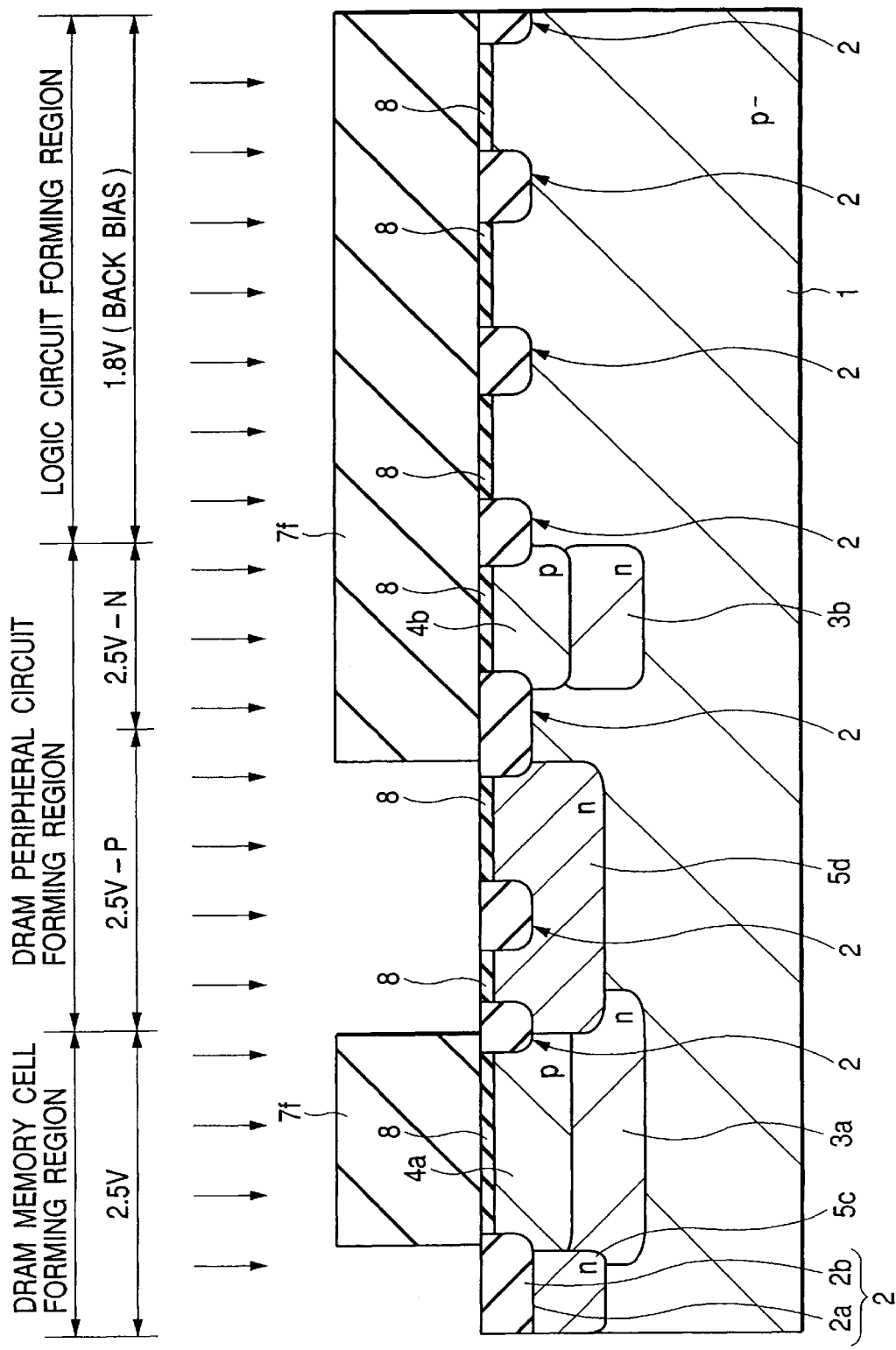
FIG. 26 is a section of essential portions in the semiconductor integrated circuit device manufacturing process subsequent to FIG. 25.

Next, the photoresist pattern 7e shown in FIG. 25 is removed, and a photoresist pattern 7f similar to that of the Embodiment 2 is formed over the major surface of the semiconductor substrate 1, as shown in FIG. 26. In order to form shallow n-wells 5c and 5d, the photoresist pattern 7f is used as the mask to perform ion implantation at the same dosage and implantation energy as those of the Embodiment 2. After this, ion implantation of boron difluoride ($BF_2$) is performed at the same dosage and implantation energy as those of the Embodiment 2. Here, the ion implantation of BF2 is performed to set the threshold voltage of the p-MIS·FET driven by the power supply voltage of 2.5 V. These shallow n-wells 5c and 5d are fed with 2.5 V.

Thus, the semiconductor integrated circuit device, which is equipped in the common semiconductor chip with a DRAM of 64 Mbits and a high-speed logic circuit having a gate length of 0.25 μm, can be produced with a high reliability and at a low cost, thereby giving drastic influence on the semiconductor industry.

Figure 27:
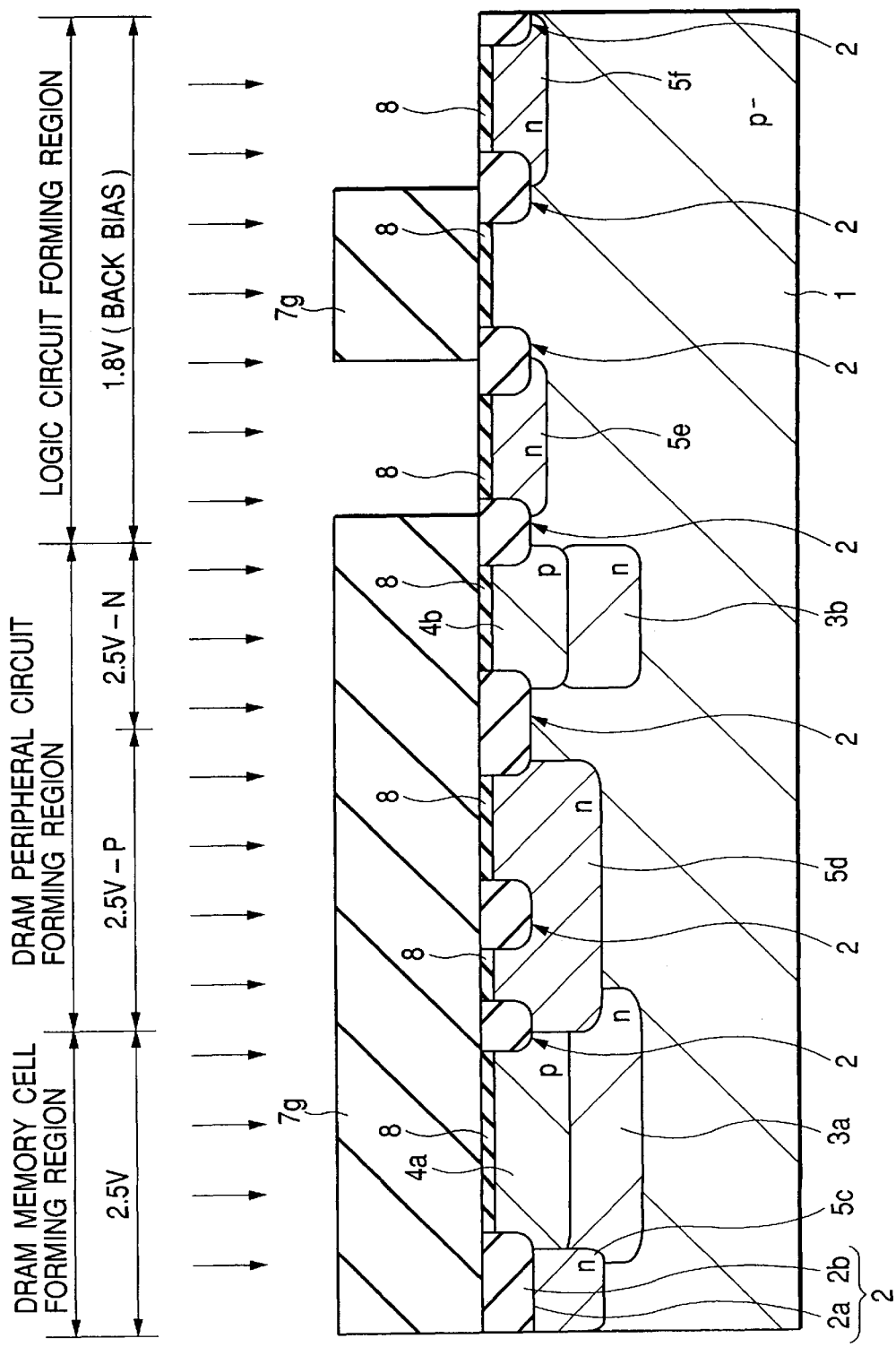
FIG. 27 is a section of essential portions in the semiconductor integrated circuit device manufacturing process subsequent to FIG. 26.

Next, the photoresist pattern 7f shown in FIG. 26 is removed, and a photoresist pattern 7g, as described in connection with the Embodiment 2, is then formed to have a thickness of about 2.5 μm, as shown in FIG. 27.

Subsequently, in order to form shallow n-wells 5e and 5f, the photoresist pattern 7f is used as the mask to perform ion implantation of phosphorus or the like at the same dosage and implantation energy as those of the Embodiment 2. After this, ion implantation of boron difluoride ($BF_2$) or the like is performed at the same dosage and implantation energy as those of the Embodiment 2. As a result, the electric characteristics such as the threshold voltage and the drain current of the MIS·FET formed in the shallow n-wells 5e and 5f can be optimized at all times as in the Embodiment 2.

Figure 28:
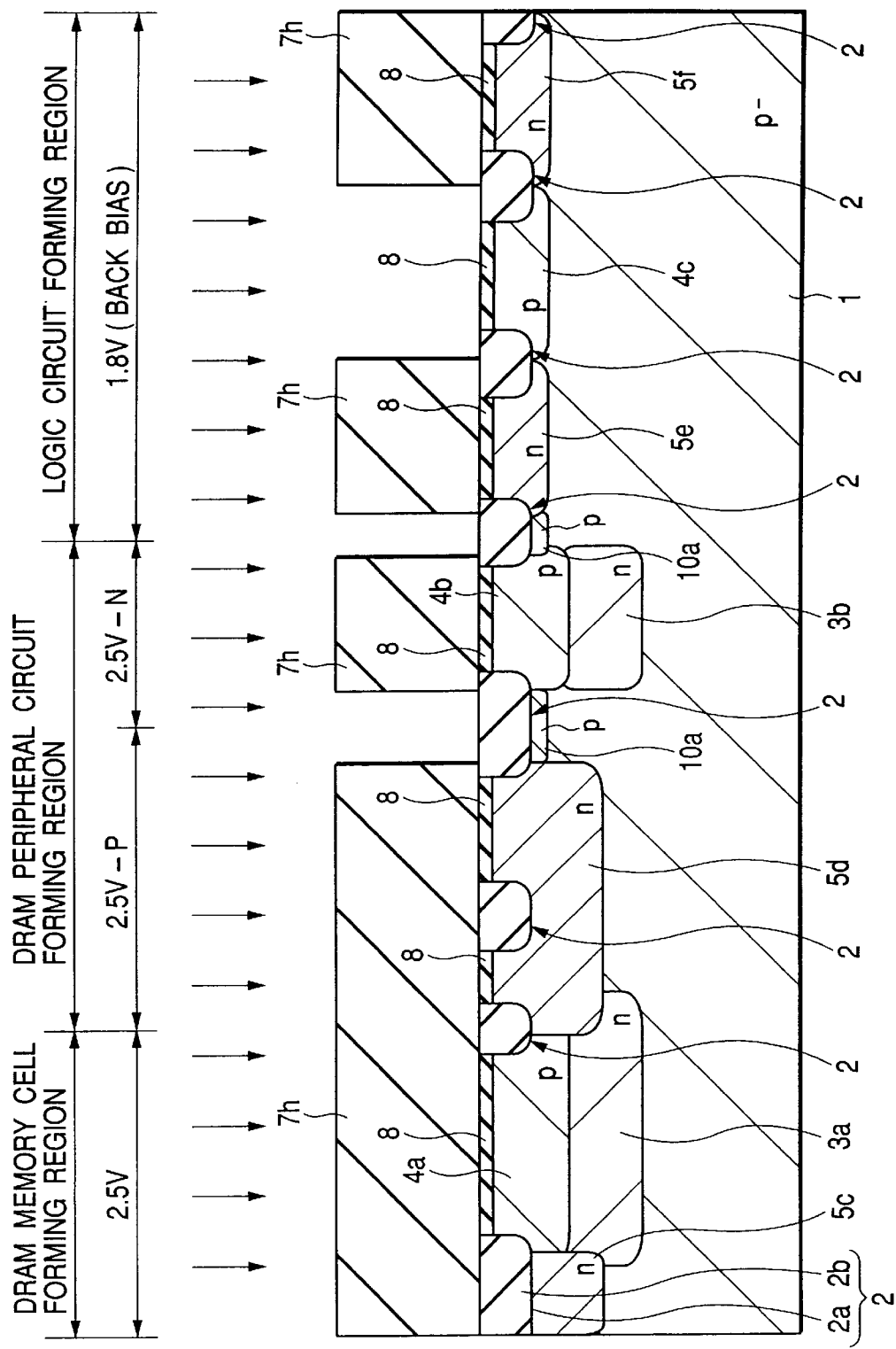
FIG. 28 is a section of essential portions in the semiconductor integrated circuit device manufacturing process subsequent to FIG. 27.

After this, the photoresist pattern 7g shown in FIG. 27 is removed, and a photoresist pattern 7h is then formed to have a thickness of about 2.5 μm, as shown in FIG. 28, as in the Embodiment 2.

Next, in order to form a channel stopper region 10a and the shallow well 4c, the photoresist pattern 7h is used as the mask to perform ion implantation of boron or the like as in the Embodiment 2. After this, ion implantation of boron difluoride ($BF_2$) or the like is performed at the same dosage and implantation energy as those of the Embodiment 2.

At this time, in this Embodiment 3, the electric characteristics such as the threshold voltage and the drain current of the MIS·FET formed in the region of the shallow p-well 4c can be optimized at all times for the same reasons as those of Embodiment 2. Since the n-well 4c and the channel stopper layer 10a are simultaneously formed by using the single photoresist pattern 7h, moreover, it is possible to reduce the manufacturing cost drastically and to improve the yield and reliability of the semiconductor integrated circuit device.

Figure 29:
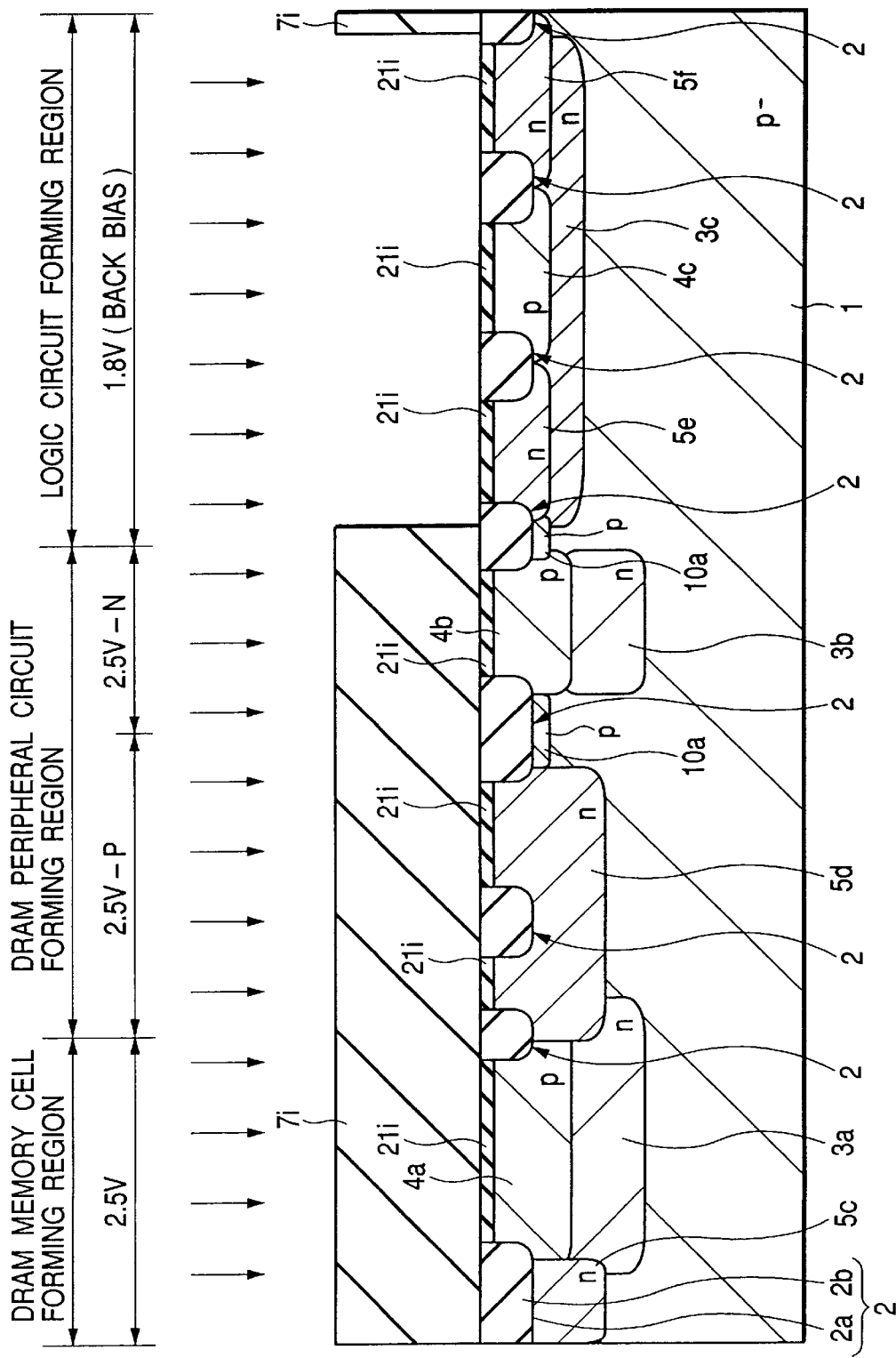
FIG. 29 is a section of essential portions in the semiconductor integrated circuit device manufacturing process subsequent to FIG. 28.

Subsequently, the photoresist pattern 7h shown in FIG. 28 is removed, and the pad film 8 is then removed as in the foregoing Embodiment 2. The semiconductor substrate is thermally oxidized to form a gate insulating film 21i having a thickness of about 7 nm is formed over the major surface of the semiconductor substrate 1, as shown in FIG. 29. Here, this gate insulating film 21i is a gate insulating film of the MIS·FET driven by the power supply voltage of 2.5 V.

After this, a photoresist pattern 7i similar to that of the Embodiment 2 is formed over the major surface of the semiconductor substrate 1. After this, in order to form a buried well 3c, the photoresist pattern 7i is used as the mask to perform ion implantation of phosphorus or the like at the same dosage and implantation energy as those of the Embodiment 2.

Figure 30:
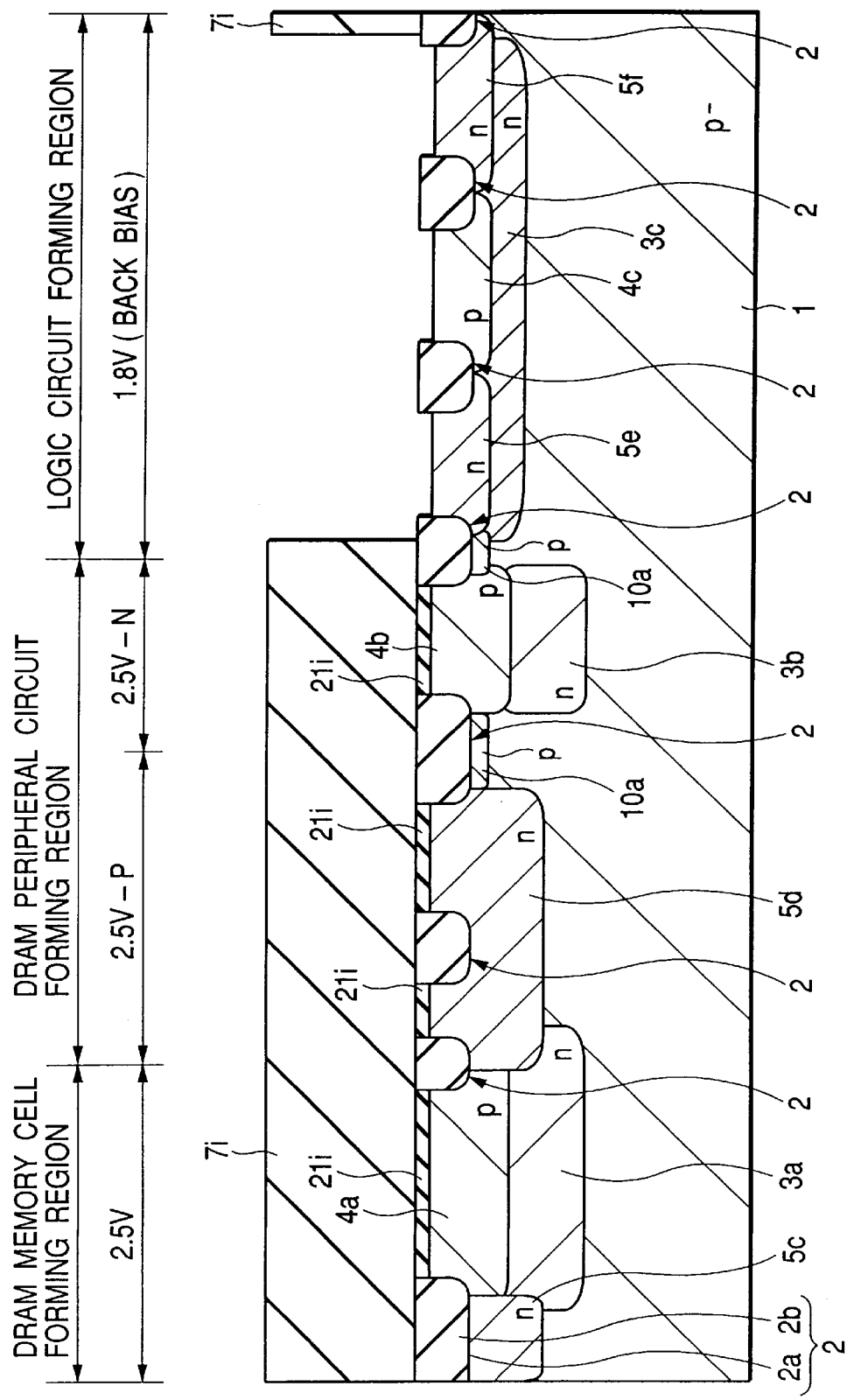
FIG. 30 is a section of essential portions in the semiconductor integrated circuit device manufacturing process subsequent to FIG. 29.

Subsequently, as in the Embodiment 2, a wet-etching treatment is performed by using the photoresist pattern 7i as the etching mask to remove the gate insulating film 21i of the region where the MIS·FET driven by the power supply voltage of 1.8 V is formed, as shown in FIG. 30. In this Embodiment 3, therefore, it is possible to reduce the manufacturing cost drastically and to improve the yield and reliability of the semiconductor integrated circuit device.

Figure 31:
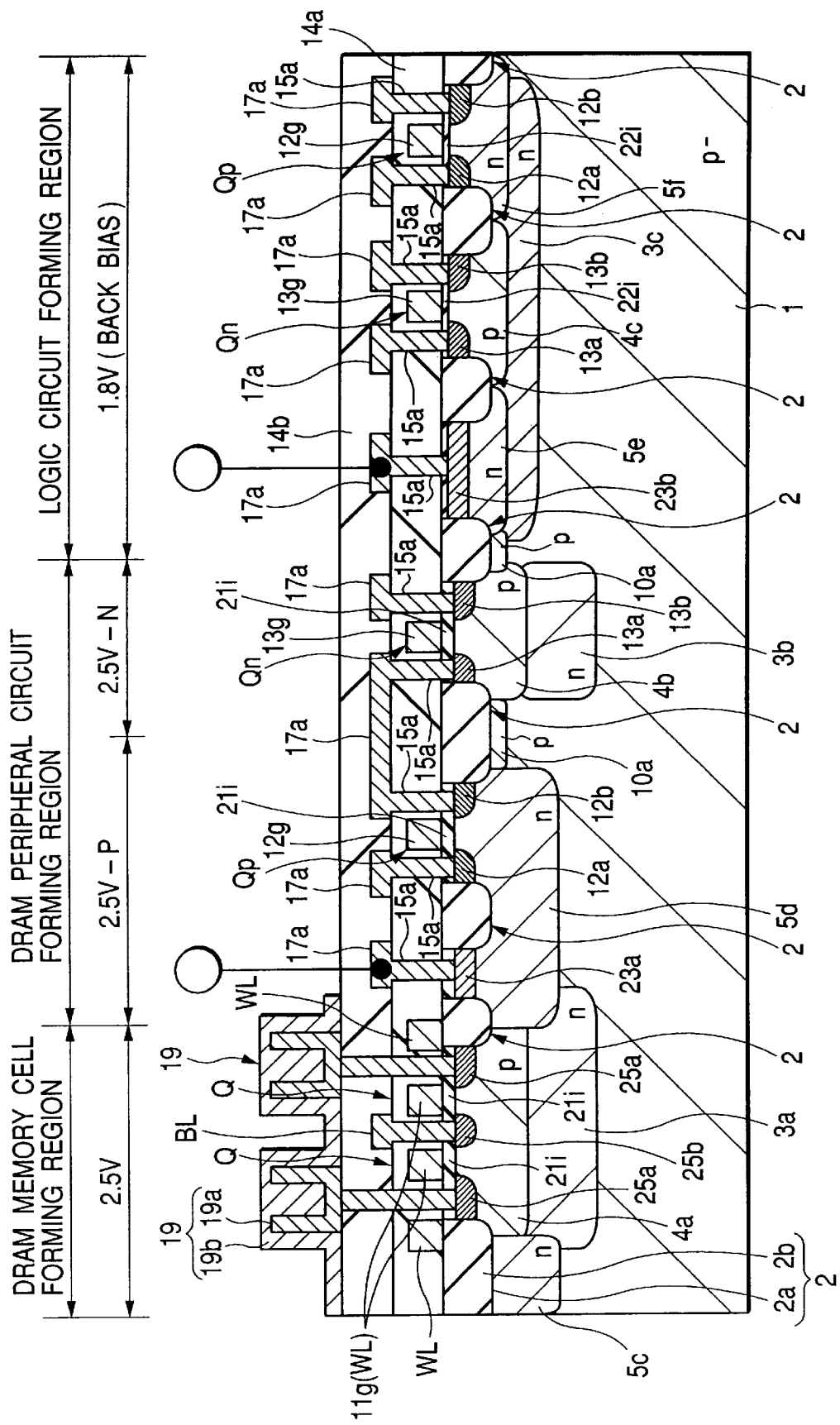
FIG. 31 is a section of essential portions in the semiconductor integrated circuit device manufacturing process subsequent to FIG. 30.

After this, the photoresist pattern 7i is removed, and a thin gate insulating film 22i having a thickness of about 5 nm and made of silicon oxide or the like is formed in the region where the MIS·FET driven by the power supply voltage of 1.8 V is formed, as shown in FIG. 31. After this, gate electrodes 12g and 13g are formed over the gate insulating films 21i and 22i as in the Embodiment 3.

Subsequently, semiconductor regions 11a, 11b, 12a, 12b, 13a and 13b for the sources/drains of the p-MIS·FET Qp and n-MIS·FET Qn and the semiconductor regions 23a and 23b for the well power feed are formed by an ordinary ion implantation method or the like thereby to form a memory cell selecting MIS·FET Q, a p-MIS·FET Qp and an n-MIS·FET Qn.

Here, the buried n-well 3b is formed just under the shallow p-well 4b, in which the n-MIS·FET Qn driven by the power supply voltage of 2.5 V is formed, but is electrically connected at its side portion with the semiconductor substrate 1 without being encompassed by the n-type semiconductor region, so that it does not obstruct the potential feed from the semiconductor substrate 1 to the shallow p-well 4b.

Of those MIS·FETs, the memory cell selecting MIS·FET Q, the p-MIS·FET Qp and the n-MIS·FET Qn driven by the power supply voltage of 2.5 V constitute the circuit in the arrangement region D1 of FIG. 24, and the p-MIS·FET Qp and the n-MIS·FET Qn driven by the power supply voltage of 1.8 V constitute the circuit in the arrangement region D2 of FIG. 24.

In the later processing, the same processing steps as those of the foregoing Embodiment 1 are executed to manufacture the semiconductor integrated circuit device.

The following effects can be achieved by this Embodiment 3 in addition to the effects of the foregoing Embodiment 1.

(1) A back bias of −1 to −3.3 V is applied exclusively to the 2.5 V system shallow p-well 4a encompassed by the 2.5 V system shallow n-wells 5c and 5d fed with 2.5 V, and a back bias of −0.5 to −1.8 V is applied exclusively to the 1.8 V system shallow p-well 4c encompassed by the 1.8 V system shallow n-wells 5e and 5f fed with 1.8 V, so that the threshold voltage and the off-leak current of the MIS·FET of respective power supply voltages can be satisfactorily controlled. Moreover, the ON current of the memory cells of the DRAM takes on absolutely the same value as that of the case in which they are formed in the ordinary 2.5 V system p-well. Here, the back bias can be applied in a standby mode to reduce the leakage current. The MIS·FET can operate at a high speed in operation by applying 0 V, for example.

(2) The gate insulating film 21i is removed by using the photoresist pattern 7i, which has been used for forming the wells, as the etching mask. As a result, the manufacturing cost can be made lower than that of the case in which separate photoresist patterns are used for those processings.

(3) The gate insulating film 21i is removed by using the photoresist pattern 7i, which has been used for forming the wells, as the etching mask. As a result, the rate of occurrence of defects due to foreign matters can be reduced to improve the yield and reliability of the semiconductor integrated circuit device.

EMBODIMENT 4

Figure 32:
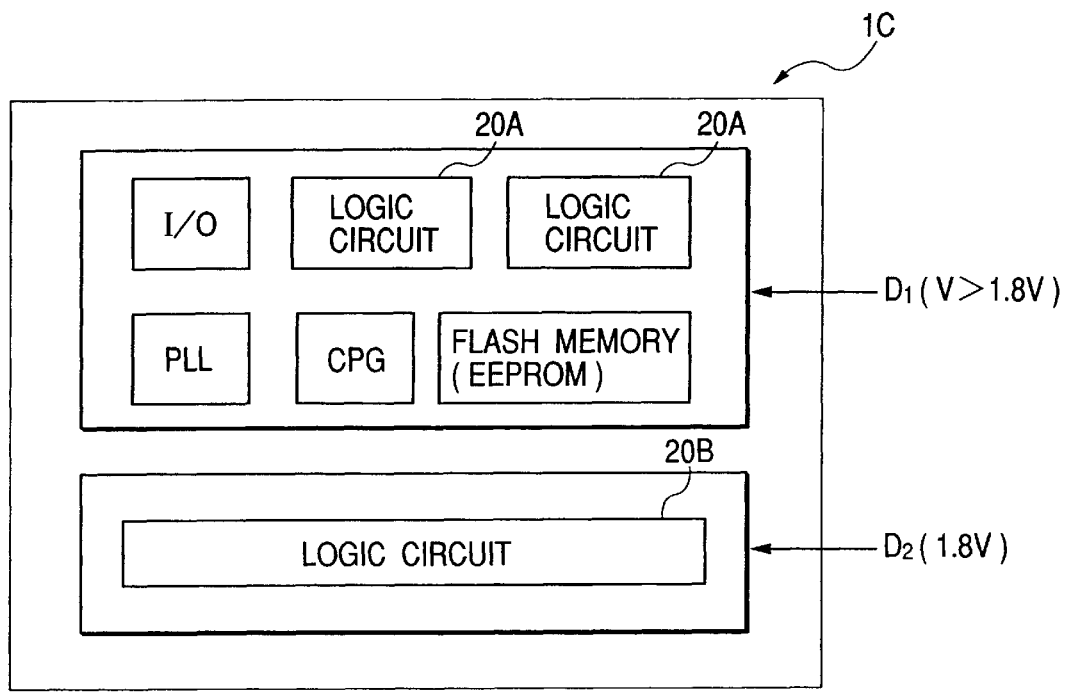
FIG. 32 is a top plan view showing a semiconductor chip constituting a semiconductor integrated circuit device of another embodiment of the invention.

FIG. 32 is a top plan view showing a semiconductor chip constructing a semiconductor integrated circuit device of another embodiment of the invention; FIGS. 33 to 39 are sections showing essential portions in a process for manufacturing the semiconductor integrated circuit device of FIG. 32; and FIG. 40 is a circuit diagram of a memory cell in a flash memory (EEPROM).

Embodiment 4 will be described taking the case in which the invention is applied to a semiconductor integrated circuit device equipped in a common semiconductor chip with a flash memory (EEPROM) of 8 Mbits and a high-speed logic circuit having a gate length of 0.25 μm, for example.

FIG. 32 is a top plan view showing a semiconductor chip 1C of a semiconductor integrated circuit device of Embodiment 4. This semiconductor chip 1C is formed of a small chip of p-type single crystal of silicon formed into a rectangular shape. In a major surface of the semiconductor chip 1C, there are arranged a region D1 having elements arranged driven by a voltage higher than the power supply voltage of 1.8 V, and a region D2 having elements arranged driven by the power supply voltage of 1.8 V.

In the arrangement region D1, there are arranged an input/output circuit I/O, a plurality of blocks of logic circuits 20A, a flash memory (EEPROM), a phase locked loop circuit PLL, and a clock pulse generator CPG. In the arrangement region D2, there is provided a logic circuit 20E.

Here will be described a process for manufacturing the semiconductor integrated circuit device of Embodiment 3 with reference to FIGS. 33 to 40.

Figure 33:
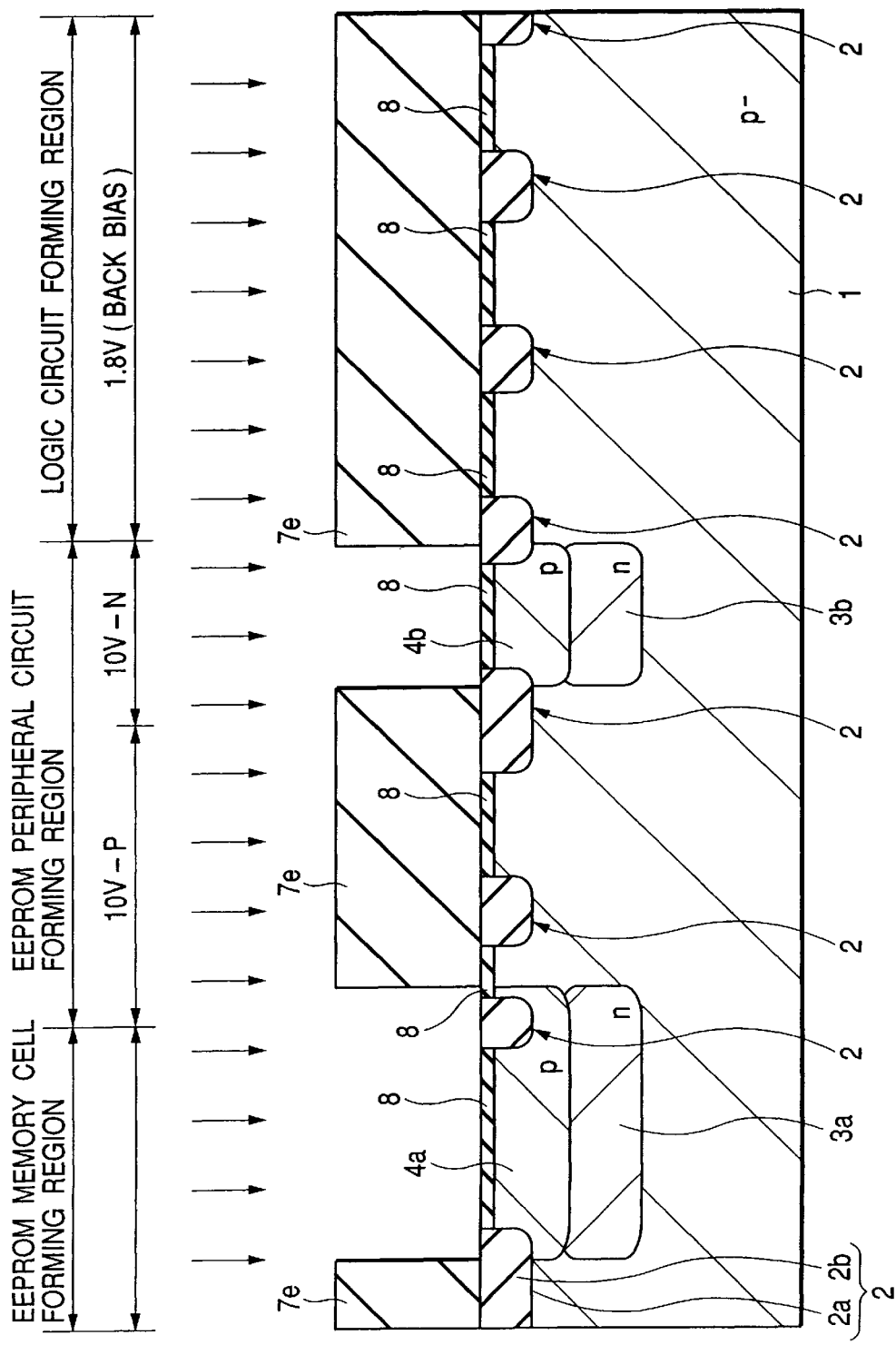
FIG. 33 is a section of essential portions in a process for manufacturing the semiconductor integrated circuit device of FIG. 32.

First, like the foregoing Embodiments 1, 2 and 3, the pad film 8 is grown on a major surface of a semiconductor substrate 1 by a thermal oxidation method or the like, as shown in FIG. 33, and the separation region 2 is then formed. Subsequently, there is formed over the major surface of the semiconductor substrate 1 a photoresist pattern 7e which has a thickness of about 5 μm through which memory cell forming region and a region where the n-MIS·FET driven by a power supply voltage of 10 V, for example, is formed are exposed and which covers the other regions.

After this, in order to form buried n-wells 3a and 3b of high breakdown voltage system, a photoresist pattern 7e is used as the mask to dope the semiconductor substrate 1 at its deep position with ions of phosphorus or the like at the same dosage and implantation energy as those of the foregoing Embodiments 2 and 3. At this time, the impurity concentrations of the buried n-wells 3a and 3b can be set optimum.

Next, in order to form shallow p-wells 4a and 4b of high breakdown voltage system in a self-alignment manner over the buried n-wells 3a and 3b, the same photoresist pattern 7e is used as the mask to introduce ions of boron at the s am e dosage and implantation energy as those of the foregoing Embodiments 2 and 3.

At this time, in this Embodiment 4, the impurity concentrations of the shallow p-wells 4a and 4b of high breakdown voltage system can be set optimum independently of the buried n-wells 3a and 3b of high breakdown voltage system. As a result, the electric characteristics such as the threshold voltage of the drain current of the MIS·FET formed in the shallow p-wells 4a and 4b of high breakdown voltage system can be improved for a reasons similar to those of the foregoing Embodiments 1 and 2. Since the buried n-wells 3a and 3b and the shallow p-wells 4a and 4b are formed by using the photoresist pattern 7e, moreover, it is possible to lower the manufacturing cost drastically and to improve the yield and reliability of the semiconductor integrated circuit device.

Figure 34:
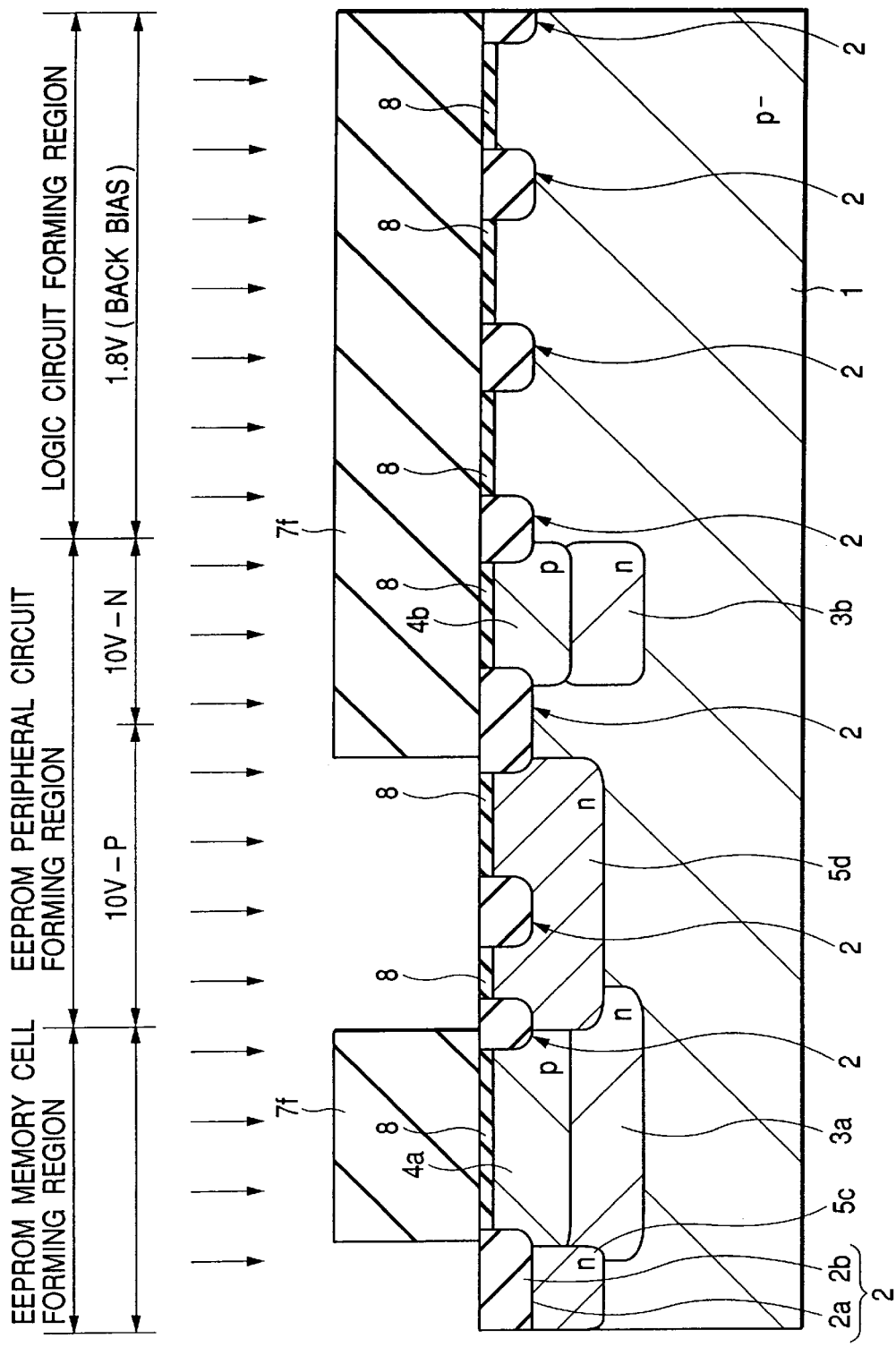
FIG. 34 is a section of essential portions in the semiconductor integrated circuit device manufacturing process subsequent to FIG. 33.

Next, the photoresist pattern 7e shown in FIG. 33 is removed, and a photoresist pattern 7f having a thickness of about 4 μm through which exposed is the outer peripheral region of the region where an n-MIS·FET driven by a power supply voltage of 10 V, for example, is formed and which covers the other regions, is formed over the major surface of the semiconductor substrate 1, as shown in FIG. 34.

Subsequently, in order to form shallow n-wells 5c and 5d of high breakdown voltage system over the semiconductor substrate 1, the photoresist pattern 7f is used as the mask to perform ion implantation of phosphorus or the like at the same dosage and implantation energy as those of the Embodiments 2 and 3. After this, ion implantation of boron difluoride ($BF_2$) is performed at the same dosage and implantation energy as those of the Embodiments 2 and 3. Here, ion implantation of $BF_2$ is performed to set the threshold voltage of the p-MIS·FET driven by the power supply voltage of 10 V.

In this Embodiment 4, too, the electric characteristics such as the threshold voltage or the drain current of the MIS·FETs formed in the regions of the shallow p-wells 4a and 4b and the shallow n-wells 5a and 5b can be optimized at all times for reasons similar to those of the foregoing Embodiments 2 and 3.

Since the buried n-wells 3a and 3b, the shallow p-wells 4a and 4b and the shallow n-wells 5c and 5d can be formed exclusively with the two photoresist patterns 7e and 7f, moreover, the number of steps of forming the photoresist pattern can be reduced. This makes it possible to lower the cost for manufacturing the semiconductor integrated circuit device and to improve the yield of the semiconductor integrated circuit device.

In this Embodiment 4, too, the breakdown voltage of the shallow well 5a can be ensured for the same reasons as those of the foregoing Embodiments 2 and 3 thereby to ensure the ability of electrically separating the shallow well 4a from the semiconductor substrate 1 in the well separation region.

Figure 35:
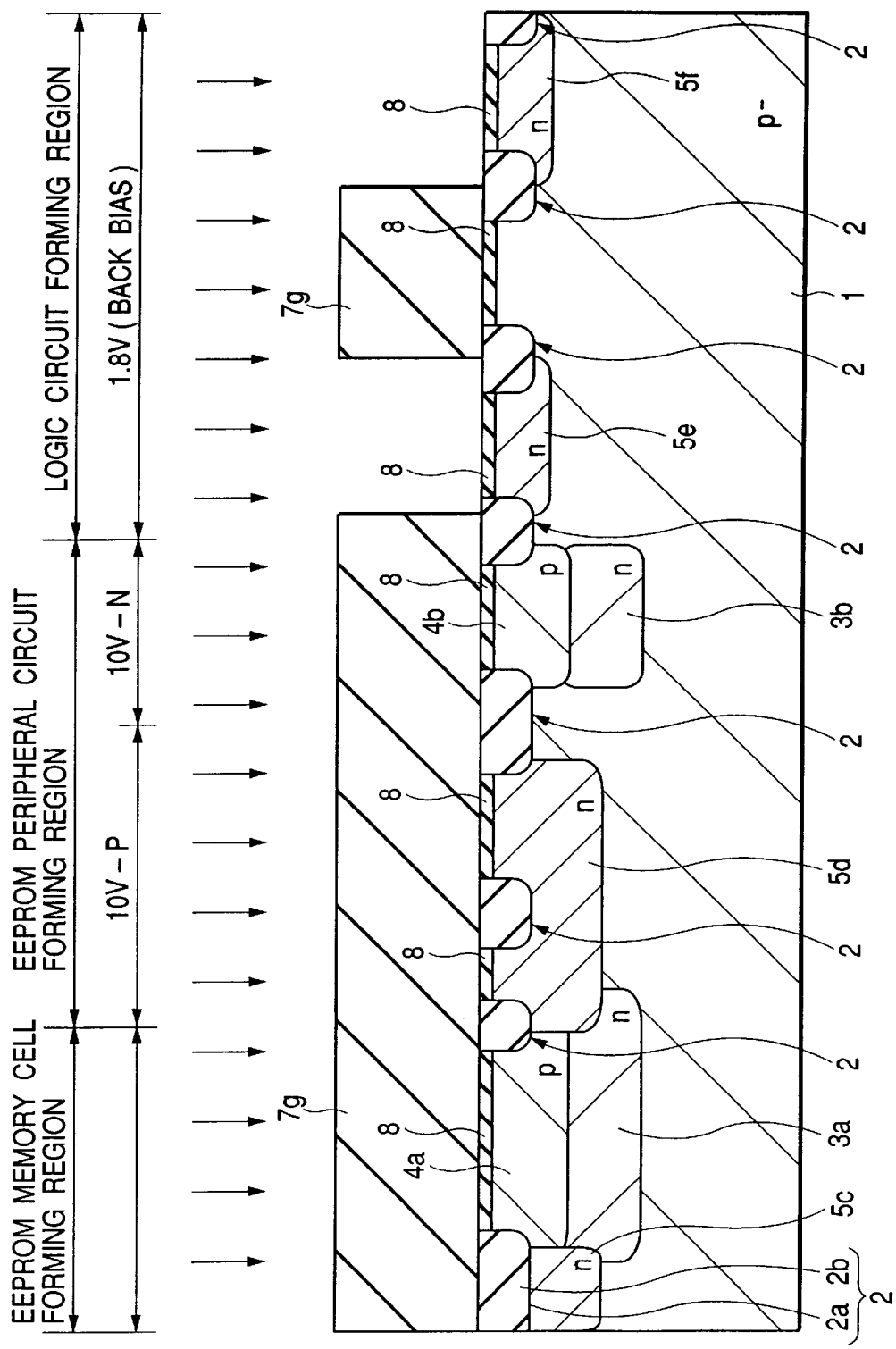
FIG. 35 is a section of essential portions in the semiconductor integrated circuit device manufacturing process subsequent to FIG. 33.

Next, the photoresist pattern 7f shown in FIG. 34 is removed, and a photoresist pattern 7g similar to that of the Embodiment 2 is formed over the major surface of the semiconductor substrate 1, as shown in FIG. 35. Subsequently, in order to form 1.8 V system shallow n-wells 5e and 5f fed with 1.8 V in the semiconductor substrate 1, the photoresist pattern 7g is used as the mask to perform ion implantation of phosphorus or the like at the same dosage and implantation energy as those of the Embodiments 2 and 3. After this, ion implantation of boron difluoride ($BF_2$), for example, is performed at the same dosage and implantation energy as those of the Embodiments 2 and 3.

Figure 36:
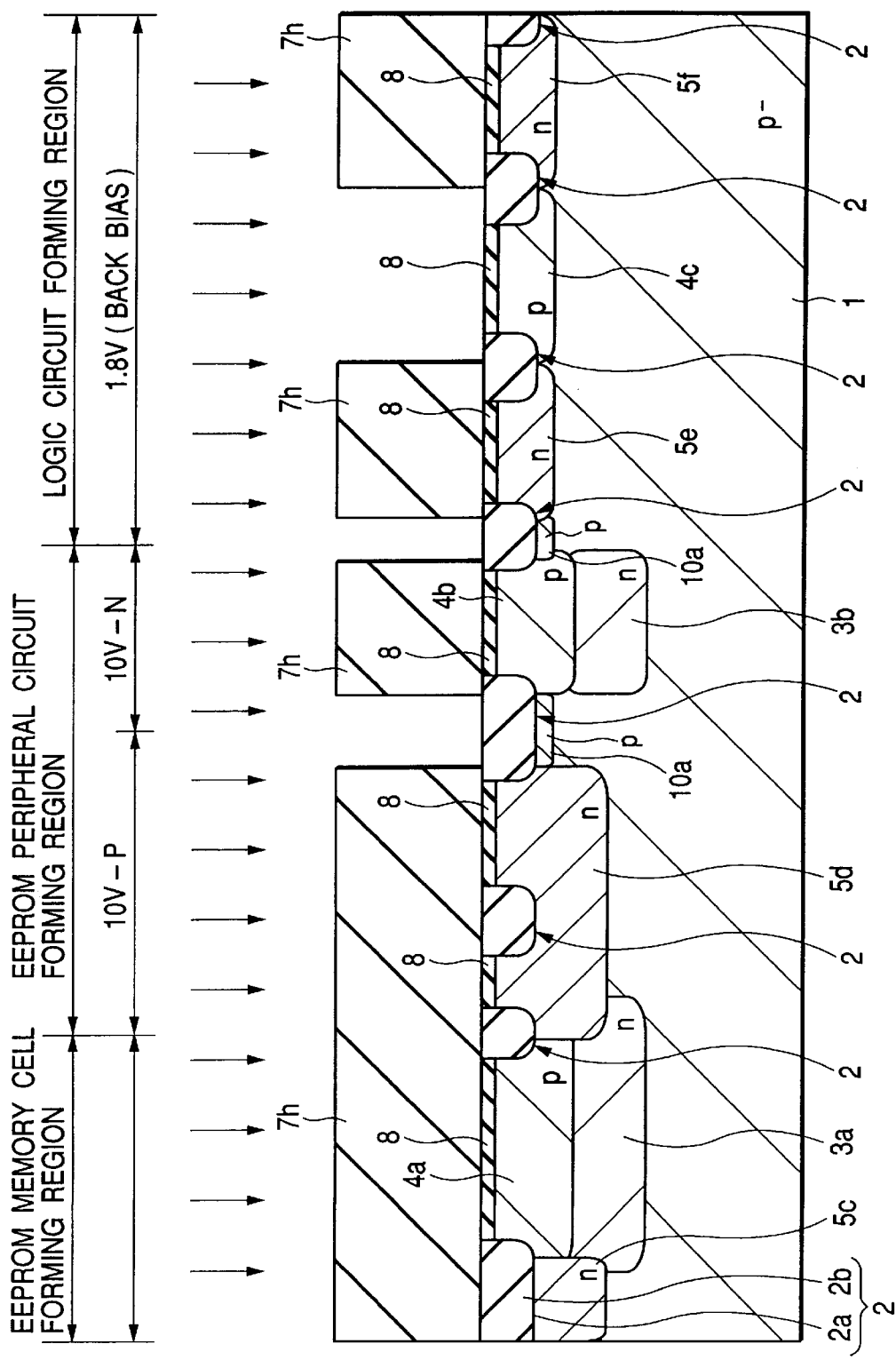
FIG. 36 is a section of essential portions in the semiconductor integrated circuit device manufacturing process subsequent to FIG. 33.

After this, the photoresist pattern 7g shown in FIG. 35 is removed, and a photoresist pattern 7h similar to that of the Embodiment 2 is formed over the major surface of the semiconductor substrate 1, as shown in FIG. 36. Subsequently, in order to form a channel stopper region 10a and a shallow n-well 4c, the photoresist pattern 7h is used as the mask to perform ion implantation of boron or the like at the same dosage and implantation energy as those of the Embodiments 2 and 3. After this, ion implantation of boron difluoride ($BF_2$), for example, is performed at the same dosage and implantation energy as those of the Embodiments 2 and 3.

Figure 37:
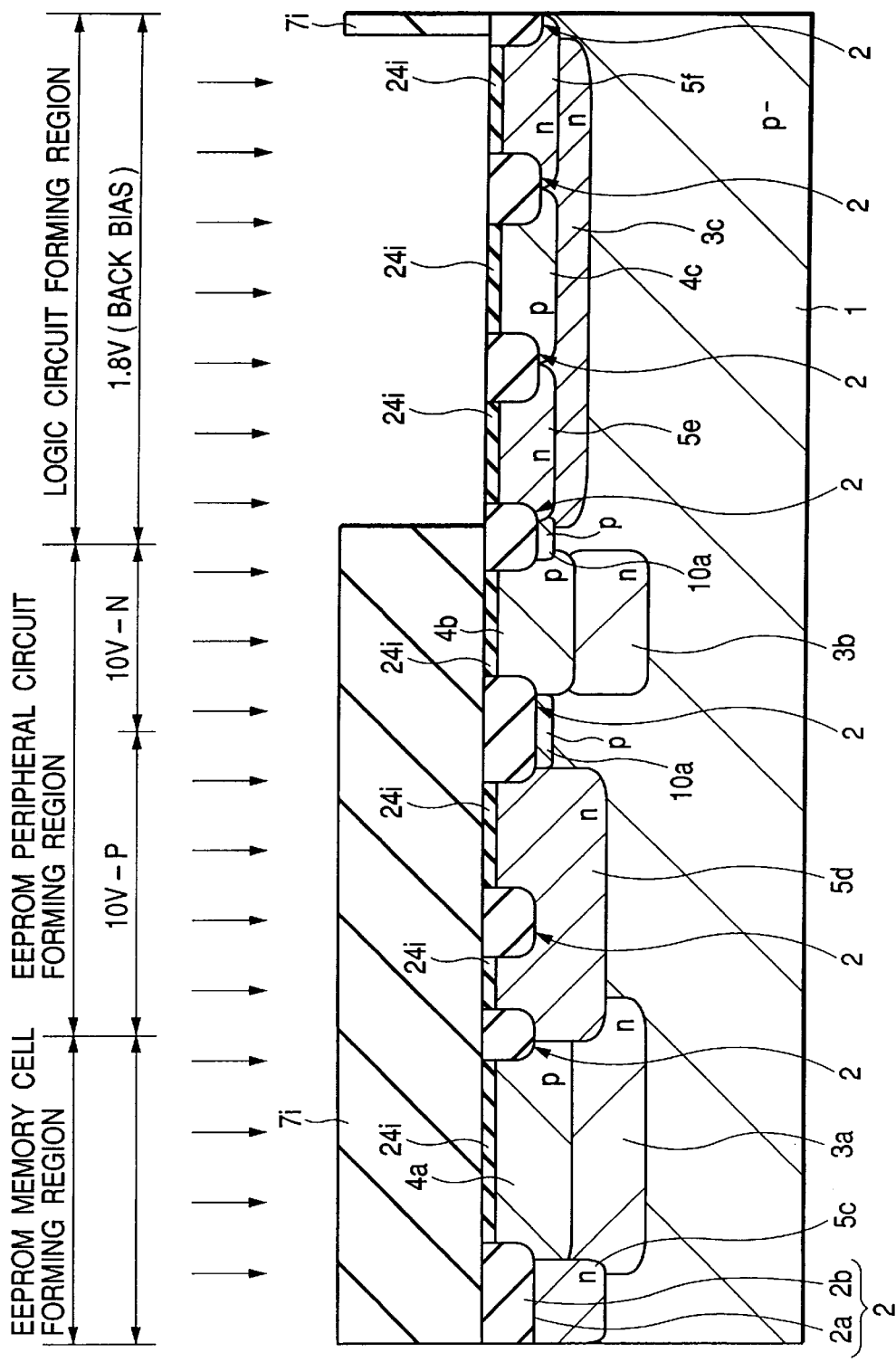
FIG. 37 is a section of essential portions in the semiconductor integrated circuit device manufacturing process subsequent to FIG. 33.

Subsequently, the photoresist pattern 7h shown in FIG. 36 is removed. After this, the pad film 8 is removed from the major surface of the semiconductor substrate 1, and this semiconductor substrate 1 is thermally oxidized to form a gate insulating film 24i having a thickness of about 20 nm, for example, over the major surface of the semiconductor substrate 1, as shown in FIG. 37. Here, this gate insulating film 24i is a gate insulating film of a MIS·FET of high breakdown voltage system driven by the power supply voltage of 10 V.

After this, a photoresist pattern 7i similar to that of the foregoing Embodiment 2 is formed over the major surface of the semiconductor substrate 1. After this, in order to form a buried well 3c, ion implantation of phosphorus or the like is performed at the same dosage and implantation energy as those of the Embodiments 2 and 3.

Figure 38:
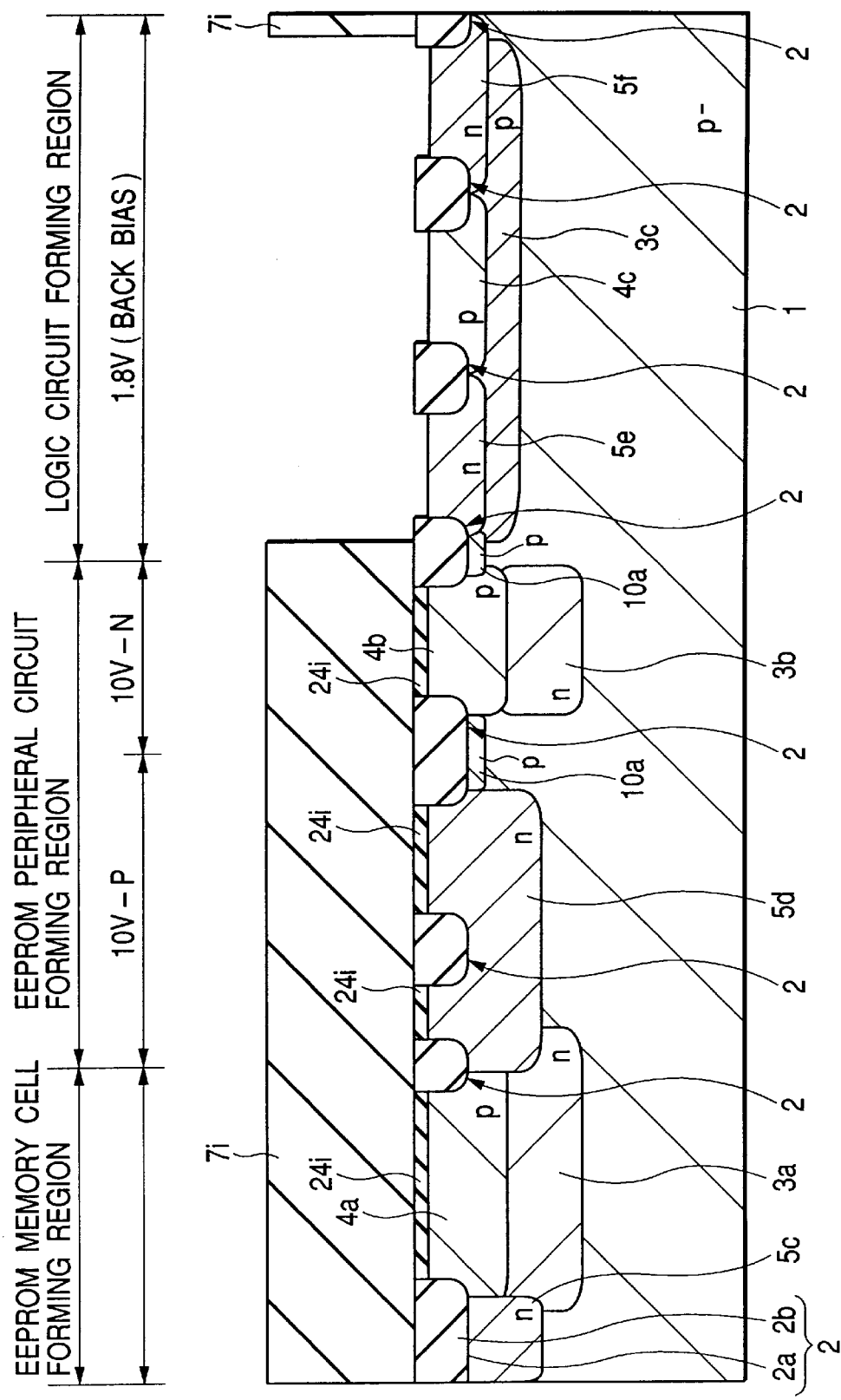
FIG. 38 is a section of essential portions in the semiconductor integrated circuit device manufacturing process subsequent to FIG. 33.

Subsequently, the semiconductor substrate 1 is subjected to a wet-etching treatment by using the photoresist pattern 7i, used as the mask at the well forming time, to remove the gate insulating film 24i from the region where the MIS·FET driven at the power supply voltage of 1.8 V, as shown in FIG. 38. In this Embodiment 4, therefore, it is also possible to reduce the manufacturing cost drastically and to improve the yield and reliability of the semiconductor integrated circuit device.

Figure 39:
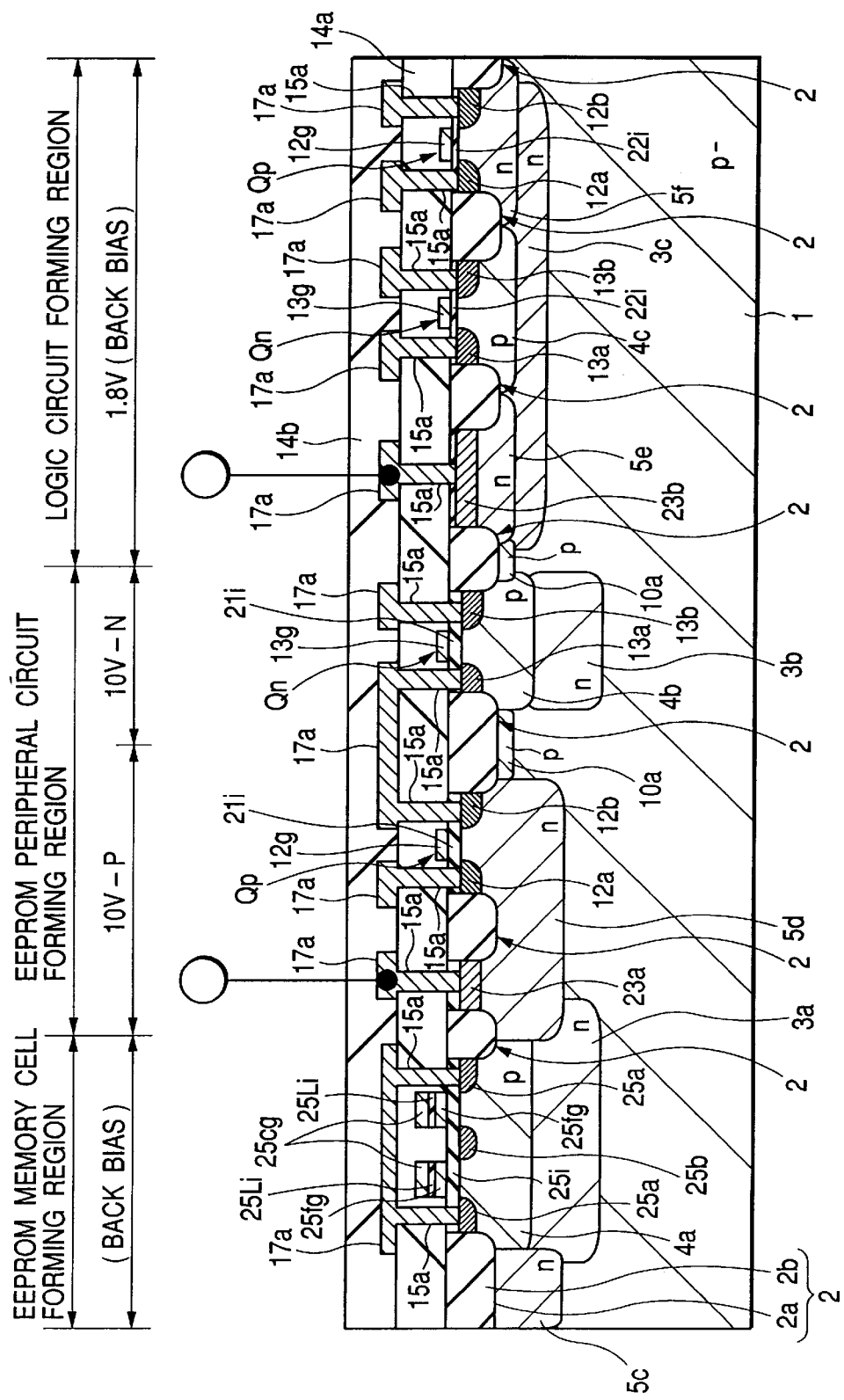
FIG. 39 is a section of essential portions in the semiconductor integrated circuit device manufacturing process subsequent to FIG. 33.
Figure 40:
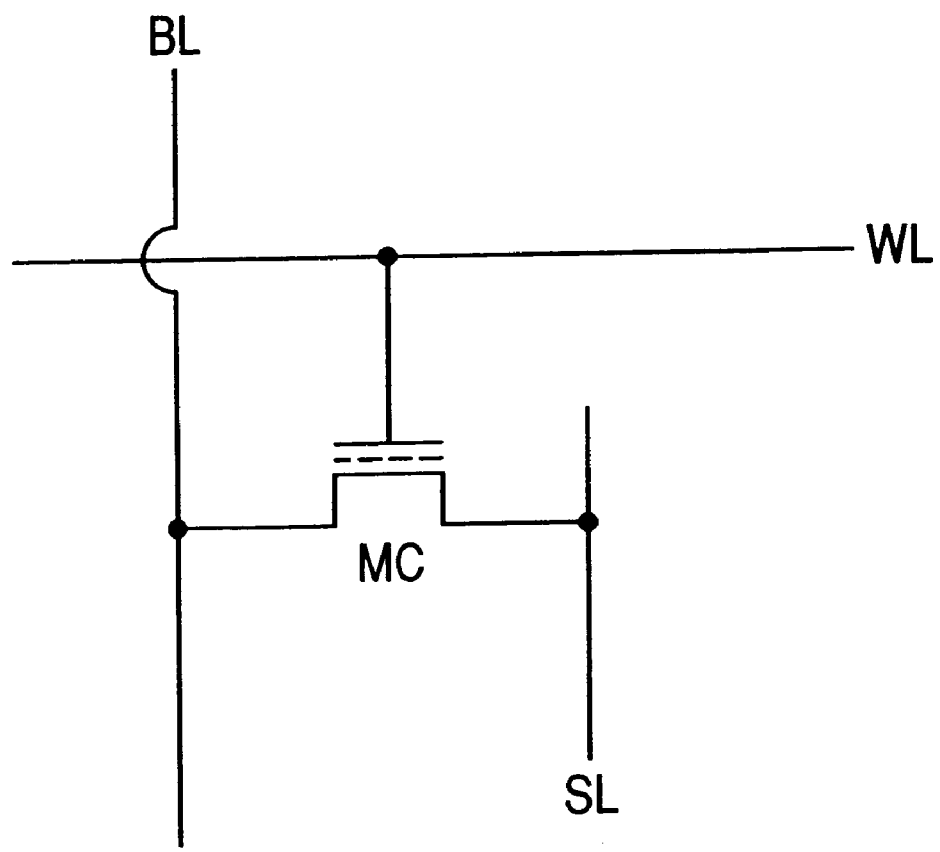
FIG. 40 is a circuit diagram of a memory cell of a flash memory (EEPROM)

After this, the photoresist pattern 7i is removed, and a thin gate insulating film 22i having a thickness of about 5 nm is then formed over the region where the MIS·FET driven at the power supply voltage of 1.8 V is formed as in the foregoing Embodiments 2 and 3, as shown in FIG. 39.

Next, the gate insulating film 24i is etched off from the memory cell region, and a tunnel insulating film 25i having a thickness of about 11 nm and made of silicon oxide or the like is then formed over the memory cell region.

Subsequently, a predetermined conductor film is deposited on the semiconductor substrate 1 and is then patterned by a photolithography technique and a dry etching technique to form gate electrodes 12g and 13g over the gate insulating films 21i and 22i thereby to form a floating gate electrode 25fg over the tunnel insulating film 25i.

Subsequently, semiconductor regions 25a and 25b in the memory cell regions, semiconductor regions 12a, 12b, 13a and 13b for the sources/drains of a p-MIS·FET Qp and an n-MIS·FET Qn, and the semiconductor regions 23a and 23b for the well power feed are formed by using an ordinary ion implantation method or the like.

After this, an interlayer film 25Li is formed over the floating gate electrode 25fg, and a control gate electrode 25cg is then formed over the interlayer film 25Li to form a memory cell MC of a two-layer gate structure of the flash memory (EEPROM). Here, a circuit diagram of this memory cell MC is shown in FIG. 40. This memory cell MC is provided in the vicinity of the intersection of a bit line BL and a word line WL. The memory cell MC is electrically connected at its control gate electrode with the word line WL, at its drain region with the bit line BL and at its source region with a source line SL.

As a result, there are formed a memory cell, a p-MIS·FET Qp and an n-MIS·FET Qn. Here, the buried n-well 3b is formed under the shallow p-well 4b, in which the n-MIS·FET Qn driven by the power supply voltage of 10V is formed, and the shallow p-well 4b is electrically connected with the semiconductor substrate 1, so that the potential can be fed to the shallow p-well 4b from the semiconductor substrate 1.

Of those MIS·FETs and so on, the memory cell, the p-MIS·FET Qp and the n-MIS·FET Qn driven by the power supply voltage of 10 V constitute the circuit in the arrangement region D1 of FIG. 32, and the p-MIS·FET Qp and the n-MIS·FET Qn driven at the power supply voltage of 1.8 V constitute the circuit in the arrangement region D2 of FIG. 32.

After this, the semiconductor integrated circuit device is manufactured through an ordinary wiring step and surface protective film forming step of the semiconductor integrated circuit device including the flash memory (EEPROM).

The following effects can be achieved by this Embodiment 4 in addition to the effects of the foregoing Embodiment 1.

(1) A back bias of −13 V is applied exclusively to the shallow p-well 4a of the high breakdown voltage system encompassed by the shallow n-wells 5c and 5d of the high breakdown voltage system, and a back bias of −1.8 V is applied exclusively to the 1.8 V system shallow p-well 4c encompassed by the 1.8 V system shallow n-wells 5e and 5f. However, no problem arises in the well breakdown voltage.

(2) The gate insulating film 21i is removed by using the photoresist pattern 7i, which has been used for forming the wells, as the etching mask. As a result, the manufacturing cost can be made lower than that of the case in which separate photoresist patterns are used for those processings.

(3) The gate insulating film 21i is removed by using the photoresist pattern 7i, which has been used for forming the wells, as the etching mask. As a result, the rate of occurrence of defects due to foreign matters can be reduced to improve the yield and reliability of the semiconductor integrated circuit device.

EMBODIMENT 5

FIGS. 41 to 45 are sections of essential portions in a process for manufacturing a semiconductor integrated circuit device of one embodiment of the invention; FIG. 46 is a top plan view of an element arrangement in a cache memory of the semiconductor integrated circuit device of this Embodiment 5; FIG. 47 is a circuit diagram of the memory cell of the cache memory; and FIGS. 57 and 58 are partially sectional view of a semiconductor substrate illustrating the problems of the semiconductor integrated circuit device, found out by us.

Prior to the description of this Embodiment 5, here will be described the problems of the well forming technique, which have been found out by us.

Figure 57:
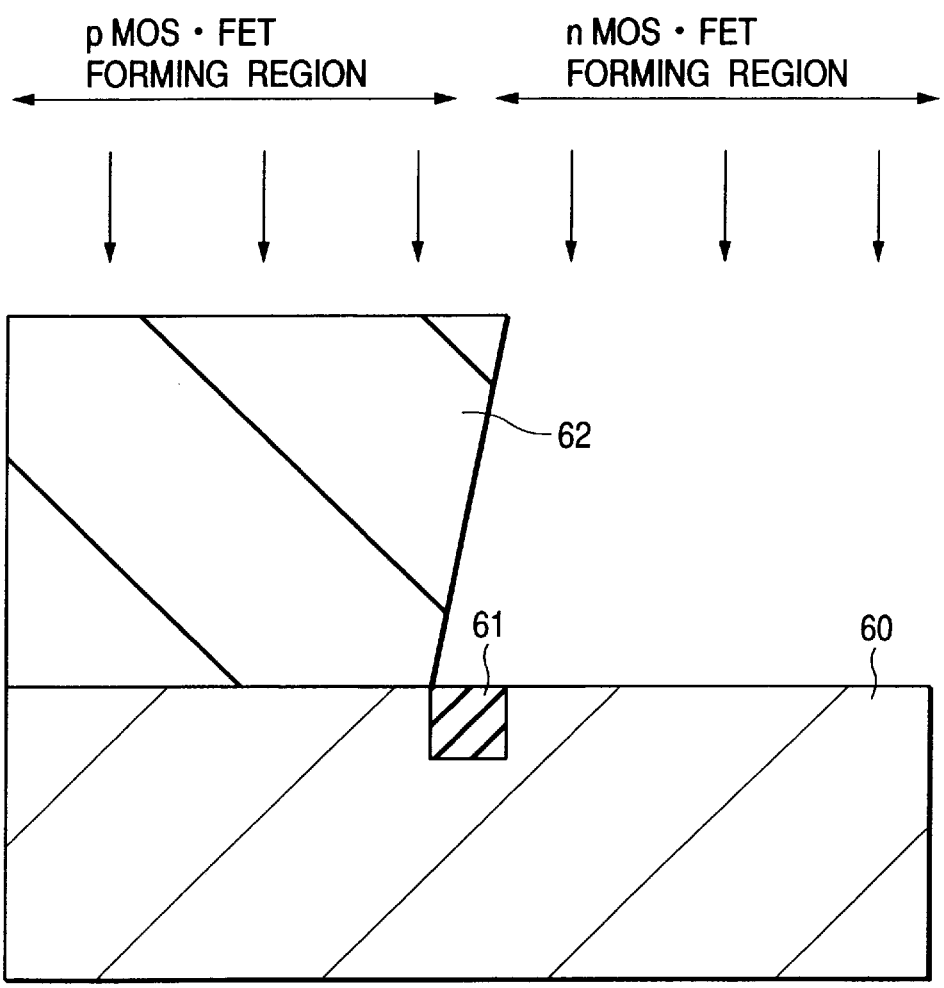
FIG. 57 is partially sectional view of a semiconductor substrate, illustrating the problems of the semiconductor integrated circuit device examined by us.
Figure 58:
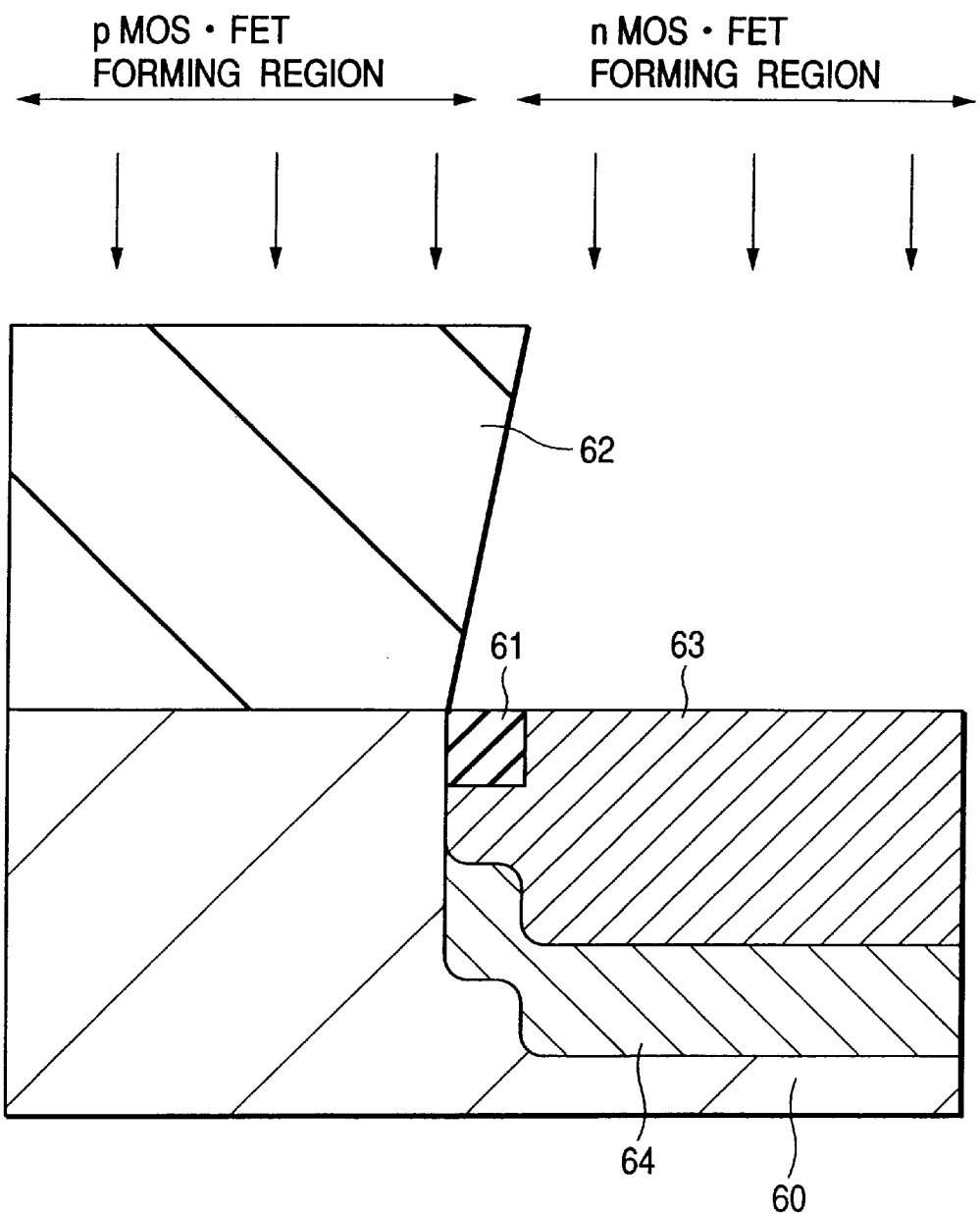
FIG. 58 is a partially sectional view of a semiconductor substrate, illustrating the problems of the semiconductor integrated circuit device examined by us.

FIG. 57 schematically shows a partially sectional view in a process for manufacturing the semiconductor integrated circuit device, as have been examined by us. A semiconductor substrate 60 is made of a p-type single crystal of silicon, and a trench type separation region 61 is formed in an element separation region of a major surface of the semiconductor substrate 60. Here, this formation should not be limited to the trench type separation region 61 but may be a separation region of a field insulating film.

In FIG. 57, the lefthand side of the separation region 61 is a region where a p-MIS·FET is formed, and the righthand side of the separation region 61 is a region where an n-MIS·FET is formed.

In this case, in order to form a p-well and an n-well in the region where the n-MIS·FET is formed in the semiconductor substrate 1 by applying the invention, as has been described in connection with the foregoing Embodiment 1 and so on, there is formed over the major surface of the semiconductor substrate 60 a photoresist pattern 62 through which the region where the n-MIS·FET is formed is exposed and which covers the region where the p-MIS·FET is formed. Here in FIG. 57, the end portion of the photoresist pattern 62 is shown to overhang the separation region 61.

Here, the side face of the end portion of the photoresist pattern 62 may be tapered (counter-tapered in FIG. 57), as shown in FIG. 57. This state becomes prominent especially as the photoresist pattern 62 is made thicker to dope the deeper position of the semiconductor substrate 60 with an impurity, for example.

When the semiconductor substrate 60 is doped in this case with an impurity for forming wells by using the photoresist pattern 62 as the mask, in the n-MIS·FET forming region, as shown in FIG. 58, the impurity distribution at the lower end portion on the separation region 61 side between a p-well 63 and a buried n-well 64 is different from the designed impurity concentration but the one that the end portion of the buried n-well 64 rises toward the major surface side of the semiconductor substrate 60. As a result, the problem of the defective breakdown voltage or the leakage occurs in the well under consideration. This problem becomes more serious as the separation region 61 corresponding to the boundary region between the p-MIS·FET and the n-MIS·FET becomes narrow.

When the photoresist pattern 62 is formed in a normal taper, moreover, a similar problem arises. Since the impurity introduced to form the p-well 63 is also introduced into the region where the p-MIS·FET is formed, more specifically, the impurity distribution of the region where the p-MIS·FET under the separation region 61 is formed is not the designed one.

In this Embodiment 5, in this case, therefore, a photoresist pattern through which both the n-MIS·FET forming region and the p-MIS·FET forming region are exposed is formed so that its end portion may not be provided over the separation region 2 positioned in the boundary region between the n-MIS·FET forming region and the p-MIS·FET forming region, ions of impurity for forming a p-well and a buried n-well are implanted into both the n-MIS·FET forming region and the p-MIS·FET forming region, and thereafter an n-type impurity is implanted into the p-MIS·FET forming region, thus forming an n-well.

Here will be described a specific example. The technical concept of the invention will be described taking the case in which the invention is applied to a semiconductor integrated circuit device having a cache memory, for example.

Figure 41:
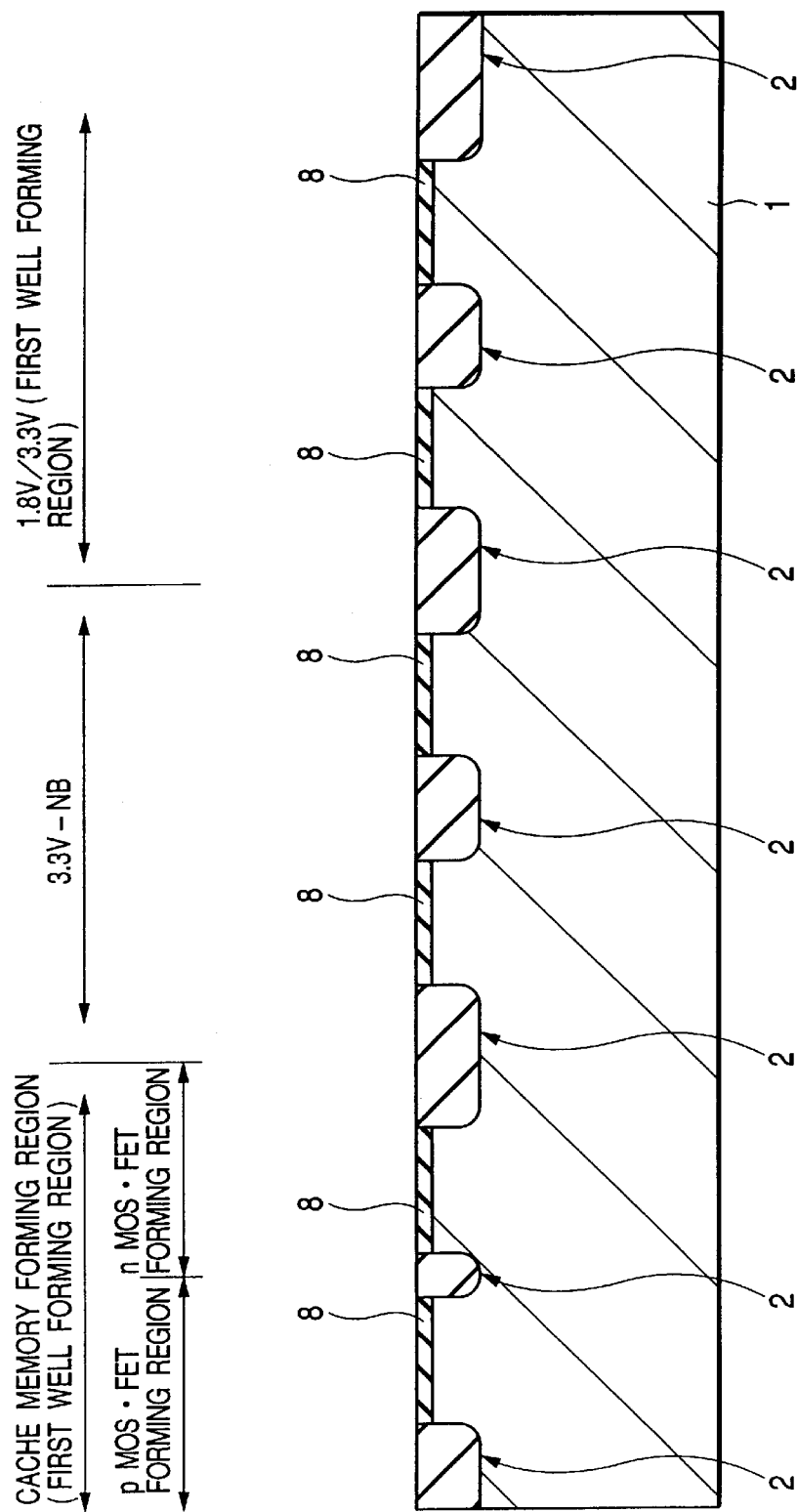
FIG. 41 is a section of essential portions in a process for manufacturing a semiconductor integrated circuit device of one embodiment of the invention.

FIG. 41 is a section of essential portions in the process for manufacturing the semiconductor integrated circuit device of this Embodiment 5. Here in FIG. 41, there are shown a cache memory region (the first well forming region), a region (3.3 V-NB) requiring no buried well and driven by a power supply voltage of 3.3 V, and a MIS·FET forming region of 1.8/3.3 V (the first well forming region) requiring a buried well and driven by a power supply voltage of 1.8 V or 3.3 V.

First, as in the foregoing Embodiments 1 to 4, a pad film 8 made of silicon oxide or the like and having a thickness of 20 nm, for example, is grown over a major surface of a semiconductor substrate 1 by a thermal oxidation method or the like to form a separation region 2.

In a cache memory region of the separation region 2, the width of the separation region 2 positioned at the boundary between the p-MIS·FET forming region and the n-MIS FET forming region, is 0.9 μm to 1.5 μm, which is narrower than those of the separation region 2 of the other regions, so that the area to be occupied by the cache memory may be reduced.

Figure 42:
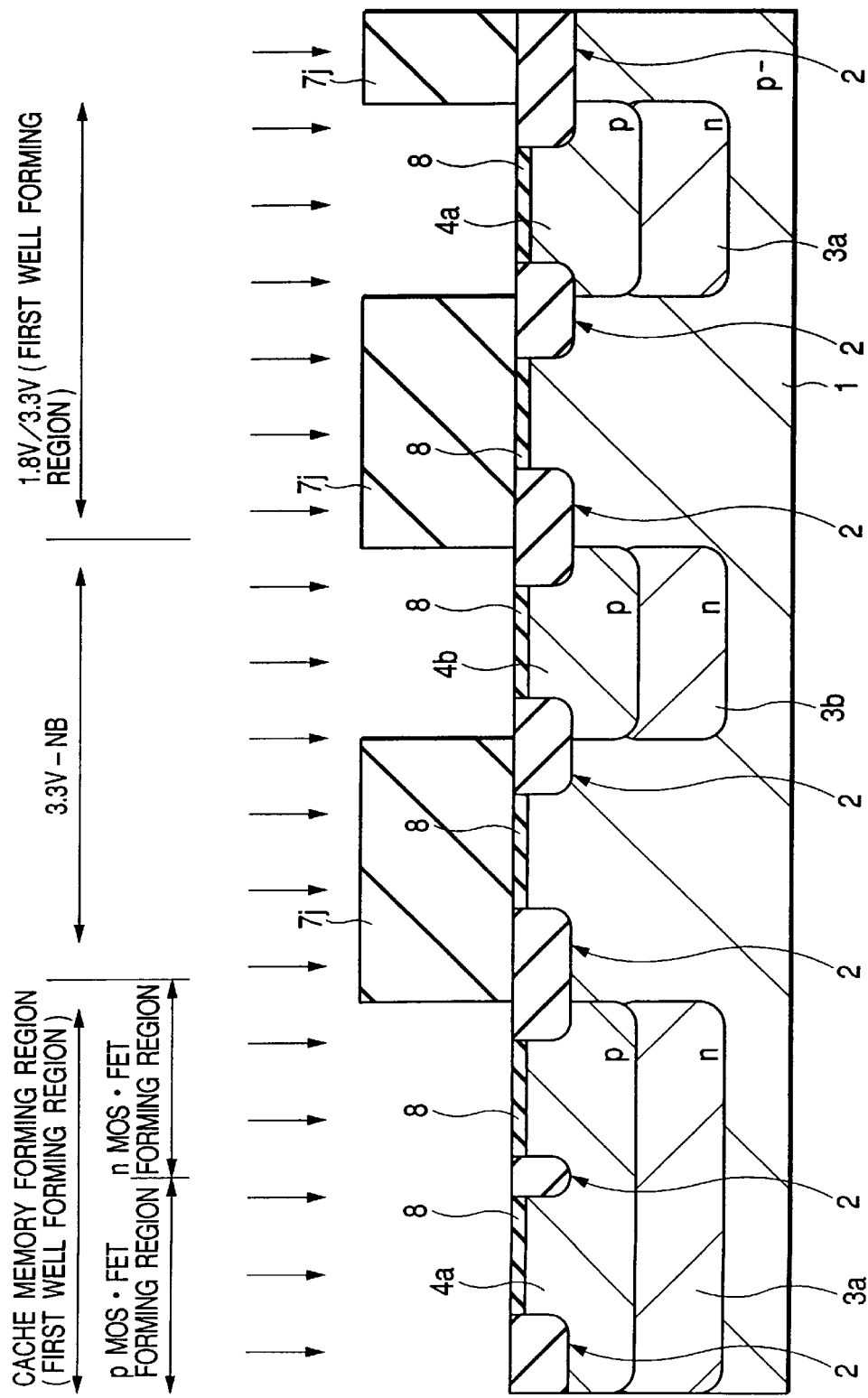
FIG. 42 is a section of essential portions in the semiconductor integrated circuit device manufacturing process subsequent to FIG. 41.

Subsequently, there is formed over the major surface of the semiconductor substrate 1, as shown in FIG. 42, a photoresist pattern (a first mask) 7j having a thickness of about 5 μm through which the cache memory forming region (a first well forming region) and the n-MIS·FET forming region (a second well forming region) are exposed and which covers the other regions.

Here in this Embodiment 5, the p-MIS·FET forming region in the cache memory region is not covered with the photoresist pattern 7j but is exposed. The reason is that the aforementioned problem which might otherwise be caused if the end portion of the photoresist pattern 7j is so positioned as to cover the p-MIS·FET forming region at the separation region in the boundary region between the p-MIS·FET forming region and the n-MIS FET forming region in the cache memory region because the separation region is narrow as described hereinbefore.

After this, in order to form buried n-wells 3a and 3b, the semiconductor substrate 1 is doped at its deep position with ions of phosphorus or the like under a condition of an acceleration energy of 2,300 KeV and a dosage of $1\times10^{13}/cm^2$ by using the photoresist pattern 7j as the mask. At this time, the impurity concentration of the buried n-wells 3a and 3b can be set optimum.

Next, in order to form shallow p-wells 4a and 4b in a self-alignment manner over the buried n-wells 3a and 3b, the same photoresist pattern 7j is used as the mask to perform ion implantation of boron under three conditions: a condition of an acceleration energy of 450 KeV and a dosage of $1\times10^{13}/cm^2$, a condition of an acceleration energy of 200 KeV and a dosage of $3\times10^{12}/cm^2$, and a condition of an acceleration energy of 50 KeV and a dosage of $1.2\times10^{12}/cm^2$.

At this time, in this Embodiment 5, the impurity concentrations of the shallow p-wells 4a and 4b can be set optimum independently of the buried n-wells 3a and 3b. As a result, it is possible to improve the electric characteristics such as the threshold voltage and the drain current of the MIS·FETs formed in the shallow p-wells 4a and 4b.

Moreover, the buried n-wells 3a and 3b and the shallow p-wells 4a and 4b are formed not by using the separate photoresist patterns but by the single photoresist pattern 7j. As a result, it is possible to reduce the manufacturing cost drastically and to improve the yield and reliability of the semiconductor integrated circuit device.

At this stage, the p-well 4a is also formed in the p-MIS·FET forming region of the cache memory. This makes it possible to prevent the aforementioned problem of the impurity concentration distribution from occurring in the shallow p-well 4a of the n-MIS·FET forming region.

Figure 43:
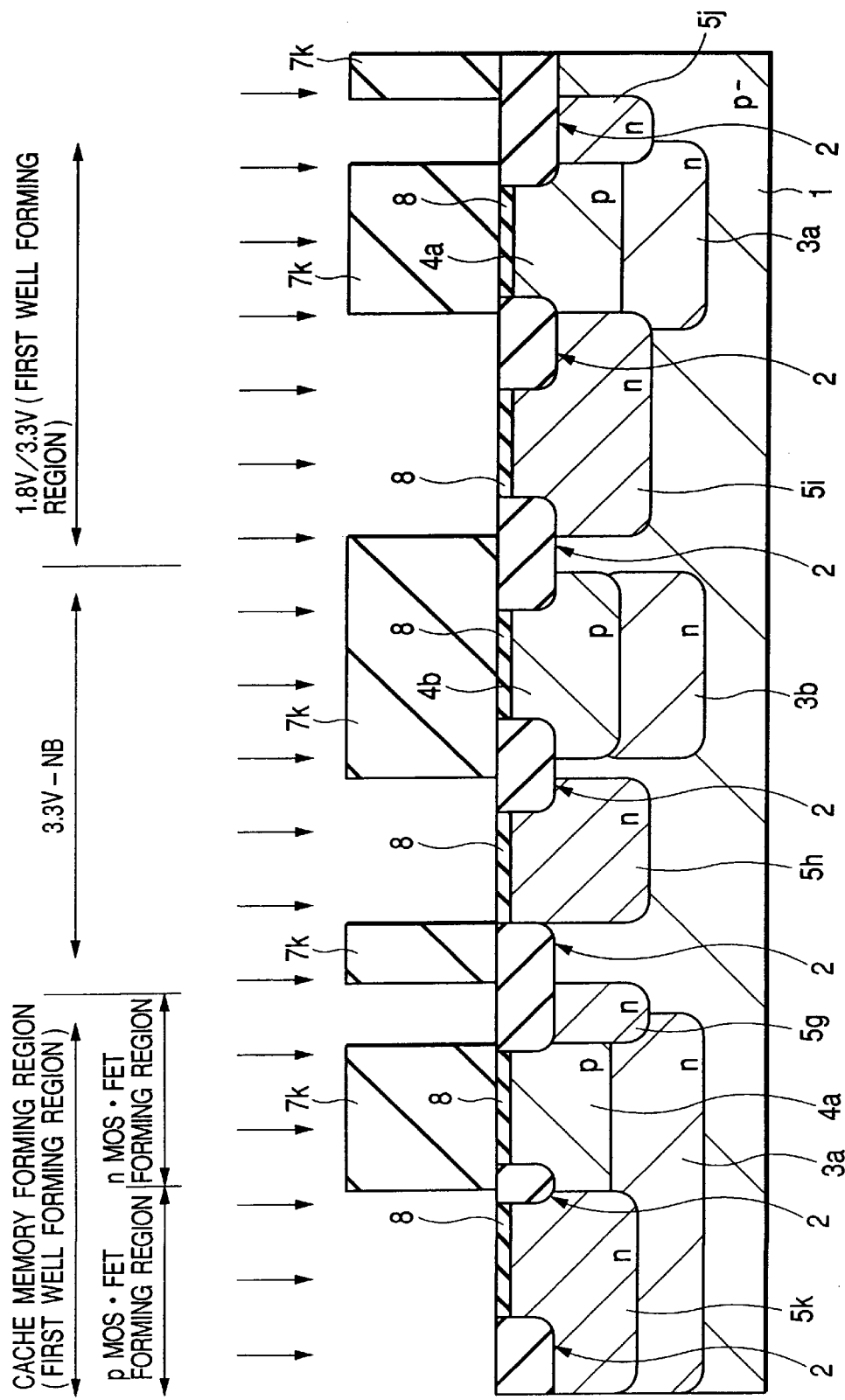
FIG. 43 is a section of essential portions in the semiconductor integrated circuit device manufacturing process subsequent to FIG. 42.

Next, the photoresist pattern 7j shown in FIG. 42 is removed. Over the major surface of the semiconductor substrate 1, as shown in FIG. 43, there is formed a photoresist pattern (a second mask) 7k which has a thickness of about 4 μm through which exposed are the p-MIS·FET forming region in the cache memory, the outer peripheral region (a third well forming region) of the shallow p-well 4a in the cache memory, the outer peripheral region (a third well forming region) of the shallow p-well 4a in the region requiring a buried well and the p-MIS·FET forming region (a fourth well forming region) in the region requiring a buried well, and which covers the other regions.

Subsequently, in order to form shallow n-wells 5g to 5k in the semiconductor substrate 1, this semiconductor substrate 1 is doped with ions of phosphorus or the like by using the photoresist pattern 7k as the mask under two conditions: a condition of an acceleration energy of 360 KeV and a dosage of $1.3\times10^{13}/cm^2$ and a condition of an acceleration energy of 70 KeV and a dosage of $1\times10^{12}/cm^2$, for example, and then doped with ions of boron difluoride ($BF_2$) under a condition of an acceleration energy of 70 KeV and a dosage of $2\times10^{12}/cm^2$, for example. Here, the ion implantation with $BF_2$ is performed to set the threshold voltage of the p-MIS·FET.

The ion implantation energy at this time is set to a level that the lower portion of the shallow well 5k reaches the buried n-well 3a. As a result, the shallow n-well 5k and the shallow p-well 4a can be formed in the cache memory region. Moreover, this shallow p-well 4a is encompassed by the shallow n-wells 5k and 5g and the buried n-well 3a, so that it is electrically separated from the semiconductor substrate 1. As a result, this shallow p-well 4a can be fed with a voltage different from that applied to the semiconductor substrate 1. This shallow p-well 4a is fed with a voltage of 0 to 1.8 V, for example.

The buried n-well 3a and the shallow n-well 5g are electrically separated from the shallow n-well 5k, so that they can be fed with different potentials. Specifically, the shallow n-well 5g can be fed with a voltage of about 3.3 V, for example, and the buried n-well 3a and the shallow n-well 5g can be fed with a voltage of about 1.8 V, for example.

This shallow n-well 5g is formed to encompass the side face of the shallow p-well 4a in the cache memory region and its lower portion overlaps with the upper portion of the buried n-well 3a and electrically connected with the same. The width of the shallow n-well 5g is about 4 μm, for example, although not especially limited thereto.

These shallow n-wells 5i and 5j are formed to encompass the side face of the shallow p-well 4a in the MIS·FET forming region requiring the buried well and its lower portion overlaps with the upper portion of the buried n-well 3a and electrically connected with the same. Specifically, this shallow p-well 4a is encompassed by the shallow n-well 5g and the buried n-well 3a and is electrically separated from the semiconductor substrate 1. However, this shallow p-well 4a is fed, like the semiconductor substrate 1 with the voltage of 0 V (GND), for example. The voltage applied to the shallow p-well 4a is equal to that applied to the semiconductor substrate 1, but the shallow p-well 4a is electrically separated from the semiconductor substrate 1, so that it receives no noise from the semiconductor substrate 1. As a result, it is possible to improve the operation reliability of the element to be formed in the shallow p-well 4a.

In the shallow n-well 5k, a p-MIS·FET of the cache memory is formed. In the p-MIS·FET forming region of the cache memory, more specifically, the conductivity type of the shallow p-well 4a can be inverted, when other shallow n-wells 5g to 5j are formed, to form the shallow n-well 5k.

For the same reasons as those of the foregoing Embodiments 1 to 4, in this Embodiment 5, it is also always possible to optimize the electric characteristics such as the threshold voltage and the drain current of the MIS·FETs to be formed in the regions of the shallow p-wells 4a and 4b and the shallow n-wells 5g to 5k.

Moreover, the buried n-wells 3a and 3b, the shallow p-wells 4a and 4b and the shallow n-wells 5g to 5k can be formed only by the two photoresist patterns 7j and 7k. This makes it possible as in the foregoing Embodiments 1 to 4 to reduce the manufacturing cost of the semiconductor integrated circuit device and to improve the yield of the semiconductor integrated circuit device.

When the next step is performed, it is possible to improve further the setting of the impurity concentration of the n-well 5k in the cache memory. After the photoresist pattern 7k shown in FIG. 43 is removed, more specifically, a photoresist pattern 7m through which the p-MIS·FET forming region of the cache memory is exposed and which covers the other regions is formed, as shown in FIG. 44.

In order to form the shallow n-well 5k, moreover, the semiconductor substrate 1 is doped with ions of phosphorus or the like by using the photoresist pattern 7m as the mask. Here, the dosage of the impurity ions is set to improve the conductivity type. The ion implantation energy is so set that the lower portion of the shallow n-well 5k reaches the buried n-well 3a. This makes it possible to form the shallow n-well 5k and the shallow p-well 4a in the cache memory region.

Figure 44:
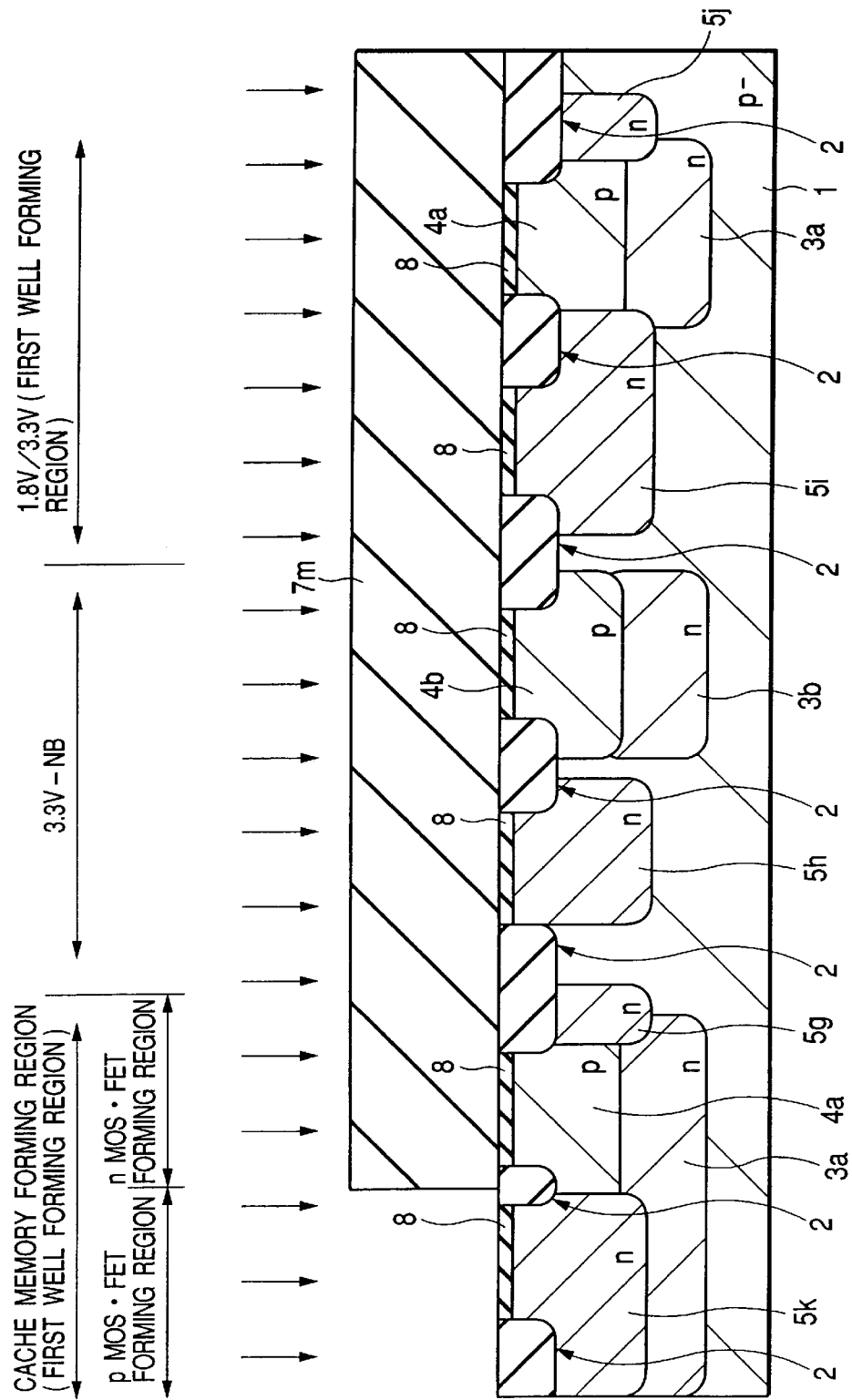
FIG. 44 is a section of essential portions in the semiconductor integrated circuit device manufacturing process subsequent to FIG. 43.
Figure 45:
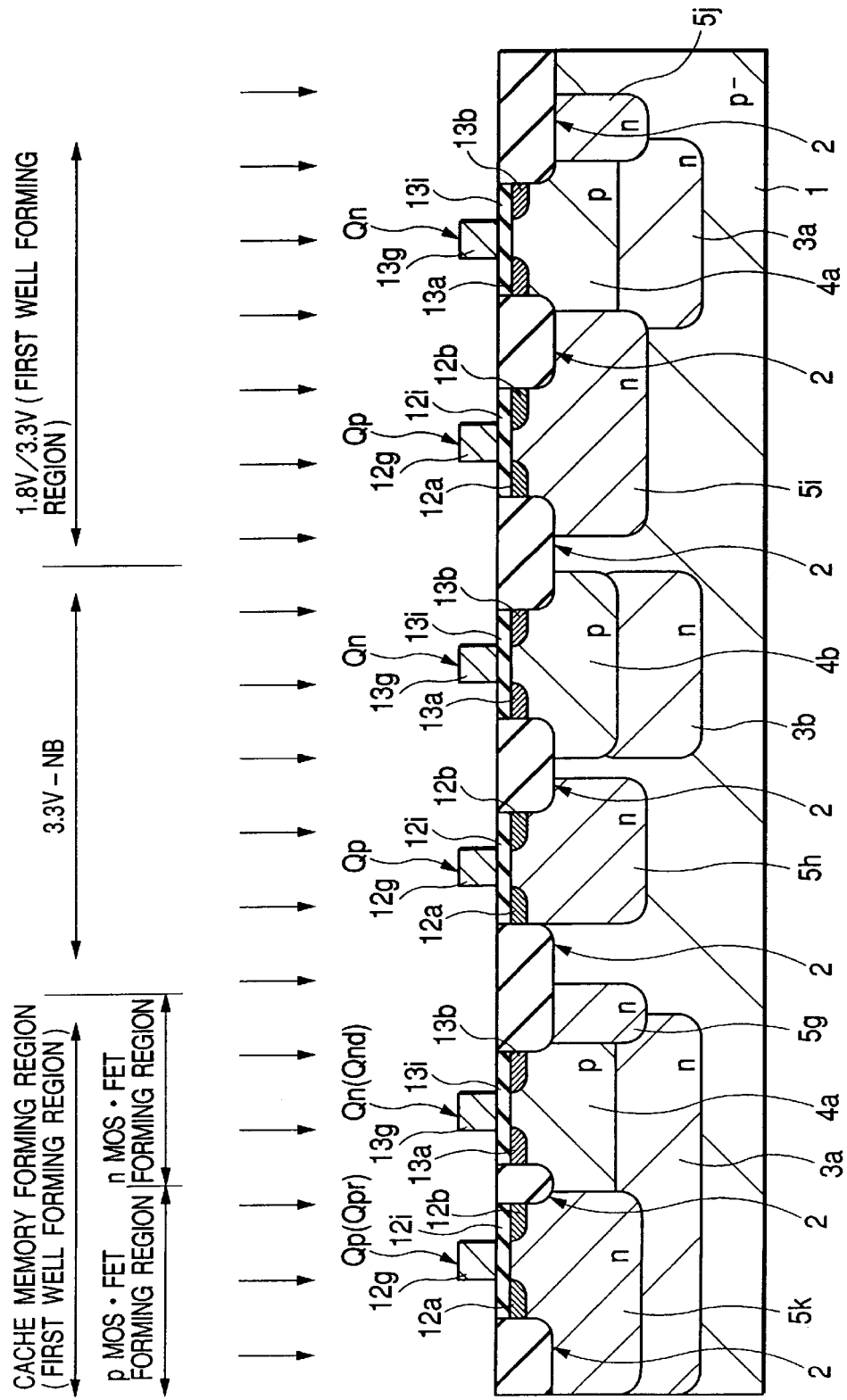
FIG. 45 is a section of essential portions in the semiconductor integrated circuit device manufacturing process subsequent to FIG. 44.

After this, the photoresist pattern 7k shown in FIG. 43 or the photoresist pattern 7m shown in FIG. 44 is removed. Then, the gate insulating films 12i and 13i are simultaneously formed, as shown in FIG. 45, to form an n-MIS·FETs Qn and Qnd in the regions of the shallow p-wells 4a and 4b, and p-MIS·FETs Qp and Qpr in the regions of the shallow n-wells 5h to 5k.

After this, the semiconductor integrated circuit device is manufactured through an ordinary wiring step and an ordinary surface protective film forming step of the semiconductor integrated circuit device including the cache memory.

A top plan view of the element layout of the memory cell in the cache memory of the semiconductor integrated circuit device thus manufactured is shown in FIG. 46. The circuit diagram of this memory cell is shown in FIG. 47.

The n-MIS·FET Qnd functions as a MIS·FET for driving the memory cell. The p-MIS·FET Qpr functions as a load MIS·FET. The gate electrodes 13g and 12g of these MIS·FET Qnd and MIS·FET Qpr are integrally patterned by means of a common conductor film.

The gate electrode 13g of the MIS·FET Qnd on the lefthand side of FIG. 46 is electrically connected with the semiconductor region 13a of the MIS·FET Qnd on the righthand side, and the gate electrode 13g of the MIS·FET Qnd on the righthand side of FIG. 46 is electrically connected with the semiconductor region 12a of the load MIS·FET Qpr.

The semiconductor region 13a of the MIS·FET Qnd acts as one of the semiconductor region of a transferring n-MIS·FET Qt and is electrically connected through the MIS·FET Qt with bit lines BL1 and BL2. Here, the gate electrode of the MIS·FET Qt is made up of a portion of the word line WL. Moreover, the bit lines BL1 and BL2 can transmit signals inverted from each other.

The following effects can be achieved by this Embodiment 5 in addition to the effects of the foregoing Embodiment 1.

(1) In the boundary region between the n-MIS·FET forming region and the p-MIS·FET forming region of the cache memory region, the impurity concentration distributions of the shallow p-well 4a and the buried n-well 3a can be prevented from rising toward the major surface of the semiconductor substrate 1. As a result, it is possible to avoid the problems of defective well breakdown voltage and leakage, as might otherwise be caused by the rise.

EMBODIMENT 6

FIGS. 48 to 53 are sections of essential portions in a process for manufacturing a semiconductor integrated circuit device of one embodiment of the invention.

This Embodiment 6 will be described taking the case in which the technical concept of the invention is applied to a semiconductor integrated circuit device equipped in a common semiconductor chip with a cache memory and a MIS·FET of a high breakdown voltage system.

Figure 48:
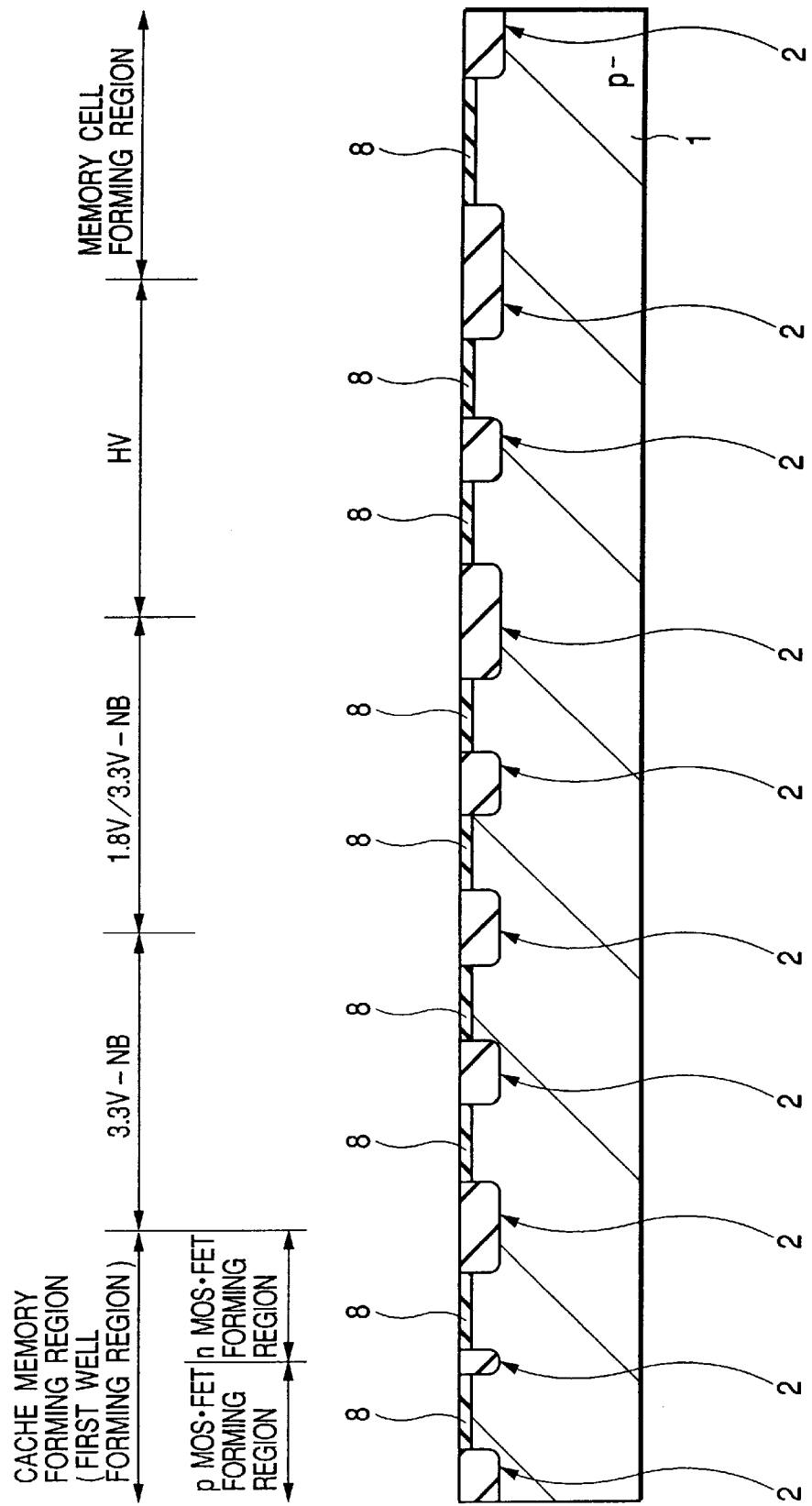
FIG. 48 is a section of essential portions in a process for manufacturing a semiconductor integrated circuit device of one embodiment of the invention.

FIG. 48 is a section of essential portions of the semiconductor integrated circuit device of this Embodiment 6. In FIG. 48, there are shown a region (the first well forming region) where a cache memory is formed, a region (3.3 V-NB) where a MIS·FET driven by a power supply voltage of 3.3 V and requiring no buried well is formed, a region (1.8/3.3 V-B) where a MIS·FET driven by a power supply voltage of 1.8 V or 3.3 V and requiring a buried well is formed, a region (HV) where a MIS·FET of high breakdown voltage system driven by a power supply voltage of 12 V and requiring a buried well is formed, and a memory cell forming region where the aforementioned flash memory (EEPROM), DRAM or the like is formed.

First, as in the foregoing Embodiments 1 to 5, a pad film 8 is grown over a major surface of a semiconductor substrate 1 by a thermal oxidation method, and a separation region 2 is then formed. In the cache memory region of this separation region 2, the width of the separation region 2 positioned at the boundary between the p-MIS·FET forming region and the n-MIS FET forming region is, as in the Embodiment 5, for example, about 0.9 $\mu$m to 1.5 $\mu$m, which is smaller than those of the separation regions 2 in the other regions.

Figure 49:
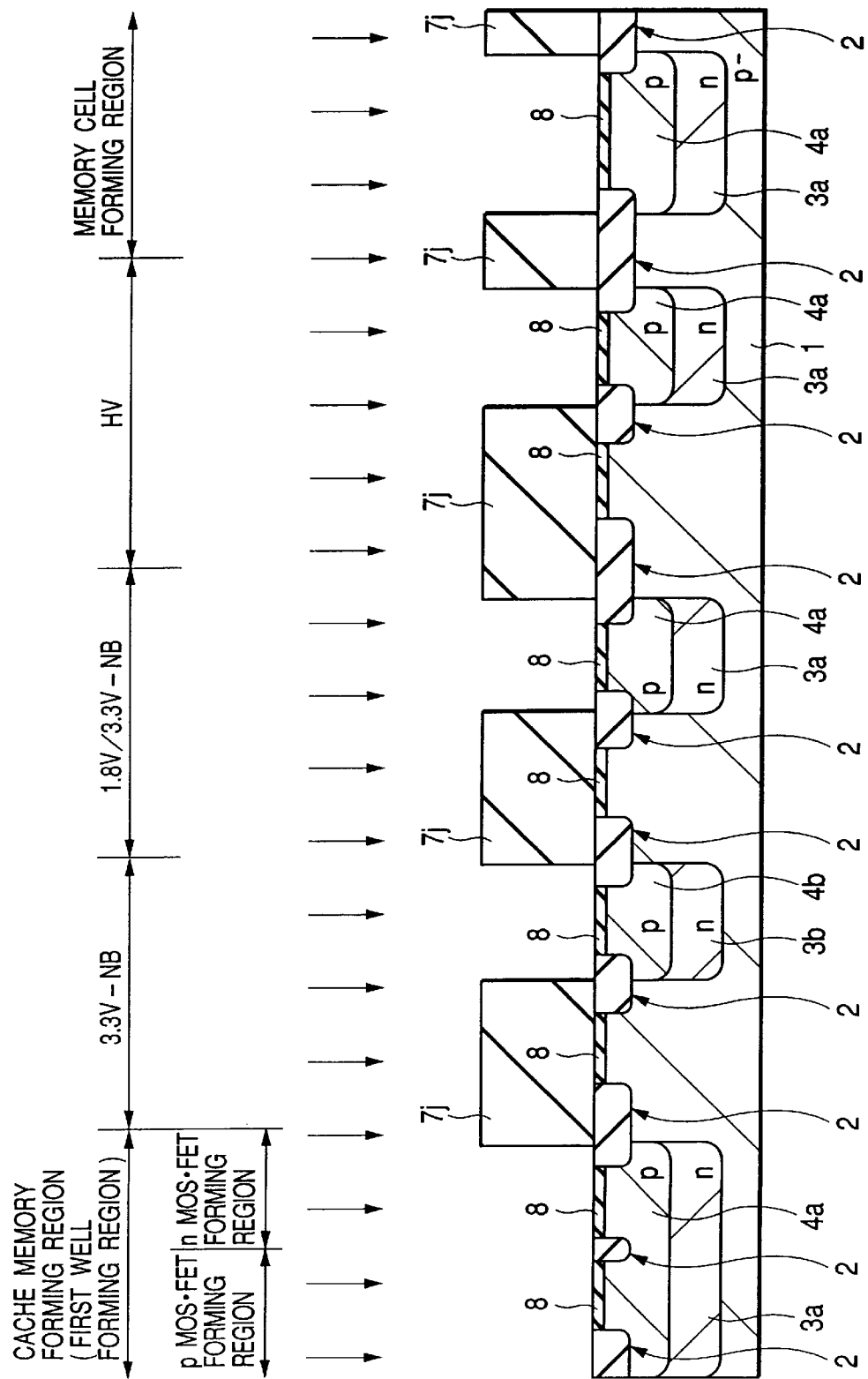
FIG. 49 is a section of essential portions in the semiconductor integrated circuit device manufacturing process subsequent to FIG. 48.

Subsequently, a photoresist pattern 7j is formed over the major surface of the semiconductor substrate 1, as shown in FIG. 49. In this Embodiment 6, too, the p-MIS·FET forming region of the cache memory region is not covered with the photoresist pattern 7j and exposed.

After this, in order to form buried n-wells 3a and 3b, the semiconductor substrate 1 is doped at its deep position with ions of phosphorus or the like at the same dosage and implantation energy as those in the foregoing Embodiment 5 by using the photoresist pattern 7j as the mask. At this time, the impurity concentration of the buried n-wells 3a and 3b can be set optimum.

Next, in order to form the shallow p-wells 4a and 4b in a self-alignment manner over the buried n-wells 3a and 3b, ion implantation with boron is performed at the same dosage and implantation energy as those of Embodiment 5 by using the same photoresist pattern 7j as the mask.

At this time, in this Embodiment 6 as in the Embodiment 5, the impurity concentrations of the shallow p-wells 4a and 4b can be set optimum independently of the buried n-wells 3a and 3b thereby to improve the electric characteristics of the MIS·FETs in the shallow p-wells 4a and 4b.

Since the buried n-wells 3a and 3b and the shallow p-wells 4a and 4b can be formed by using the single photoresist pattern 7j, moreover, it is possible as in the Embodiment 5 to reduce the manufacturing cost drastically and to improve the yield and reliability of the semiconductor integrated circuit device.

Figure 50:
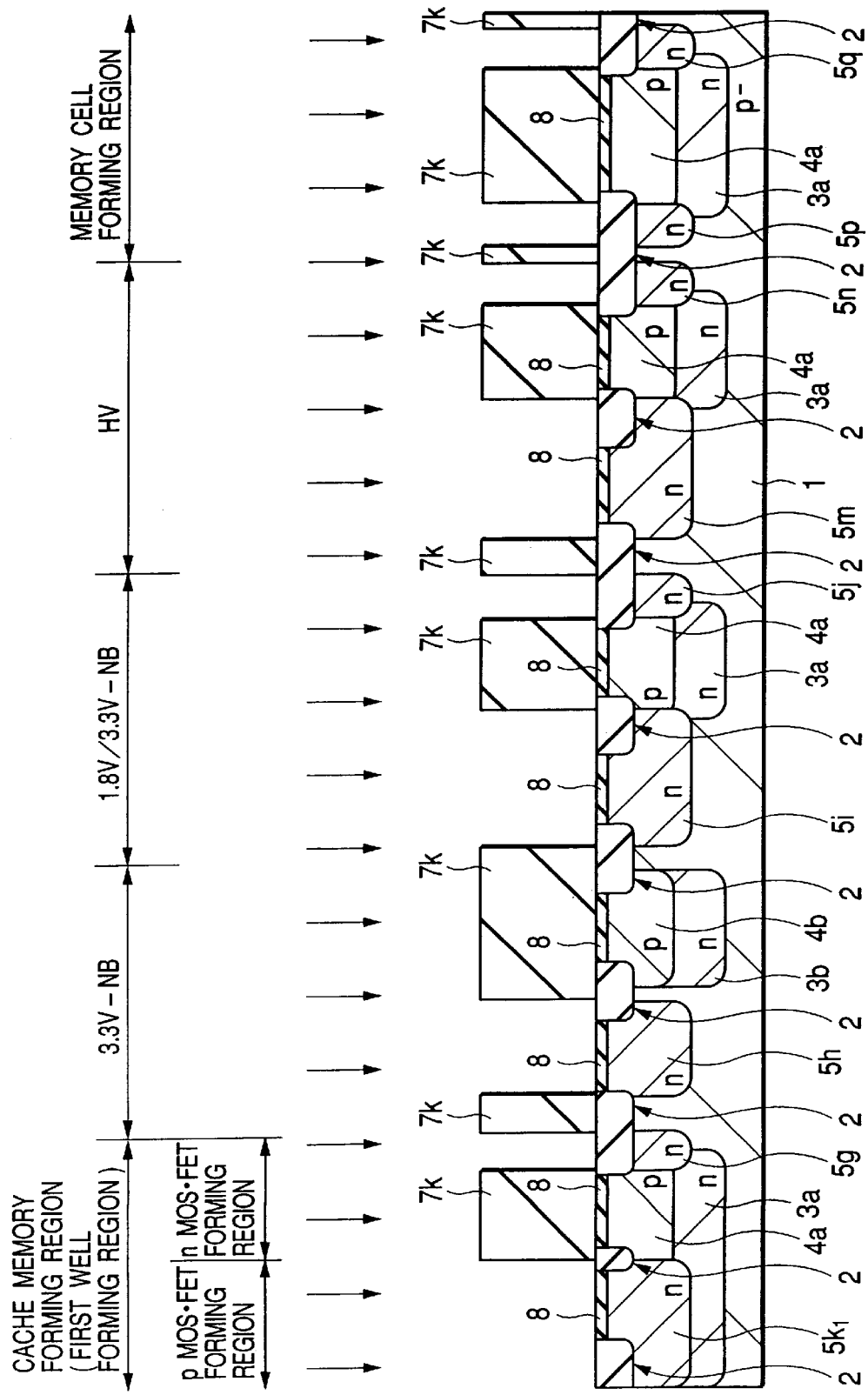
FIG. 50 is a section of essential portions in the semiconductor integrated circuit device manufacturing process subsequent to FIG. 48.

Next, the photoresist pattern 7j shown in FIG. 49 is removed, and a photoresist pattern 7k is then formed over the major surface of the semiconductor substrate 1, as shown in FIG. 50. This photoresist pattern 7k is so formed as to expose, for example, the p-MIS·FET forming region of the shallow p-well 4a in the cache memory, the outer peripheral region of the shallow p-well 4a, the region (3.3 V-NB) where the p-MIS·FET of 3.3 V system requiring no buried well is formed, the region where the p-MIS·FET of 1.8 V or 3.3 V system requiring a buried well is formed, the outer peripheral region of the shallow p-well 4a of 1.8 V or 3.3 V system requiring a buried well, the p-MIS·FET forming region (HV) in the MIS·FET forming region (HV) of high breakdown voltage system, the outer peripheral region of the shallow p-well 4a in the MIS·FET forming region (HV) of high breakdown voltage system, and the outer peripheral region of the shallow p-well 4a in the memory cell forming region, and as to cover the other regions.

Subsequently, in order to form shallow n-wells 5g to 5j, 5m, 5n, 5p and 5q and a shallow well 5k1 in the semiconductor substrate 1, this semiconductor substrate 1 is doped, by using the photoresist pattern 7k as the mask, with ions of phosphorus or the like under three conditions: a condition of an acceleration energy of 1,300 KeV and a dosage of $1 \times 10^{13}/cm^2$, a condition of an acceleration energy of 600 KeV and a dosage of $5 \times 10^{11}/cm^2$ and a condition of an acceleration energy of 200 KeV and a dosage of $5 \times 10^{11}/cm^2$, and then with ions of boron difluoride ($BF_2$) under a condition of an acceleration energy of 70 KeV and a dosage of $2 \times 10^{12}/cm^2$. The ion implantation of $BF_2$ is performed to set the threshold voltage of the p-MIS·FET.

These shallow n-wells 5i and 5j are so formed to encompass the side face of the shallow p-well 4a in the MIS·FET forming region requiring the buried well, its lower portion overlaps with the upper portion of the buried n-well 3a, and it is electrically connected with the same. In other words, the shallow p-well 4a is encompassed by the shallow n-wells 5i and 5j and the buried n-well 3a, so that it is electrically separated from the semiconductor substrate 1. As a result, the shallow p-well 4a can be fed with a voltage different from that applied to the semiconductor substrate 1. This shallow p-well 4a is fed with a voltage of 0 to –3.3 V, for example.

The shallow n-wells 5n and 5m are so formed as to encompass the side face of the shallow p-well 4a in the MIS·FET forming region (HV) of high breakdown voltage system, their lower portions overlap with the upper portion of the buried n-well 3a, and they are electrically connected with the same. The shallow p-well 4a is encompassed by the shallow n-wells 5n and 5m and the buried n-well 3a and electrically separated from the semiconductor substrate 1. As a result, this shallow p-well 4a can be fed with a voltage different from that applied to the semiconductor substrate 1. This shallow p-well 4a is fed with a voltage of 0 to –12 V, for example.

The shallow n-wells 5p and 5q are so formed as to encompass the side face of the shallow p-well 4a in the memory cell region of high breakdown voltage system, their lower portions overlap with the upper portion of the buried n-well 3a and they are electrically connected with the same. The shallow p-well 4a is encompassed by the shallow n-wells 5p and 5q and the buried n-well 3a and electrically separated from the semiconductor substrate 1. As a result, this shallow p-well 4a can be fed with a voltage different from that applied to the semiconductor substrate 1. This shallow p-well 4a is fed with a voltage of 0 to –12 V, for example.

In a shallow well 5k1, moreover, there is formed a p-MIS·FET of the cache memory. In this Embodiment 6, however, no impurity introduction is not so sufficiently performed to invert the conductivity type completely. At this state, sufficient impurity introduction may be done as in the aforementioned Embodiment 5.

In this Embodiment 6, the impurity concentrations of the shallow p-wells 4a and 4b, the shallow n-wells 5g to 5j, 5m, 5n, 5p and 5q and the shallow well 5k1 can be independently set individually optimum to optimize at all times the electric characteristics such as the threshold voltage and the drain current of the MIS·FETs to be formed in the regions of the wells 4a and 4b and the shallow n-wells 5g to 5j, 5m, 5n, 5p and 5q.

Since the buried n-wells 3a and 3b, the shallow p-wells 4a and 4b and the shallow n-wells 5g to 5j, 5m, 5n, 5p and 5q can be formed only by the two photoresist patterns 7j and 7k, moreover, it is possible as in the foregoing Embodiments 1 to 5 to reduce the manufacturing cost of the semiconductor integrated circuit device and to improve the yield of the semiconductor integrated circuit device.

Thus, the semiconductor integrated circuit device which is equipped with the cache memory and the high breakdown voltage MIS·FET can be produced with a high reliability and at a low cost, thereby giving drastic influence on the semiconductor industry.

Figure 51:
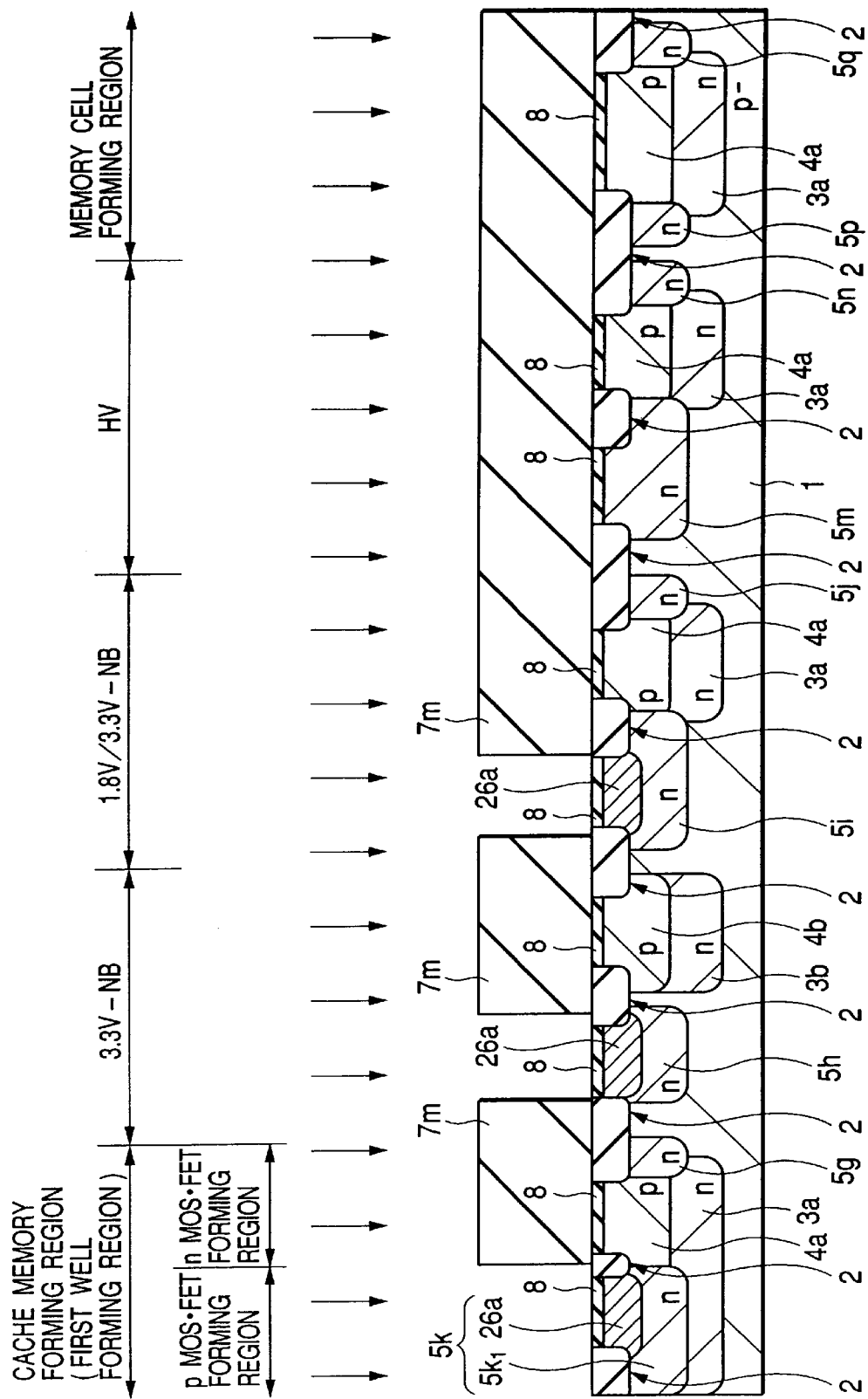
FIG. 51 is a section of essential portions in the semiconductor integrated circuit device manufacturing process subsequent to FIG. 48.

Next, the photoresist pattern 7k shown in FIG. 50 is removed. After this, as shown in FIG. 51, there is formed the photoresist pattern 7m through which exposed are the region where the p-MIS·FET of the cache memory is formed, the region where the p-MIS·FET of 3.3 V system requiring a buried well is formed, and the region where the p-MIS·FET of 1.8 V/3.3 V system requiring a buried well is formed and which cover the other regions.

Subsequently, in order to form a semiconductor region 26a for optimizing the impurity concentrations or the conductivity types of the shallow n-well 5k1 and the shallow n-wells 5h and 5i, the semiconductor substrate 1 is doped with ions of phosphorus or the like under a condition of an acceleration energy of 360 KeV and a dosage of $1.3 \times 10^{13}/cm^2$, for example, by using the photoresist pattern 7m as the mask.

The dosage of the impurity ions is so set in the p-MIS·FET forming region of the cache memory that the conductivity type of the semiconductor substrate 1 is inverted from the p-type (the shallow p-well 4a) to the n-type. Moreover, the setting is made to optimize the impurity concentrations of the shallow n-wells 5h and 5i.

As a result, the shallow n-well 5k and the shallow p-well 4a can be formed in the cache memory region. The shallow n-well 5k in this case is formed as the sum of the shallow well 5k1 and the semiconductor region 26a. The shallow p-well 4a encompassed by the shallow n-wells 5k and 5g, is electrically separated from the semiconductor substrate 1, so that it can be fed with a voltage different from that applied to the semiconductor substrate 1. A voltage of, e.g., 0 to –1.8 V is applied to the shallow well.

Figure 52:
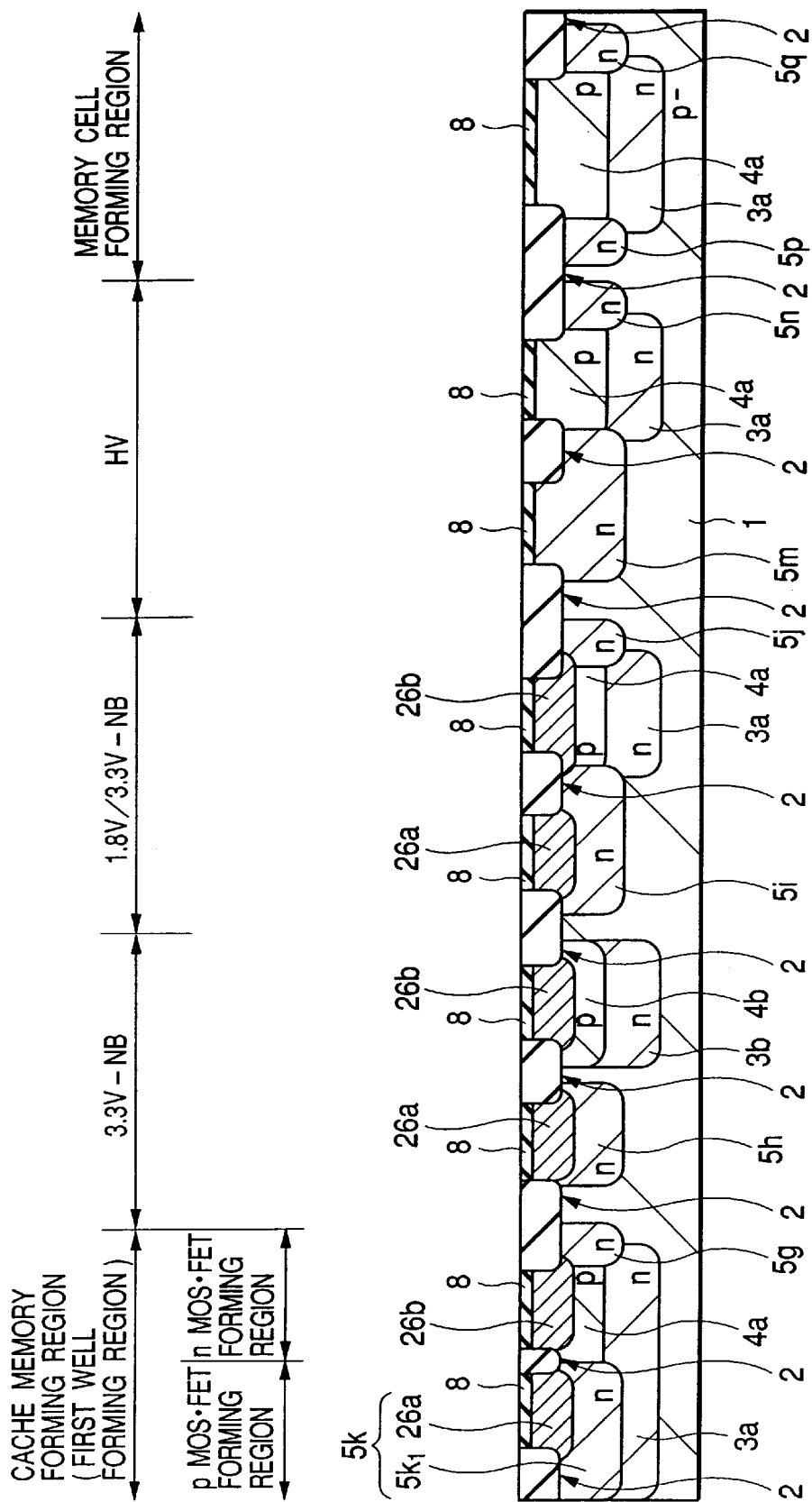
FIG. 52 is a section of essential portions in the semiconductor integrated circuit device manufacturing process subsequent to FIG. 48.

Since the high breakdown voltage MIS·FET is provided, the step of introducing the impurity for setting the conductivity type of the shallow well 5k of the p-MIS·FET region of the cache memory is performed simultaneously with the introduction of the impurity into other wells required at a subsequent stage. This makes it possible to prevent the increase in the number of masks and to reduce the rate of occurrence of foreign matters, thereby improving the yield. After this, the photoresist pattern 7m shown in FIG. 51 is removed. In order to optimize the impurity concentration, p-type semiconductor regions 26b are then formed in the shallow p-wells 4a and 4b by a photolithography technique and an ion introduction technique, as shown in FIG. 52. The semiconductor regions 26b are doped with boron, for example.

The reason why such semiconductor regions 26a and 26b are formed will be described in the following. The impurity concentrations of the wells of the MIS·FET of 3.3 v system, the MIS·FET of 1.8 V system and the MIS·FET in the cache memory are substantially equal to each other but are different from the impurity concentration of the well of the MIS·FET of high breakdown voltage system, so that they have to be higher than the impurity concentration of the well of high breakdown voltage system.

Figure 53:
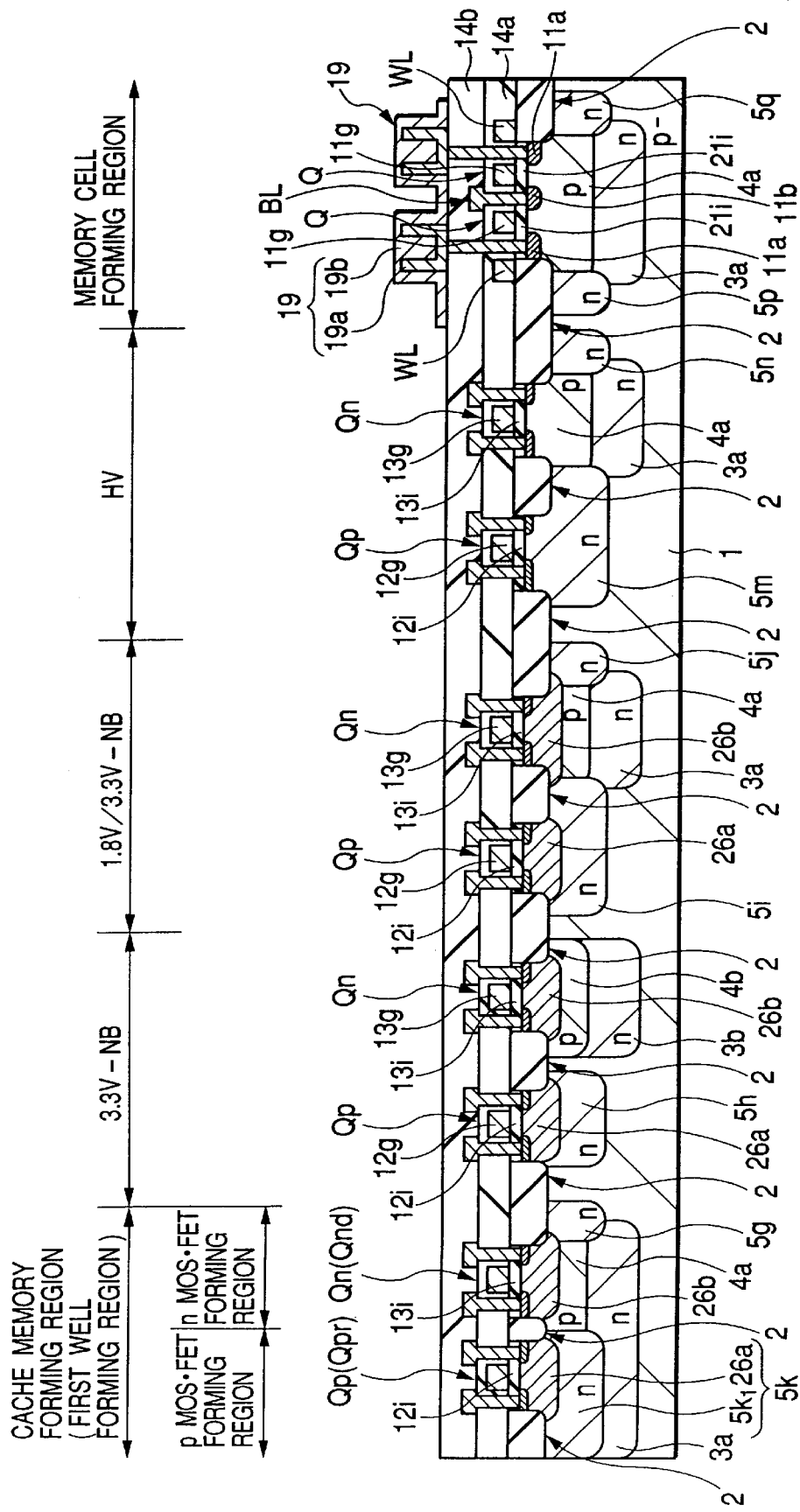
FIG. 53 is a section of essential portions in the semiconductor integrated circuit device manufacturing process subsequent to FIG. 48.

After this, as shown in FIG. 53, the gate insulating films 12i, 13i and 21i are simultaneously formed over. the major surface of the semiconductor substrate 1. Then, the n-MIS·FETs Qn, Qnd and Q are formed in the regions of the shallow p-wells 4a and 4b, and the p-MIS·FETs Qp and Qpr are formed in the regions of the shallow n-wells 5h to 5k.

The buried n-well 3b is formed under the shallow p-well 4b, in which n-MIS·FET Qn in the region requiring no buried well is formed, and electrically connected with the semiconductor substrate 1 as in the foregoing Embodiments 1 to 5 so that it can be fed with the potential from the semiconductor substrate 1.

After this, the semiconductor integrated circuit device is manufactured through an ordinary wiring step and an ordinary surface protective film forming step. Here will be omitted the description of the top plan view of the element layout of the memory cell in the cache memory and the circuit diagram of the memory cell because they are identical to those of the foregoing Embodiment 5. Also the description on the sectional structure including the capacitor 19 in the DRAM will be omitted because it is identical to that of the foregoing Embodiment 1 and so on.

The following effects can be achieved by this Embodiment 6 in addition to the effects of the foregoing Embodiment 1.

(1) When the technical concept of the invention is applied to a process for manufacturing the semiconductor integrated circuit device having a MIS·FET of high breakdown voltage system, n-type or p-type semiconductor regions 26a and 26b are formed in the wells of the MIS·FETs other than the MIS·FETs of high breakdown voltage system so that the shortage of the impurity concentration of the wells can be compensated.

(2) No problem arises when the cache memory, the high breakdown voltage system MIS·FET, the ordinary MIS·FET and another memory cell are to be formed in a common semiconductor chip. The manufacture process can be simplified by performing a predetermined process simultaneously for a plurality of regions. Thus, the semiconductor integrated circuit device can be manufactured by integrating the processes for forming the individual element regions into one process for manufacturing a semiconductor integrated circuit device.

Although our invention has been specifically described in connection with its embodiments, it should not be limited to the foregoing Embodiments 1 to 6 but can naturally be modified in various manners without departing from the gist thereof.

For example, the Embodiments 1 to 6 have been described taking the case in which the separation region is of a trench type. However, the invention should not be limited thereto but can be modified in various manners in which the separation structure is made of a field insulating film formed by a selective oxidation method, for example.

The semiconductor substrate include the so-called "epitaxial wafer" in which an epitaxial layer is formed over the semiconductor substrate. In this modification, an epitaxial layer of a single crystal of silicon, for example, is formed by an epitaxial method over the surface of the semiconductor substrate made of a single crystal of silicon of a predetermined conductivity type, for example. It is preferable that this epitaxial layer has a thickness of 5 $\mu$m, although not especially limited thereto.

The foregoing Embodiments 1, 3 and 6 have been described taking the case in which the data storage capacitor of the DRAM is of the crown type. However, the invention should not be limited thereto but can be modified in various manners including the fin type, for example.

The foregoing Embodiments 1, 3 and 6 have been described taking the case in which the capacity insulating film of the data storage capacitor of the DRAM is made up of an ordinary insulating film. However, the invention should not be limited thereto but may be modified such that a ferroelectric memory is constructed by using a ferroelectric material such as PZT as a material for the capacitor insulating film of the data storage capacitor, for example. The Embodiments 2, 3 and 4 may be modified, as follows. First, a photoresist pattern (corresponding to the photoresist pattern 7i of FIG. 22 or the like) through which the 1.8 V system MIS·FET region (having a back bias) in the logic circuit region in FIG. 16 or the like is exposed is formed and is used as the mask to dope the semiconductor substrate with ions of phosphorus or the like. The ion implantation is performed under the condition for forming a deep n-well which extend from the major surface to a deep position of the semiconductor substrate. Subsequently, the photoresist pattern is removed, and a photoresist pattern (corresponding to the photoresist pattern 20 of FIG. 20 or the like) is then formed through which the n-MIS·FET region in the 1.8 V system MIS·FET region (having a back bias) in the logic circuit region is exposed. After this, the photoresist pattern is used as the mask to dope the semiconductor substrate with ions of boron or the like. The ion implantation is performed under a condition that a shallow well extending from the major surface to a shallow position of the semiconductor substrate and having an inverted conductivity type of the deep p-well is formed, thus forming a shallow p-well encompassed by the deep n-well. This shallow p-well is encompassed by the deep n-well and electrically separated from the semiconductor substrate. The subsequent steps of forming the elements are identical to those of the foregoing Embodiments 2, 3 and 4.

The effects achieved by a representative aspect of the invention disclosed herein will be briefly described in the following.

(1) According to the invention, the impurity concentrations of the first well forming region, the second well forming region, the third well forming region and the fourth well forming region can be independently set optimum, so that the electric characteristics such as the threshold voltage and the drain current of the MIS transistors to be formed in the well regions can be optimized at all times.

(2) According to the invention, the buried wells of the first conductivity type of the first well forming region and the second well forming region, the shallow well of the second conductivity type of the first well forming region, the shallow well of the first conductivity type of the third well forming region, and the shallow well of the first conductivity type of the fourth well forming region can be formed only by the two masks to reduce the number of steps of forming the masks, compared with the technique in which one mask is formed for each well.

(3) Thanks to the aforementioned effects (1) and (2), in a semiconductor integrated circuit device having a well separating structure, the impurity concentrations of the well region and the ordinary well region in the well separation region can be optimized without increasing the number of steps of manufacturing the semiconductor integrated circuit device.

(4) Thanks to the aforementioned effects (1) and (2), the electric characteristics of the elements to be formed in the well region and the ordinary region in the well separation region and in the ordinary well can be improved without increasing the number of steps of manufacturing the semiconductor integrated circuit device having the well separating structure.

(5) Thanks to the aforementioned effect (2), it is possible to lower the cost for manufacturing the semiconductor integrated circuit device.

(6) Thanks to the aforementioned effect (2), the rate of occurrence of defects due to foreign matters can be reduced correspondingly to the decrease in the number of mask forming steps thereby to improve the yield of the semiconductor integrated circuit device.

(7) Thanks to the aforementioned effects (1), (2), (3), (4) and (5), it is possible to provide a semiconductor integrated circuit device having a high operation reliability.

(8) According to the invention, the impurity concentration of at least a portion of the shallow well region of the first conductivity type in the third well forming region is made higher than that of the shallow well region of the second conductivity type in the first well forming region, so that the junction between the shallow well region of the second conductivity type and the semiconductor substrate can be spaced away to improve the electric separating ability inbetween. Even if the position at which the shallow well region of the first conductivity type in the third well forming region is formed is planarily displaced at the impurity implantation step of forming the shallow well region, the breakdown voltage of the shallow well region of the first conductivity type in the third well forming region can be ensured to ensure the electric separating ability between the shallow well region of the second conductivity type in the first well forming region and the semiconductor substrate.

(9) Thanks to the aforementioned effect (8), it is possible to improve the yield and reliability of the semiconductor integrated circuit device.

(10) According to the invention, the impurity concentrations of the fifth well forming region and the sixth well forming region can be independently set optimum, so that the electric characteristics such as the threshold voltage and the drain current of the MIS transistors to be formed in the well regions can be optimized at all times.

(11) According to the invention, the fifth mask which has been used when the buried well region of the first conductivity type is formed just under the fifth well forming region and the sixth well forming region is used as the etching mask to remove the gate insulating film exposed through the fifth mask, so that the number of mask forming steps can be made smaller than that of the case in which the removing steps are performed with different masks.

(12) Thanks to the aforementioned effect (11), it is possible to lower the cost for manufacturing the semiconductor integrated circuit device.

(13) Thanks to the aforementioned effect (11), the rate of occurrence of defects due to foreign matters can be lowered correspondingly to the decrease in the number of mask forming steps thereby to improve the yield of the semiconductor integrated circuit device.

(14) Thanks to the aforementioned effects (10), (11), (12) and (13), it is possible to provide a semiconductor integrated circuit device having a high operation reliability at a low cost.

(15) According to the invention, impurity of the first conductivity type is introduced to override the conductivity type of the shallow well region of the second conductivity type in the first well forming region thereby to form the shallow well region of the first conductivity type in the first well forming region, by using the sixth mask through which exposed is the region where the shallow well region of the conductivity type is formed as the impurity introducing mask. At the stage of the impurity introducing step for forming the shallow well region of the second conductivity type in the first well forming region, the impurity concentration distribution of the shallow well region of the second conductivity type can be prevented from rising toward the major surface of the semiconductor substrate at the boundary region between the shallow well region of the first conductivity type and the shallow well region of the second conductivity type in the first well forming region, so that the problems such as the well breakdown voltage defect and the leakage, as might otherwise be caused by that rise, can be avoided.

(16) When the technical concept of the invention is applied to the process for manufacturing a semiconductor integrated circuit device having a high breakdown voltage system MIS transistors, according to the invention, the shortage of the impurity concentration of the well region of the MIS transistor other than the high breakdown voltage system MIS transistor can be compensated by additionally introducing an impurity of the same conductivity type as that of the well region.

What is claimed is:

1. A process for manufacturing a semiconductor integrated circuit device, comprising the steps of:

(a) forming, by patterning, over a major surface of a semiconductor substrate a first mask through which a first well forming region and a second well forming region formed at a distance from the first well forming region are exposed;

(b) introducing said semiconductor substrate with an impurity by using said first mask as an impurity introduction mask so as to form a buried well region of a first conductivity type at a deep position of said semiconductor substrate in said first well forming region;

(c) introducing said semiconductor substrate with an impurity by using said first mask as an impurity introduction mask so as to form a shallow well region of a second conductivity type over said buried well region of the first conductivity type in said first well forming region and said well forming region;

(d) forming, by patterning, over the major surface of said second semiconductor substrate a second mask through which a third well forming region encompassing the buried well region of the first conductivity type of said first well forming region, and the shallow well region of the second conductivity type in said first well forming region and a fourth well forming region formed at a distance from said first well forming region are exposed; and (e) introducing the semiconductor substrate with an impurity by using said second mask as an impurity introduction mask so as to form a shallow well region of the first conductivity type encompassing the outer periphery of the shallow well region of the second conductivity type of said first well forming region and electrically connected with the buried well region of the first conductivity type of the first well forming region in said third well forming region and to form a shallow well region of the first conductivity type in said fourth well forming region, wherein in said first well forming region, the shallow well region of the second conductivity type in said first well forming region is encompassed by the shallow well region of the first conductivity type formed in said third well forming region and the buried well region of the first conductivity type in said first well forming region and electrically separated from the semiconductor substrate, and wherein in said second well forming region, said shallow well region of the second conductivity type electrically connected with said semiconductor substrate.

2. A process according to claim 1, wherein the impurity is so introduced that the peak region of the impurity concentration of the buried well region of the first conductivity type in said first well forming region is deeper than that of the impurity concentration of the shallow well region of the second conductivity type in said first well forming region and said second well forming region.

3. A process according to claim 1, further comprising:

forming a MIS transistor in a region of the shallow well region of the first conductivity type in said third well forming region.

4. A process according to claim 1, further comprising the steps of:

forming a gate insulating film over the major surface of said semiconductor substrate;

forming a gate electrode over said gate insulating film; and introducing the semiconductor substrate with a predetermined impurity by using said gate electrode as a mask, wherein MIS transistors are formed in the individual regions of the shallow well regions of the second conductivity type in said first well forming region and said second well forming region and the shallow well regions of the first conductivity type in said third well forming region and said fourth well forming region.

5. A process according to claim 1, wherein the impurity introduction of said step (e) is so performed that the impurity concentration of at least a portion of the shallow well region of the first conductivity type in said third well forming region is higher than that of the shallow well region of the second conductivity type in said first well forming region.

6. A process according to claim 5, wherein the impurity introduction of said step (e) is so performed that the impurity concentration of the vicinity of said buried well region in the shallow well region of the first conductivity type in said third well forming region is higher than that of the vicinity of said buried well region and the vicinity of said shallow well region of the first conductivity type in the shallow well region of the second conductivity type in said first well forming region.

7. A process according to claim 1, further comprising the steps of:

forming an element separation region over the major surface of said semiconductor substrate, wherein in said first well forming region, an active region of said shallow well region of the second conductivity type is defined by said element separation region, wherein at least a portion of the shallow well region of the first conductivity type in said third well forming region extends under said element separation region.

8. A process according to claim 7, further comprising the steps of:

extending a channel stopper region of the second conductivity type under said element separation region.

9. A process according to claim 8, wherein under the element separation region of said third well forming region, the impurity concentration of said shallow well region of the first conductivity type is higher than that of said channel stopper region.

10. A process according to claim 7, wherein said element separation region is formed by forming a separation trench in said semiconductor substrate and then by burying a separation film in said separation trench.

11. A process according to claim 1, further comprising the steps of:

forming, by patterning, over the major surface of the semiconductor substrate a third mask through which a fifth well forming region formed at a distance from said first well forming region is exposed;

introducing the semiconductor substrate with an impurity by using said third mask as an impurity introduction mask so as to form a shallow well region of the first conductivity type in said fifth well forming region;

forming, by patterning, over the major surface of the semiconductor substrate a fourth mask through which a sixth well forming region planarily encompassed by said fifth well forming region is exposed; and introducing the semiconductor substrate with an impurity by using said fourth mask as an impurity introduction mask so as to form a shallow well region of the second conductivity type in said sixth well forming region.

12. A process according to claim 11, further comprising the steps of:

forming, by patterning, over the major surface of the semiconductor substrate a fifth mask through which said fifth well forming region, said sixth well forming region and a portion of the element separation region encompassing the fifth well forming region are exposed and which has its opening end provided over the element separation region; and introducing the semiconductor substrate with an impurity by using said fifth mask as an impurity introduction mask so as to form a buried well region of the first conductivity type under the shallow well region of the first conductivity type of said fifth well forming region and the shallow well region of the second conductivity type of the sixth well forming region such that said buried well region is electrically connected with the shallow well regions of the first conductivity type of said fifth well forming region and said sixth well forming region and may extends below a portion of the element separation region encompassing said fifth well forming region, wherein in said sixth well forming region, the shallow well region of the second conductivity type in the sixth well forming region is encompassed by the shallow well region of the first conductivity type of said fifth well forming region and the buried well regions of the first conductivity type of said fifth well forming region and said sixth well forming region and electrically separated from the semiconductor substrate.

13. A process according to claim 12, further comprising the steps of:

removing a gate insulating film from the major surface of the semiconductor substrate exposed from said fifth mask by using said fifth mask as an etching mask; and after said fifth mask removing step, forming a gate insulating film having a thickness different from that of the gate insulating film of the other regions, over the major surface of the semiconductor substrate exposed from said fifth mask.

14. A process according to claim 13, wherein a drive voltage of a MIS transistor having said gate insulating film of different thicknesses is lower than that of MIS transistors having gate insulating films of the other regions.

15. A process according to claim 1, further comprising the steps of:

forming, by patterning, over the major surface of the semiconductor substrate a third mask through which a fifth well forming region formed at a distance from said first well forming region and a portion of the element separation region are exposed;

introducing the semiconductor substrate with an impurity by using said third mask as an impurity introduction mask so as to form a shallow well region of the first conductivity type in said fifth well forming region;

forming, by patterning, over the major surface of the semiconductor substrate a fourth mask through which a sixth well forming region planarily encompassed by said fifth well forming region and a portion of the element separation region are exposed;

introducing the semiconductor substrate with an impurity by using said fourth mask as an impurity introduction mask so as to form a shallow well region of the second conductivity type in said sixth well forming region and a channel stopper region of the second conductivity type under said element separation region;

forming, by patterning, over the major surface of the semiconductor substrate a fifth mask through which said fifth well forming region, said sixth well forming region and a portion of the element separation region encompassing the fifth well forming region are exposed and which has its opening end provided over the element separation region; and introducing the semiconductor substrate with an impurity by using said fifth mask as an impurity introduction mask so as to form a buried well region of the first conductivity type under the shallow well region of the first conductivity type of said fifth well forming region and the shallow well region of the second conductivity type of the sixth well forming region such that said buried well region is electrically connected with the shallow well region of the first conductivity type of said fifth well forming region and extends below a portion of the element separation region encompassing said fifth well forming region, wherein in said sixth well forming region, the shallow well region of the second conductivity type in the sixth well forming region is encompassed by the shallow well region of the first conductivity type of said fifth well forming region and the buried well regions of the first conductivity type of said fifth well forming region and said sixth well forming region and electrically separated from the semiconductor substrate.

16. A process according to claim 1, further comprising the steps of:

in said first well forming region, forming over the major surface of the semiconductor substrate a sixth mask for exposing the region for forming a shallow well region of the first conductivity type; and introducing said first well forming region with an impurity by using said sixth mask as an impurity introduction mask so as to override the conductivity type of the shallow well region of the second conductivity type in said first well forming region and to form a shallow well region of the first conductivity type in said first well forming region, wherein a shallow well region of the first conductivity type and a shallow well region of the second conductivity type are formed in said first well forming region, and said shallow well region of the second conductivity type is encompassed by the well region of the first conductivity type, the shallow well region of the first conductivity type formed in said third well forming region, and the buried well region of the first conductivity type in the first well forming region and electrically separated from the semiconductor substrate.

17. A process according to claim 16, wherein an element separation region formed between the shallow well region of the first conductivity type and the shallow well region of the second conductivity type in said first well forming region is thinner than the element separation region of another region.

18. A process according to claim 16, wherein a MIS transistor is formed in the shallow well region of the first conductivity type and the shallow well region of the second conductivity type in said first well forming region.

19. A process according to claim 1, wherein when a MIS transistor of high breakdown voltage is formed in said semiconductor substrate, the shallow well regions other than the shallow well region of high breakdown voltage where the MIS transistor of high breakdown voltage is formed is additionally doped with an impurity so as to increase the impurity concentration.

20. A process according to claim 1, further comprising:

forming, by patterning, over the major surface of the semiconductor substrate a seventh mask for exposing a seventh well forming region;

introducing said seventh well forming region with an impurity by using said seventh mask as an impurity introduction mask so as to form in said seventh well forming region a deep well region of the first conductivity type extending from the major surface to a deep position of said semiconductor substrate;

removing a gate insulating film from the major surface of the semiconductor substrate exposed from said seventh mask by using said seventh mask as an etching mask; and after said seventh mask removing step, forming a gate insulating film having a thickness different from that of the gate insulating films of other regions, over the major surface of the semiconductor substrate exposed from said seventh mask.

21. A process according to claim 20, further comprising the steps of:

forming, by patterning, over the major surface of the semiconductor substrate an eighth mask through which an eighth well forming region in the region encompassed by said seventh well forming region is exposed; and introducing the semiconductor substrate with an impurity by using said eighth mask as an impurity introduction mask in such a manner as to override the conductivity type of said deep well region, so as to form a shallow well region of the second conductivity type encompassed by said deep well region, in said eight well forming region, wherein in said eighth well forming region, the shallow well region of the second conductivity type is encompassed by the deep well region of the first conductivity type and electrically separated by the semiconductor substrate.

22. A process according to claim 20,
wherein a drive voltage of a MIS transistor having said gate insulating film of different thickness is lower than that of MIS transistors having gate insulating films of the other region.

23. A process according to claim 20,
wherein an end of said seventh mask is disposed over the element separation region, and
wherein an end of the deep well region in said seventh well forming region terminates under the element separation region.

24. A process according to claim 20, further comprising the steps of:
forming a channel stopper region of the second conductivity type is formed under said element separation region.

25. A process for manufacturing a semiconductor integrated circuit device, comprising the steps of:
(a) forming, by patterning, over a major surface of a semiconductor substrate a first mask through which a first well forming region and a second well forming region formed at a distance from the first well forming region are exposed;
(b) introducing said semiconductor substrate with an impurity by using said first mask as an impurity introduction mask so as to form a buried well region of a first conductivity type at a deep position of said semiconductor substrate in said first well forming region and said second well forming region;
(c) introducing said semiconductor substrate with an impurity by using said first mask as an impurity introduction mask so as to form a well region of a second conductivity type over said buried well region of the first conductivity type in said first well forming region and said second well forming region;
(d) forming, by patterning, over the major surface of said semiconductor substrate a second mask through which a third well forming region encompassing the buried well region of the first conductivity type of said first well forming region and the well region of the second conductivity type are exposed; and
(e) introducing the semiconductor substrate with an impurity by using said second mask as an impurity introduction mask by using said second mask as an impurity introduction mask so as to form a well region of the first conductivity type encompassing the outer periphery of the well region of the second conductivity type of said first well forming region and electrically connected with the buried well region of the first conductivity type of the first well forming region in said third well forming region, wherein in said first well forming region, the well region of the second conductivity type in said first well forming region is encompassed by the well region of the first conductivity type formed in said third well forming region and the buried well region of the first conductivity type in said first well forming region and electrically separated from the semiconductor substrate, and wherein in said second well forming region, said well region of the second conductivity type is electrically connected with said semiconductor substrate.

26. A process according to claim 25,
wherein the impurity is so introduced that the peak region of the impurity concentration of the buried well region of the first conductivity type in said first well forming region is deeper than that of the impurity concentration of the well region of the second conductivity type in said first well forming region and said second well forming region.

27. A process according to claim 25, further comprising the steps of:
forming a MIS transistor in the region of the well region of the first conductivity type in said third well forming region.

28. A process according to claim 25, further comprising the steps of:
forming a gate insulating film over the major surface of said semiconductor substrate;
forming a gate electrode over said gate insulating film; and
introducing the semiconductor substrate with a predetermined impurity by using said gate electrode as a mask,
wherein MIS transistors are formed in the individual regions of the well region of the second conductivity type in said first well forming region and said second well forming region and the well region of the first conductivity type in said third well forming region.

29. A process according to claim 25,
wherein the impurity introduction of said step (e) is so performed that the impurity concentration of at least a portion of the well region of the first conductivity type in said third well forming region is higher than that of the well region of the second conductivity type in said first well forming region.

30. A process according to claim 25,
wherein the impurity introduction of said step (e) is so performed that the impurity concentration of the vicinity of said buried well region in the well region of the first conductivity type in said third well forming region is higher than that of the vicinity of said buried well region and the vicinity of said well region of the first conductivity type in the well region of the second conductivity type.

31. A process according to claim 25, further comprising:
in said first well forming region, forming over the major surface of the semiconductor substrate a sixth mask through which the well region of the first conductivity type is exposed; and
introducing said first well forming region with an impurity by using said sixth mask as an impurity introduction mask so as to override the conductivity type of the well region of the second conductivity type in said first well forming region and to form a well region of the first conductivity type in said first well forming region,
wherein a well region of the first conductivity type and a well region of the second conductivity type are formed in said first well forming region, and said well region of the second conductivity type is encompassed by the well region of the first conductivity type, the well region of the first conductivity type formed in said third well forming region, and the buried well region of the first conductivity type in the first well forming region and electrically separated from the semiconductor substrate.

32. A process according to claim 31,
wherein an element separation region formed between the well region of the first conductivity type and the well region of the second conductivity type in said first well forming region is thinner than the element separation region of another region.

33. A process according to claim 31,
wherein MIS transistors are formed in the well region of the first conductivity type and the well region of the second conductivity type in said first well forming region.

34. A process for manufacturing a semiconductor integrated circuit device, comprising the steps of:
(a) forming, by patterning, over a major surface of a semiconductor substrate a third mask through which a fifth well forming region is exposed;
(b) introducing the semiconductor substrate with an impurity by using said third mask as an impurity introduction mask so as to form a shallow well region of a first conductivity type in said fifth well forming region;
(c) forming, by patterning, over the major surface of the semiconductor substrate a fourth mask through which a sixth well forming region which is planarily encompassed by said fifth well forming region is exposed;
(d) introducing the semiconductor substrate with an impurity by using said fourth mask as an impurity introduction mask so as to form a shallow well region of a second conductivity type in said sixth well forming region;
(e) forming, by patterning, over the major surface of the semiconductor substrate a fifth mask through which said fifth well forming region, said sixth well forming region and a portion of an element separation region encompassing said fifth well forming region are exposed and which has its opening end provided over the element separation region;
(f) introducing the semiconductor substrate with an impurity by using said fifth mask as an impurity introduction mask so as to form a buried well region of the first conductivity type under the shallow well region of the first conductivity type of said fifth well forming region and the shallow well region of the second conductivity type in said sixth well forming region, such that said buried well is electrically connected with the shallow well of the first conductivity type of said fifth well forming region and extends below a portion of the element separation region encompassing said fifth well forming region;
(g) removing a gate insulating film from the major surface of the semiconductor substrate exposed from said fifth mask by using said fifth mask as an etching mask; and
(h) after said fifth mask removing step, forming a gate insulating film having a thickness different from that of the gate insulating films of the other regions, over the major surface of the semiconductor substrate exposed from said fifth mask,
wherein in said sixth well forming region, the shallow well region of the second conductivity type in said sixth well forming region is encompassed by the shallow well region of the first conductivity type of said fifth well forming region and said buried well region of the first conductivity type under said fifth well forming region and said sixth well forming region and is electrically separated from the semiconductor substrate.

35. A process according to claim 34,
wherein a drive voltage of a MIS transistor having said gate insulating film of different thicknesses is lower than that of MIS transistors having gate insulating films of the other region.

36. A process according to claim 34, further comprising the steps of:
forming MIS transistors in said fifth well forming region and said sixth well forming region.

37. A process for manufacturing a semiconductor integrated circuit device, comprising the steps of:
(a) forming, by patterning, over the major surface of a semiconductor substrate a third mask through which a fifth well forming region is exposed;
(b) introducing the semiconductor substrate with an impurity by using said third mask as an impurity introduction mask so as to form a shallow well region of a first conductivity type in said fifth well forming region;
(c) forming, by patterning, over the major surface of the semiconductor substrate a fourth mask through which a sixth well forming region planarily encompassed by said fifth well forming region and a portion of an element separation region are exposed;
(d) introducing the semiconductor substrate with an impurity by using said fourth mask as an impurity introduction mask so as to form a shallow well region of a second conductivity type in said sixth well forming region and a channel stopper region of the second conductivity type under said element separation region;
(e) forming, by patterning, over the major surface of the semiconductor substrate a fifth mask through which said fifth well forming region, said sixth well forming region and a portion of an element separation region encompassing said fifth well forming region are exposed and which has its opening end provided over the element separation region;
(f) introducing the semiconductor substrate with an impurity by using said fifth mask as an impurity introduction mask so as to form a buried well region of the first conductivity type under the shallow well region of the first conductivity type of said fifth well forming region and the shallow well region of the second conductivity type in said sixth well forming region, such that said buried well is electrically connected with the shallow well of the first conductivity type of said fifth well forming region and extends below a portion of the element separation region encompassing said fifth well forming region;
(g) removing the gate insulating film from the major surface of the semiconductor substrate exposed from said fifth mask by using said fifth mask as an etching mask; and
(h) after said fifth mask removing step, forming a gate insulating film having a thickness different from that of the gate insulating films of the other region, over the major surface of the semiconductor substrate exposed from said fifth mask,
wherein in said sixth well forming region, the shallow well region of the second conductivity type in said sixth well forming region is encompassed by the shallow well region of the first conductivity type of said fifth well forming region and said buried well region of the first conductivity type under said fifth well forming region and said sixth well forming region and electrically separated from the semiconductor substrate.

38. A process for manufacturing a semiconductor integrated circuit device, comprising the steps of:

(a) forming, by patterning, over a major surface of a semiconductor substrate a first mask through which a first semiconductor region and a second semiconductor region formed at a distance from the first semiconductor region are exposed;

(b) introducing said semiconductor substrate with an impurity by using said first mask as an impurity introduction mask so as to form a buried semiconductor region of a first conductivity type in said first semiconductor region at a deep position of said semiconductor substrate;

(c) introducing said semiconductor substrate with an impurity by using said first mask as an impurity introduction mask so as to form a shallow semiconductor region of a second conductivity type over said buried semiconductor region of the first conductivity type in said first semiconductor region and said semiconductor region;

(d) forming, by patterning, over the major surface of said semiconductor substrate a second mask through which exposed are a third semiconductor region encompassing the outer peripheries of the buried semiconductor region of the first conductivity type of said first semiconductor region and the shallow semiconductor region of the first semiconductor region and a fourth semiconductor region formed at a distance from said first semiconductor region; and (e) introducing the semiconductor substrate with an impurity by using said second mask as an impurity introduction mask by using said second mask as an impurity introduction mask so as to form a shallow semiconductor region of the first conductivity type encompassing the outer periphery of the shallow semiconductor region of the second conductivity type of said first semiconductor region and electrically connected with the buried semiconductor region of the first conductivity type of the first semiconductor region in said third semiconductor region and to form a shallow semiconductor region of the first conductivity type in said fourth semiconductor region, wherein in said first semiconductor region, the shallow semiconductor region of the second conductivity type in said first semiconductor region is encompassed by the shallow semiconductor region of the first conductivity type formed in said third semiconductor region and the buried semiconductor region of the first conductivity type in said first semiconductor region and is electrically separated from the semiconductor substrate, and wherein in said second semiconductor region, said shallow semiconductor region of the second conductivity type is electrically connected with said semiconductor substrate.

39. A process for manufacturing a semiconductor integrated circuit device, comprising the steps of:

forming, by patterning, over a major surface of the semiconductor substrate a seventh mask through which a seventh well forming region is exposed;

introducing said seventh well forming region with an impurity by using said seventh mask as an impurity introduction mask so as to form in said seventh well forming region a deep well region of the first conductivity type extending from the major surface to a deep position of said semiconductor substrate;

removing a gate insulating film from the major surface of the semiconductor substrate exposed from said seventh mask by using said seventh mask as an etching mask; and after said seventh mask removing step, forming a gate insulating film having a thickness different from those of the gate insulating films of the other regions, over the major surface of the semiconductor substrate exposed from said seventh mask.

* * * * *